US012787504B2

(12) United States Patent
Baek et al.

(10) Patent No.: US 12,787,504 B2
(45) Date of Patent: Nov. 3, 2026

(54) PIXEL, DISPLAY DEVICE INCLUDING THE SAME, AND METHOD OF FABRICATING THE DISPLAY DEVICE

(71) Applicant: Samsung Display Co., LTD., Yongin-si (KR)

(72) Inventors: Young Seok Baek, Yongin-si (KR); Ha Na Seo, Yongin-si (KR); Chong Sup Chang, Yongin-si (KR); Eui Kang Heo, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 884 days.

(21) Appl. No.: 17/968,657

(22) Filed: Oct. 18, 2022

(65) Prior Publication Data

US 2023/0187583 A1 Jun. 15, 2023

(30) Foreign Application Priority Data

Dec. 9, 2021 (KR) ........................ 10-2021-0176027

(51) Int. Cl.

| | |
|---|---|
| ***H10H 20/831*** | (2025.01) |
| ***H10H 20/01*** | (2025.01) |
| ***H10H 20/851*** | (2025.01) |
| ***H10H 20/857*** | (2025.01) |
| ***H10H 29/14*** | (2025.01) |

(52) U.S. Cl.

CPC ........ *H10H 20/8316* (2025.01); *H10H 20/01* (2025.01); *H10H 20/8514* (2025.01); *H10H 20/857* (2025.01); *H10H 29/142* (2025.01); *H10H 20/032* (2025.01); *H10H 20/0361* (2025.01); *H10H 20/0364* (2025.01)

(58) Field of Classification Search

None

See application file for complete search history.

(56) References Cited

U.S. PATENT DOCUMENTS 7,282,723 B2 10/2007 Schomacker et al.
2019/0371872 A1* 12/2019 Nendai ............ H10K 59/80515
(Continued)

FOREIGN PATENT DOCUMENTS

KR 20200066438 A * 6/2020 ........... H10H 20/857
KR 20200121956 A * 10/2020 ............. H10D 30/67
KR 20210145590 A * 12/2021 ............. H10H 20/82

*Primary Examiner* — Kretelia Graham
*Assistant Examiner* — Nkechinyere Esiaba
(74) *Attorney, Agent, or Firm* — Womble Bond Dickinson (US) LLP

(57) ABSTRACT

A pixel includes: an emission area and a non-emission area; a via layer including a lower surface and an upper surface, the via layer including a first part having a first thickness, and a second part having a second thickness; a first alignment electrode and a second alignment electrode on the via layer and spaced from each other; an insulating layer on the via layer, the first alignment electrode, and the second alignment electrode, the insulating layer having a planar surface; a first electrode and a second electrode in the emission area and spaced from each other; and light emitting elements on the planer surface of the insulating layer in the emission area, and electrically connected to the first electrode and the second electrode. The first and second alignment electrodes may be on the second part of the via layer and overlap the second part of the via layer.

20 Claims, 29 Drawing Sheets

(56) References Cited

U.S. PATENT DOCUMENTS

| | | | | |
|---|---|---|---|---|
| 2021/0202450 | A1* | 7/2021 | Min | G06F 3/147 |
| 2021/0242380 | A1* | 8/2021 | Kim | H10D 86/021 |
| 2021/0367121 | A1* | 11/2021 | Kim | H10H 20/819 |
| 2023/0121662 | A1* | 4/2023 | Yoshida | H10K 59/131 257/40 |

* cited by examiner

LCP{CCL, CF}  T1(T){DE, GE, ACT, SE}  VIA{A1, A2}

PIXEL, DISPLAY DEVICE INCLUDING THE SAME, AND METHOD OF FABRICATING THE DISPLAY DEVICE

CROSS-REFERENCE TO RELATED APPLICATION

This application claims priority to and the benefit of Korean patent application number 10-2021-0176027 filed on Dec. 9, 2021, the entire disclosure of which is incorporated by reference herein.

BACKGROUND

1. Field

The present disclosure relate to a pixel, a display device including the pixel, and a method of fabricating the display device.

2. Description of Related Art

Recently, as interest in information display increases, research and development on display devices have been continuously conducted.

SUMMARY

Various embodiments of the present disclosure are directed to a pixel and a display device including the pixel, in which a via layer including a first part (or a protrusion) is formed, and an alignment electrode is formed on (or at) the same level as that of the surface of the first part, so that an insulating layer disposed on the alignment electrode and the via layer can have a planar surface, whereby a contact failure of light emitting elements disposed on the insulating layer may be prevented from occurring, and thus the pixel and the display device can be improved in reliability.

Furthermore, various embodiments of the present disclosure are directed to a method of fabricating the display device.

A pixel in accordance with one or more embodiments may include: an emission area and a non-emission area; a via layer including a lower surface and an upper surface that are opposite each other, the via layer including a first part having a first thickness and a second part having a second thickness different from the first thickness; a first alignment electrode and a second alignment electrode on the via layer and spaced from each other; an insulating layer on the via layer, the first alignment electrode, and the second alignment electrode, the insulating layer having a planar surface; a first electrode and a second electrode in the emission area and spaced from each other; and light emitting elements on the planar surface of the insulating layer in the emission area, and electrically connected to the first electrode and the second electrode. The first alignment electrode and the second alignment electrode may be on the second part of the via layer and overlap the second part of the via layer.

In one or more embodiments, in a sectional view, an upper surface of the first part of the via layer may protrude compared to an upper surface of the second part of the via layer.

In one or more embodiments, the first thickness may be greater than the second thickness.

In one or more embodiments, each of the first alignment electrode and the second alignment electrode may have a surface located at a level that is the same as a level of the upper surface of the first part of the via layer.

In one or more embodiments, each of the first alignment electrode and the second alignment electrode may include a first surface and a second surface that are opposite each other. The first surface may contact the lower surface of the second part of the via layer, and the second surface may contact the insulating layer. A surface of each of the first electrode and the second electrode may correspond to the second surface.

In one or more embodiments, in a sectional view, the first alignment electrode and the second alignment electrode may be spaced from each other with the first part of the via layer interposed therebetween.

In one or more embodiments, the first alignment electrode and the second alignment electrode may not overlap the first part of the via layer.

In one or more embodiments, the via layer may include an organic insulating layer, and the insulating layer may include an inorganic insulating layer.

In one or more embodiments, the pixel may further include: a first bank pattern on the insulating layer between the first alignment electrode and the first electrode; and a second bank pattern on the insulating layer between the second alignment electrode and the second electrode. The light emitting elements may be on the insulating layer between the first bank pattern and the second bank pattern.

In one or more embodiments, the pixel may further include: a bank on the insulating layer in the non-emission area, and including a first opening corresponding to the emission area, and a second opening spaced from the first opening; a light conversion pattern on the light emitting elements and the first electrode and the second electrode in the emission area; and a light block pattern on the bank in the non-emission area.

In one or more embodiments, the first bank pattern, the second bank pattern, and the bank may include a same material and are at a same layer.

In one or more embodiments, the light conversion pattern may include: a color conversion layer on the first electrode and the second electrode, and configured to convert a first color of light emitted from the light emitting elements to a second color of light; and a color filter on the color conversion layer and configured to allow the second color of light to selectively pass therethrough.

In one or more embodiments, the pixel may further include: a substrate; at least one transistor on the substrate; and a power line on the substrate, the power line being configured to receive a power voltage. The via layer may be on the transistor and the power line, and include a first contactor exposing a portion of the transistor, and a second contactor exposing a portion of the power line.

In one or more embodiments, the insulating layer may include a first contact hole exposing a portion of the first alignment electrode, and a second contact hole exposing a portion of the second alignment electrode. The first electrode may be electrically connected to the first alignment electrode through the first contact hole. The second electrode may be electrically connected to the second alignment electrode through the second contact hole.

In one or more embodiments, the first contact hole and the second contact hole may be located in the non-emission area.

In one or more embodiments, the pixel may further include: a third alignment electrode on the via layer between the first alignment electrode and the second alignment electrode, and spaced from the first alignment electrode and the second alignment electrode; a fourth alignment electrode adjacent to the third alignment electrode and located on the via layer, the fourth alignment electrode being spaced from the first to the third alignment electrodes; a first intermediate electrode spaced from the first electrode and the second electrode, and located on the third alignment electrode; and a second intermediate electrode spaced from the first electrode and the second electrode, and located on the fourth alignment electrode.

In one or more embodiments, each of the third alignment electrode and the fourth alignment electrode may have a surface at a level that is the same as a level of the upper surface of the first part of the via layer. In a sectional view, the first alignment electrode and the third alignment electrode may be spaced from each other with the first part of the via layer interposed therebetween. In a sectional view, the second alignment electrode and the fourth alignment electrode may be spaced from each other with the first part of the via layer interposed therebetween.

A display device in accordance with one or more embodiments may include: a substrate including a display area and a non-display area; and a plurality of pixels in the display area, each of the plurality of pixels including an emission area and a non-emission area. Each of the plurality of pixels may include: a via layer on the substrate, and including a lower surface and an upper surface that are opposite each other, and including a first part having a first thickness, and a second part having a second thickness different from the first thickness; a first alignment electrode and a second alignment electrode on the via layer and spaced from each other; an insulating layer on the via layer, the first alignment electrode, and the second alignment electrode, and having a planar surface; a first bank pattern and a second bank pattern in the emission area, the first bank pattern being on the insulating layer on the first alignment electrode, and the second bank pattern being on the insulating layer on the second alignment electrode; light emitting elements on the surface of the insulating layer between the first bank pattern and the second bank pattern in the emission area; a first electrode in the emission area, and electrically connected to the first alignment electrode and respective first ends of the light emitting elements; and a second electrode in the emission area, and electrically connected to the second alignment electrode and respective second ends of the light emitting elements. Each of the first alignment electrode and the second alignment electrode may have a surface at a level that is the same as a level of an upper surface of the first part of the via layer.

In one or more embodiments, in a sectional view, the upper surface of the first part of the via layer may protrude compared to an upper surface of the second part of the via layer. The first thickness may be greater than the second thickness.

A method of fabricating a display device in accordance with an embodiment may include: preparing a substrate including a display area including an emission area and a non-emission area, and a non-display area located on at least one side of the display area; forming at least one transistor and at least one power line on the substrate; forming a via material layer on the transistor and the power line, forming a via layer including a first part having a first thickness using a halftone mask, a second part having a second thickness less than the first thickness, a first contactor exposing a portion of the transistor, and a second contactor exposing a portion of the power line; forming a first alignment electrode and a second alignment electrode by applying a conductive layer onto an overall surface of the via layer and removing one area of the conductive layer on the first part of the via layer through a planarization process, the first alignment electrode and the second alignment electrode being spaced from each other; forming an insulating layer having a planar surface on the via layer, the first alignment electrode, and the second alignment electrode; forming a first bank pattern and a second bank pattern in the emission area on the insulating layer, forming a bank in the non-emission area on the insulating layer; locating a light emitting element on the insulating layer between the first bank pattern and the second bank pattern; forming a first electrode and a second electrode that are electrically connected to the light emitting element; and forming a color conversion layer on the first electrode and the second electrode.

Each of the first alignment electrode and the second alignment electrode may have a surface at a level that is the same as a level of an upper surface of the first part of the via layer.

DETAILED DESCRIPTION

Figure 1:
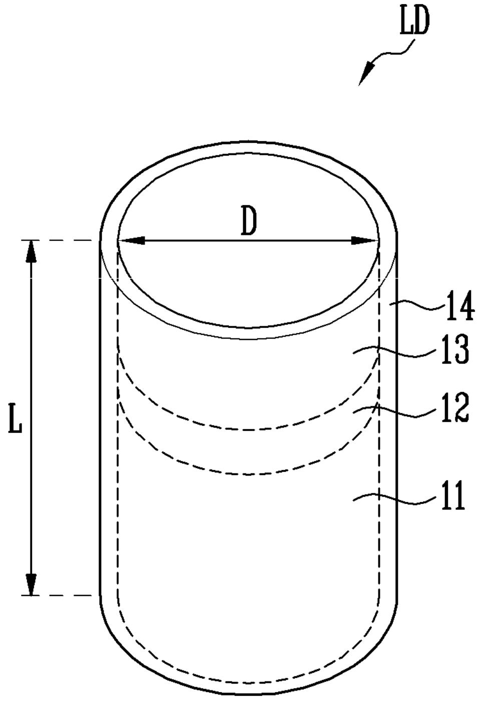
FIG. 1 is a perspective view schematically illustrating a light emitting element in accordance with one or more embodiments.

As the present disclosure allows for various changes and numerous embodiments, particular embodiments will be illustrated in the drawings and described in detail in the written description. However, this is not intended to limit the present disclosure to particular modes of practice, and it is to be appreciated that all changes, equivalents, and substitutes that do not depart from the technical scope of the present disclosure are encompassed in the present disclosure.

Throughout the disclosure, like reference numerals refer to like parts throughout the various figures and embodiments of the present disclosure. The sizes of elements in the accompanying drawings may be exaggerated for clarity of illustration. It will be understood that, although the terms "first", "second", etc. may be used herein to describe various elements, these elements should not be limited by these terms. These terms are only used to distinguish one element from another element. For instance, a first element discussed below could be termed a second element without departing from the teachings of the present disclosure. Similarly, the second element could also be termed the first element.

It will be further understood that the terms "comprise", "include", "have", etc. when used in this specification, specify the presence of stated features, integers, steps, operations, elements, components, and/or combinations of them but do not preclude the presence or addition of one or more other features, integers, steps, operations, elements, components, and/or combinations thereof. Furthermore, in case that a first part such as a layer, a film, a region, or a plate is disposed on a second part, the first part may be not only directly on the second part but a third part may intervene between them. In addition, in case that it is expressed that a first part such as a layer, a film, a region, or a plate is formed on a second part, the surface of the second part on which the first part is formed is not limited to an upper surface of the second part but may include other surfaces such as a side surface or a lower surface of the second part. To the contrary, in case that a first part such as a layer, a film, a region, or a plate is under a second part, the first part may be not only directly under the second part but a third part may intervene between them.

It will be understood that when an element (e.g., a first element) is referred to as being (operatively or communicatively) "coupled with/to," or "connected with/to" another element (e.g., a second element), the first element can be coupled or connected with/to the second element directly or via another element (e.g., a third element). In contrast, it will be understood that when an element (e.g., a first element) is referred to as being "directly coupled with/to" or "directly connected with/to" another element (e.g., a second element), no other element (e.g., a third element) intervenes between the element and the other element.

Embodiments and required details of the present disclosure are described with reference to the accompanying drawings in order to describe the present disclosure in detail so that those having ordinary knowledge in the technical field to which the present disclosure pertains can easily practice the present disclosure. Furthermore, a singular form may include a plural form as long as it is not specifically mentioned in a sentence.

Figure 2:
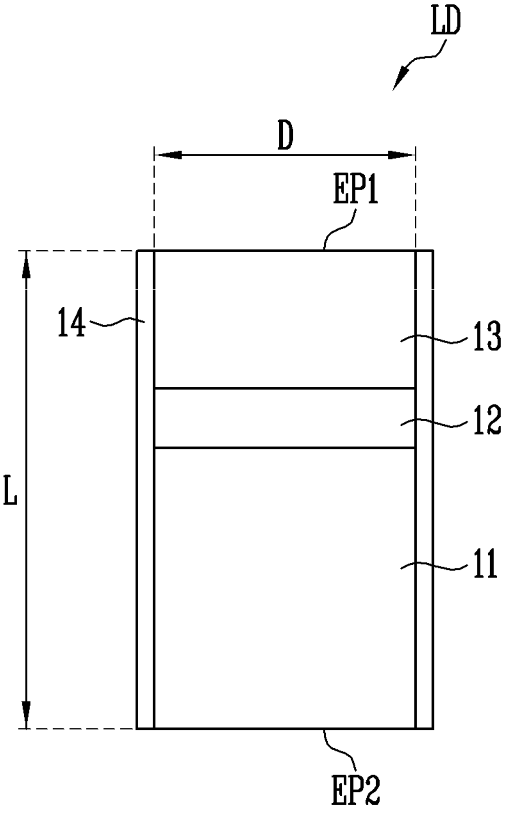
FIG. 2 is a schematic cross-sectional view illustrating the light emitting element of FIG. 1.

FIG. 1 is a perspective view schematically illustrating a light emitting element LD in accordance with one or more embodiments. FIG. 2 is a schematic cross-sectional view illustrating the light emitting element LD of FIG. 1.

In one or more embodiments, the type and/or shape of the light emitting element LD is not limited to that of the embodiments illustrated in FIGS. 1 and 2.

Referring to FIGS. 1 and 2, the light emitting element LD may include a first semiconductor layer 11, a second semiconductor layer 13, and an active layer 12 interposed between the first and second semiconductor layers 11 and 13. For example, the light emitting element LD may be implemented as an emission stack (or referred to as "stacked pattern") formed by successively stacking the first semiconductor layer 11, the active layer 12, and the second semiconductor layer 13.

The light emitting element LD may be formed in a shape extending in one direction. If the direction in which the light emitting element LD extends is defined as a longitudinal direction, the light emitting element LD may have a first end EP1 and a second end EP2 with respect to the longitudinal direction. One semiconductor layer of the first semiconductor layer 11 and the second semiconductor layer 13 may be disposed on the first end EP1 of the light emitting element LD, and the other semiconductor layer of the first semiconductor layer 11 and the second semiconductor layer 13 may be disposed on the second end EP2 of the light emitting element LD. For example, the second semiconductor layer 13 may be disposed on the first end EP1 of the light emitting element LD, and the first semiconductor layer 11 may be disposed on the second end EP2 of the light emitting element LD.

The light emitting element LD may have various shapes. For example, as illustrated in FIG. 1, the light emitting element LD may have a rod-like shape, a bar-like shape, or a pillar-like shape which is long with respect to the longitudinal direction (i.e., to have an aspect ratio greater than 1). Alternatively, the light emitting element LD may have a rod-like shape, a bar-like shape, or a pillar-like shape which is short with respect to the longitudinal direction (i.e., to have an aspect ratio less than 1). As a further alternative, the light emitting element LD may have a rod-like shape, a bar-like shape, or a pillar-like shape having an aspect ratio of 1.

The light emitting element LD may include a light emitting diode (LED) fabricated to have a subminiature size, for example, with a diameter D and/or a length L corresponding to the nanoscale (or the nanometer scale) to the microscale (or the micrometer scale).

In case that the light emitting element LD is long (i.e., to have an aspect ratio greater than 1) with respect to the longitudinal direction, the diameter D of the light emitting element LD may approximately range from 0.5 μm to 6 μm, and the length L thereof may approximately range from 1 μm to 10 μm. However, the diameter D and the length L of the light emitting element LD are not limited thereto. The size of the light emitting element LD may be changed to meet requirements (or design conditions) of a lighting device or a self-emissive display device to which the light emitting element LD is applied.

The first semiconductor layer 11 may include, for example, at least one n-type semiconductor layer. For instance, the first semiconductor layer 11 may include an n-type semiconductor layer that includes any one semiconductor material of InAlGaN, GaN, AlGaN, InGaN, AlN, and InN and is doped with a first conductive dopant (or an n-type dopant) such as Si, Ge, or Sn. However, the constituent material of the first semiconductor layer 11 is not limited to thereto, and various other materials may be used to form the first conductive semiconductor layer 11. The first semiconductor layer 11 may include, with respect to the longitudinal direction of the light emitting element LD, an upper surface that contacts the active layer 12, and a lower surface exposed to the outside. The lower surface of the first semiconductor layer 11 may correspond to one end (e.g., a lower end or the second end EP2) of the light emitting element LD.

The active layer 12 may be disposed on the first semiconductor layer 11 and have a single or multiple quantum well structure. For example, in case that the active layer 12 has a multiple quantum well structure, the active layer 12 may be formed by periodically repeatedly stacking a barrier layer, a stain reinforcing layer, and a well layer that are provided as one unit. The stain reinforcing layer may have a lattice constant less than that of the barrier layer so that resistance to strain, e.g., compressive strain, to be applied to the well layer can be further reinforced. However, the structure of the active layer 12 is not limited to that of the foregoing embodiment.

The active layer 12 may emit light having a wavelength ranging from 400 nm to 900 nm, and use a double hetero structure. In one or more embodiments, a clad layer doped with a conductive dopant may be formed over or under the active layer 12 with respect to the longitudinal direction of the light emitting element LD. For example, the cladding layer may be formed of an AlGaN layer or an InAlGaN layer. In one or more embodiments, material such as AlGaN or InAlGaN may be used to form the active layer 12, and various other materials may be used to form the active layer 12. The active layer 12 may include a first surface that contacts the first semiconductor layer 11, and a second surface that contacts the second semiconductor layer 13.

If an electric field having a suitable voltage (e.g., a set or predetermined voltage) or more is applied to the opposite ends of the light emitting element LD, the light emitting element LD may emit light by coupling of electron-hole pairs in the active layer 12. Because light emission of the light emitting element LD can be controlled based on the foregoing principle, the light emitting element LD may be used as a light source (a light emitting source) of various light emitting devices as well as a pixel of a display device.

The second semiconductor layer 13 may be disposed on the second surface of the active layer 12 and include a semiconductor layer having a type different from that of the first semiconductor layer 11. For example, the second semiconductor layer 13 may include at least one p-type semiconductor layer. For instance, the second semiconductor layer 13 may include a p-type semiconductor layer that includes any one semiconductor material of InAlGaN, GaN, AlGaN, InGaN, AlN, and InN, and is doped with a second conductive dopant (or a p-type dopant) such as Mg, Zn, Ca, Sr, or Ba. However, the material for forming the second semiconductor layer 13 is not limited thereto, and various other materials may be used to form the second semiconductor layer 13. The second semiconductor layer 13 may include, with regard to the longitudinal direction of the light emitting element LD, a lower surface that contacts the second surface of the active layer 12, and an upper surface exposed to the outside. Here, the upper surface of the second semiconductor layer 13 may correspond to a remaining end (or an upper end) of the light emitting element LD.

In one or more embodiments, the first semiconductor layer 11 and the second semiconductor layer 13 may have different thicknesses with respect to the longitudinal direction of the light emitting element LD. For example, the first semiconductor layer 11 may have a thickness greater than that of the second semiconductor layer 13 with respect to the longitudinal direction of the light emitting element LD. Hence, the active layer 12 of the light emitting element LD may be disposed at a position closer to the upper surface of the second semiconductor layer 13 than to the lower surface of the first semiconductor layer 11.

Although the first semiconductor layer 11 and the second semiconductor layer 13 each is formed of a single layer, the present disclosure is not limited thereto. In one or more embodiments, depending on the material of the active layer 12, the first semiconductor layer 11 and the second semiconductor layer 13 each may further include one or more layers, for example, a clad layer and/or a tensile strain barrier reducing (TSBR) layer. The TSBR layer may be a strain relief layer of which a lattice structure is disposed between other semiconductor layers so that the strain relief layer functions as a buffer layer to reduce a difference in lattice constant. Although the TSBR layer may be formed of a p-type semiconductor layer such as p-GaInP, p-AlInP, or p-AlGaInP, the present disclosure is not limited thereto.

In one or more embodiments, the light emitting element LD may further include a contact electrode (hereinafter referred to as "first contact electrode") disposed over the second semiconductor layer 13, as well as including the first semiconductor layer 11, the active layer 12, and the second semiconductor layer 13. Furthermore, in one or more embodiments, the light emitting element LD may further include another contact electrode (hereinafter referred to as "second contact electrode") disposed on one end of the first semiconductor layer 11.

Each of the first and second contact electrodes may be an ohmic contact electrode, but the present disclosure is not limited thereto. In one or more embodiments, each of the first and second contact electrodes may be a Schottky contact electrode. The first and second contact electrodes may include conductive material. For example, the first and second contact electrodes may include opaque metal such as chrome (Cr), titanium (Ti), aluminum (Al), gold (Au), nickel (Ni), and oxides or alloys thereof, which are used alone or in combination, but the present disclosure is not limited thereto. In one or more embodiments, the first and second contact electrodes may also include transparent conductive oxides such as indium tin oxide (ITO), indium zinc oxide (IZO), zinc oxide ($ZnO_x$), indium gallium zinc oxide (IGZO), and indium tin zinc oxide (ITZO). Here, the zinc oxide ($ZnO_x$) may be zinc oxide (ZnO) and/or zinc peroxide ($ZnO_2$).

Materials included in the first and second contact electrodes may be equal to or different from each other. The first and second contact electrodes may be substantially transparent or translucent. Therefore, light generated from the light emitting element LD may pass through the first and second contact electrodes and then be emitted outside the light emitting element LD. In one or more embodiments, in case that light generated from the light emitting element LD is emitted outside the light emitting element LD through an area other than the opposite ends of the light emitting element LD rather than passing through the first and second contact electrodes, the first and second contact electrodes may include opaque metal.

In one or more embodiments, the light emitting element LD may further include an insulating layer 14. However, in one or more embodiments, the insulating layer 14 may be omitted, or may be provided to cover only some of the first semiconductor layer 11, the active layer 12, and the second semiconductor layer 13.

The insulating layer 14 may prevent the active layer 12 from short-circuiting due to making contact with conductive material except the first and second semiconductor layers 11 and 13. Furthermore, the insulating layer 14 may reduce or minimize a surface defect of the light emitting element LD, thus enhancing the lifespan and emission efficiency of the light emitting element LD. In case that a plurality of light emitting elements LD are disposed in close contact with each other, the insulating layer 14 may prevent an undesired short-circuit from occurring between the light emitting elements LD. It is not limited whether the insulating layer 14 is provided or not, so long as the active layer 12 can be prevented from short-circuiting with external conductive material.

The insulating layer 14 may be provided to be around (e.g., to enclose) an overall outer surface (e.g., an outer peripheral or circumferential surface) of the emission stack including the first semiconductor layer 11, the active layer 12, and the second semiconductor layer 13.

Although in the foregoing embodiment the insulating layer 14 has been described as enclosing the entirety of the respective outer surfaces (e.g., outer peripheral or circumferential surfaces) of the first semiconductor layer 11, the active layer 12, and the second semiconductor layer 13, the present disclosure is not limited thereto. In one or more embodiments, in case that the light emitting element LD includes the first contact electrode, the insulating layer 14 may enclose the entirety of the respective outer surfaces (e.g., outer peripheral or circumferential surfaces) of the first semiconductor layer 11, the active layer 12, the second semiconductor layer 13, and the first contact electrode. In one or more embodiments, the insulating layer 14 may not enclose the entirety of the outer surface (e.g., the outer peripheral or circumferential surface) of the first contact electrode, or may enclose only a portion of the outer surface (e.g., the outer peripheral or circumferential surface) of the first contact electrode but not enclose the other portion of the outer surface (e.g., the outer peripheral or circumferential surface) of the first contact electrode. Furthermore, in one or more embodiments, in case that the first contact electrode is disposed on the remaining end (or the upper end) of the light emitting element LD and the second contact electrode is disposed on the one end (or the lower end) of the light emitting element LD, the insulating layer 14 may allow at least one area of each of the first and second contact electrodes to be exposed.

The insulating layer 14 may include transparent insulating material. For example, the insulating layer 14 may be include one or more insulating materials selected from the group constituting of silicon oxide ($SiO_x$), silicon nitride ($SiN_x$), silicon oxynitride ($SiO_xN_y$), aluminum oxide ($AlO_x$), titanium oxide ($TiO_x$), hafnium oxide ($HfO_x$), titanstrontium oxide ($SrTiO_x$), cobalt oxide ($Co_xO_y$), magnesium oxide (MgO), zinc oxide ($ZnO_x$), ruthenium Oxide ($RuO_x$), nickel oxide (NiO), tungsten oxide ($WO_x$), tantalum oxide ($TaO_x$), gadolinium oxide ($GdO_x$), zirconium oxide ($ZrO_x$), gallium oxide ($GaO_x$), vanadium oxide ($V_xO_y$), ZnO:Al, ZnO:B, InxOy:H, niobium oxide ($Nb_xO_y$), magnesium fluoride ($MgF_x$), aluminum fluoride ($AlF_x$), an alucone polymer film, titanium nitride (TiN), tantalum nitride (TaN), aluminum nitride ($AlN_x$), gallium nitride (GaN), tungsten nitride (WN), hafnium nitride (HfN), niobium nitride (NbN), gadolinium nitride (GdN), zirconium nitride (ZrN), and vanadium nitride (VN). However, the present disclosure is not limited thereto, and various materials having insulation may be used as the material of the insulating layer 14.

The insulating layer 14 may be provided in the form of a single layer or in the form of multiple layers including double layers. For example, in case that the insulating layer 14 is formed of a double layer structure including a first insulating layer and a second insulating layer that are successively stacked, the first insulating layer and the second insulating layer may be made of different materials (or substances) and may be formed through different processes. In one or more embodiments, the first insulating layer and the second insulating layer may include the same material and may be formed through a successive process.

In one or more embodiments, the light emitting element LD may be implemented as a light emitting pattern having a core-shell structure. In this case, the first semiconductor layer 11 may be disposed in a core of the light emitting element LD, i.e., a central portion of the light emitting element LD. The active layer 12 may be provided and/or formed to be around (e.g., to enclose) the outer surface (e.g., the outer peripheral or circumferential surface) of the first semiconductor layer 11. The second semiconductor layer 13 may be provided and/or formed to be around (e.g., to enclose) the active layer 12. Furthermore, the light emitting element LD may further include a contact electrode formed to be around (e.g., to enclose) at least one side of the second semiconductor layer 13. In one or more embodiments, the light emitting element LD may further include an insulating layer 14 that is provided on the outer surface (e.g., the outer peripheral or circumferential surface) of the light emitting pattern having a core-shell structure and has transparent insulating material. The light emitting element LD implemented as the light emitting pattern having the core-shell structure may be manufactured in a growth manner.

The light emitting element LD may be employed as a light emitting source (or a light source) for various display devices. The light emitting element LD may be fabricated through a surface treatment process. For example, the light emitting element LD may be surface-treated so that, when a plurality of light emitting elements LD are mixed with a fluidic solution (or solvent) and then supplied to each pixel area (e.g., an emission area of each pixel or an emission area of each sub-pixel), the light emitting elements LD can be evenly distributed rather than unevenly aggregating in the solution.

A light emitting unit (or a light emitting device) including the light emitting element LD described above may be used not only in a display device but also in various types of electronic devices each of which requires a light source. For instance, in case that a plurality of light emitting elements LD are disposed in the pixel area of each pixel of a display panel, the light emitting elements LD may be used as a light source of the pixel. However, the application field of the light emitting element LD is not limited to the above-mentioned examples. For example, the light emitting element LD may also be used in other types of electronic devices such as a lighting device, which requires a light source.

Figure 3:
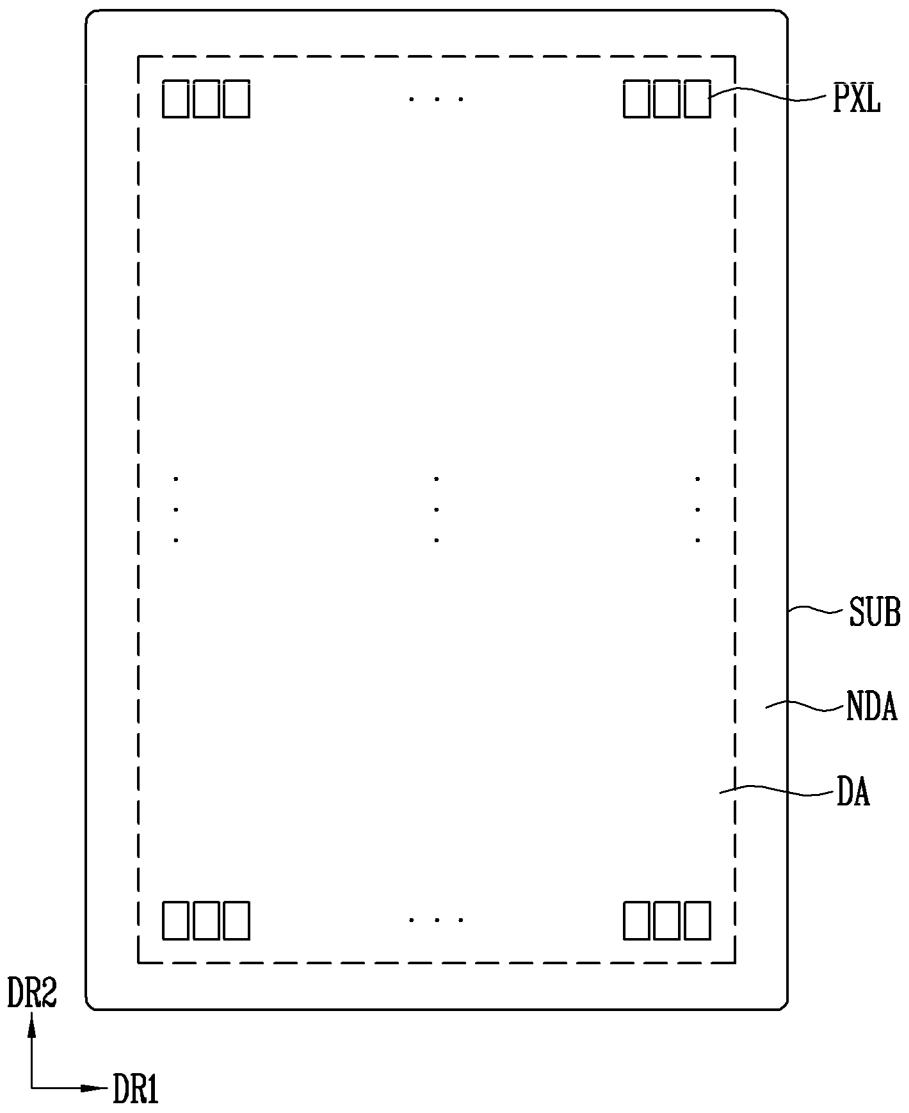
FIG. 3 is a plan view schematically illustrating a display device in accordance with one or more embodiments.

FIG. 3 is a plan view schematically illustrating a display device in accordance with one or more embodiments.

For the sake of explanation, FIG. 3 schematically illustrates the structure of the display device, focused on a display area DA on which an image is displayed.

If the display device is an electronic device having a display surface on at least one surface thereof, e.g., a smartphone, a television, a tablet PC, a mobile phone, a video phone, an electronic reader, a desktop PC, a laptop PC, a netbook computer, a workstation, a server, a PDA, a portable multimedia player (PMP), an MP3 player, a medical appliance, a camera, or a wearable device, the present disclosure may be applied to the display device DD.

Referring to FIGS. 1 to 3, the display device may include a substrate SUB, a plurality of pixels PXL provided in the substrate SUB and each including at least one light emitting element LD, a driver provided in the substrate SUB and configured to drive the pixels PXL, and a line component provided to connect the pixels PXL with the driver.

The display device may be classified into a passive matrix type display device and an active matrix type display device according to a method of driving the light emitting element LD. For example, in case that the display device is implemented as an active matrix type, each of the pixels PXL may include a driving transistor configured to control the amount of current to be supplied to the light emitting element LD, and a switching transistor configured to transmit a data signal to the driving transistor.

The display device may be provided in various forms, for example, in the form of a rectangular plate having two pairs of parallel sides, but the present disclosure is not limited thereto. In case that the display device is provided in the form of a rectangular plate, one pair of sides of the two pairs of sides may be longer than the other. For the sake of explanation, there is illustrated the case where the display device has a rectangular shape with a pair of long sides and a pair of short sides. A direction in which the long sides extend is indicated by a second direction DR2, and a direction in which the short sides extend is indicated by a first direction DR1. In the display device provided in a rectangular planar shape, each corner on which one long side and one short side contact (or meet) each other may have a round shape. However, the present disclosure is not limited thereto.

The substrate SUB may include a display area DA and a non-display area NDA.

The display area DA may be an area in which the pixels PXL for displaying an image are provided. The non-display area NDA may be an area in which the driver for driving the pixels PXL and a portion of the line component for coupling the pixels PXL to the driver are provided. As illustrated in FIG. 3, a plurality of pixels PXL may be substantially provided in the display area DA of the substrate SUB.

The non-display area NDA may be disposed adjacent to the display area DA. The non-display area NDA may be provided at at least one side of the display area DA. For example, the non-display area NDA may be around (e.g., may enclose) the perimeter (or edges) of the display area DA. The line component connected to the pixels PXL, and the driver connected to the line component and configured to drive the pixels PXL may be provided in the non-display area NDA.

The line component may electrically connect the driver with the pixels PXL. The line component may include a fanout line connected with signal lines, e.g., a scan line, a data line, and an emission control line, which are connected to each pixel PXL to provide signals to the pixel PXL. Furthermore, in one or more embodiments, the line component may include a fanout line connected to signal lines, e.g., a control line, and a sensing line, which are connected to each pixel PXL to compensate in real time for variation in electrical characteristics of the pixel PXL. In addition, the line component may include a fanout line connected with power lines that are configured to provide suitable voltages (e.g., set or predetermined voltages) to the respective pixels PXL and connected to the respective pixels PXL.

The substrate SUB may include transparent insulating material to allow light transmission. The substrate SUB may be a rigid substrate or a flexible substrate.

One area on the substrate SUB may be provided as the display area DA in which the pixels PXL are disposed, and the other area thereof may be provided as the non-display area NDA. For example, the substrate SUB may include a display area DA including a plurality of pixel areas in which the respective pixels PXL are disposed, and a non-display area NDA disposed around the edge or perimeter of the display area DA (or adjacent to the display area DA).

The pixels PXL may be provided in the display area DA on the substrate SUB. In one or more embodiments, the pixels PXL may be arranged in the display area DA in a stripe or a PENTILE® arrangement structure, but the present disclosure is not limited thereto. This PENTILE® arrangement structure may be referred to as an RGBG matrix structure (e.g., a PENTILE® matrix structure or an RGBG structure (e.g., a PENTILE® structure)). PENTILE® is a registered trademark of Samsung Display Co., Ltd., Republic of Korea.

Each of the pixels PXL may include at least one light emitting element LD configured to be driven in response to a corresponding scan signal and a corresponding data signal. The light emitting element LD may have a small size ranging from the nanoscale (or the nanometer scale) to the microscale (the micrometer scale) and may be electrically connected in parallel to light emitting elements LD disposed adjacent thereto, but the present disclosure is not limited thereto. The light emitting element LD may form a light source of each pixel PXL.

Each of the pixels PXL may include at least one light source, e.g., the light emitting element LD illustrated in FIGS. 1 and 2, which is driven by a suitable signal (e.g., a set or predetermined signal, such as, a scan signal and a data signal) and/or a suitable power supply (e.g., a set or predetermined power supply, e.g., a first driving power supply and a second driving power supply). However, in one or more embodiments, the type of the light emitting element LD that may be used as a light source of each pixel PXL is not limited thereto.

The driver may supply a suitable signal (e.g., a set or predetermined signal) and a suitable power voltage (e.g., a set or predetermined power voltage) to each of the pixels PXL through the line component and thus control the operation of the pixel PXL.

Figure 4:
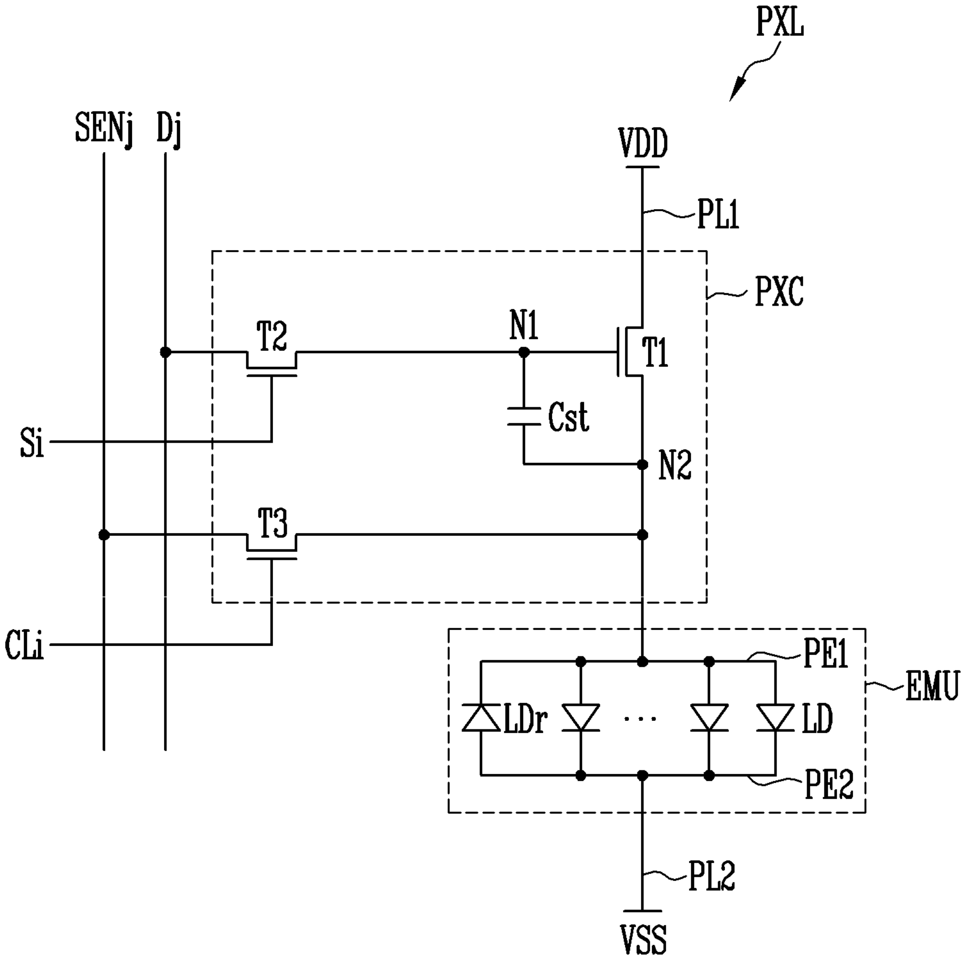
FIG. 4 is a schematic circuit diagram illustrating an embodiment of an electrical connection relationship of components included in each pixel illustrated in FIG. 3.

FIG. 4 is a schematic circuit diagram illustrating an embodiment of electrical connection relationship of components included in each pixel PXL illustrated in FIG. 3.

For example, FIG. 4 illustrates the electrical connection relationship of components included in the pixel PXL that may be employed in an active matrix type display device. However, the electrical connection relationship between the components included in the pixel PXL that can be applied to embodiments is not limited thereto.

Referring to FIGS. 1 to 4, the pixel PXL may include an emission unit EMU (an emission layer, or an emitter) configured to generate light having a luminance corresponding to a data signal. Furthermore, the pixel PXL may selectively further include a pixel circuit PXC configured to drive the emission unit EMU.

In one or more embodiments, the emission unit EMU may include a plurality of light emitting elements LD electrically connected in parallel between a first power line PL1 that is electrically connected to a first driving power supply VDD and to which a voltage of the first driving power supply VDD is applied, and a second power line PL2 that is electrically connected to a second driving power supply VSS and to which a voltage of the second driving power supply VSS is applied. For example, the emission unit EMU may include a first pixel electrode PE1 electrically connected to the first driving power supply VDD via the pixel circuit PXC and the first power line PL1, a second pixel electrode PE2 electrically connected to the second driving power supply VSS through the second power line PL2, and a plurality of light emitting elements LD electrically connected in parallel to each other in the same direction between the first and second pixel electrodes PE1 and PE2. In one or more embodiments, the first pixel electrode PE1 (referred also to as "first electrode") may be an anode, and the second pixel electrode PE2 (referred also to as "second electrode") may be a cathode.

Each of the light emitting elements LD included in the emission unit EMU may include one end electrically connected to the first driving power supply VDD by the first pixel electrode PE1, and a remaining end electrically connected to the second driving power supply VSS by the second pixel electrode PE2. The first driving power supply VDD and the second driving power supply VSS may have different potentials. For example, the first driving power supply VDD may be set as a high-potential power supply, and the second driving power supply VSS may be set as a low-potential power supply. Here, a difference in potential between the first and second driving power supplies VDD and VSS may be set to a value equal to or greater than a threshold voltage of the light emitting elements LD during an emission period of the pixel PXL.

As described above, the light emitting elements LD that are electrically connected in parallel to each other in the same direction (e.g., in a forward direction) between the first pixel electrode PE1 and the second pixel electrode PE2 to which the voltages of the different power supplies are supplied may form respective valid light sources.

The light emitting elements LD of the emission unit EMU may emit light having a luminance corresponding to driving current supplied thereto through the pixel circuit PXC. For example, during each frame period, the pixel circuit PXC may supply driving current corresponding to a gray scale value of corresponding frame data to the emission unit EMU. The driving current supplied to the emission unit EMU may be divided into parts which flow into the respective light emitting elements LD. Hence, each of the light emitting elements LD may emit light having a luminance corresponding to current applied thereto, so that the emission unit EMU may emit light having a luminance corresponding to the driving current.

Although there has been described the embodiment in which the opposite ends of the light emitting elements LD are electrically connected in the same direction between the first and second driving power supplies VDD and VSS, the present disclosure is not limited thereto. In one or more embodiments, the emission unit EMU may further include at least one invalid light source, e.g., a reverse light emitting element LDr, as well as including the light emitting elements LD that form the respective valid light sources. The reverse light emitting element LDr, along with the light emitting elements LD that form the valid light sources, may be electrically connected in parallel to each other between the first and second pixel electrodes PE1 and PE1. Here, the reverse light emitting element LDr may be connected between the first and second pixel electrodes PE1 and PE2 in a direction opposite to that of the light emitting elements LD. Even if a suitable driving voltage (e.g., a set or predetermined driving voltage, such as, a forward driving voltage) is applied between the first and second pixel electrodes PE1 and PE2, the reverse light emitting element LDr remains disabled. Hence, current substantially does not flow through the reverse light emitting element LDr.

The pixel circuit PXC may be electrically connected to a scan line Si and a data line Dj of the pixel PXL. The pixel circuit PXC may be electrically connected to a control line CLi and a sensing line SENj of the pixel PXL. For example, in case that the pixel PXL is disposed on an i-th row and a j-th column of the display area DA, the pixel circuit PXC of the pixel PXL may be electrically connected to an i-th scan line Si, a j-th data line Dj, an i-th control line CLi, and a j-th sensing line SENj of the display area DA.

The pixel circuit PXC may include first to third transistors T1 to T3, and a storage capacitor Cst.

The first transistor T1 may be a driving transistor configured to control driving current to be applied to the emission unit EMU and be electrically connected between the first driving power supply VDD and the emission unit EMU. In detail, a first terminal of the first transistor T1 may be electrically connected (or coupled) to the first driving power supply VDD through the first power line PL1. A second terminal of the first transistor T1 may be electrically connected to a second node N2. A gate electrode of the first transistor T1 may be electrically connected to a first node N1. The first transistor T1 may control, in response to a voltage applied to the first node N1, the amount of driving current to be applied from the first driving power supply VDD to the emission unit EMU by the second node N2. In one or more embodiments, the first terminal of the first transistor T1 may be a drain electrode, and the second terminal of the first transistor T1 may be a source electrode, and the present disclosure is not limited thereto. In one or more embodiments, the first terminal may be a source electrode, and the second terminal may be a drain electrode.

The second transistor T2 may be a switching transistor that selects a pixel PXL in response to a scan signal and activates the pixel PXL, and may be electrically connected between the data line Dj and the first node N1. A first terminal of the second transistor T2 may be electrically connected to the data line Dj. A second terminal of the second transistor T2 may be electrically connected to the first node N1. A gate electrode of the second transistor T2 may be electrically connected to the scan line Si. The first terminal and the second terminal of the second transistor T2 are different terminals, and, for example, if the first terminal is a drain electrode, and the second terminal is a source electrode.

When a scan signal having a gate-on voltage (e.g., a high level voltage) is supplied from the scan line Si, the second transistor T2 may be turned on to electrically connect the data line Dj with the first node N1. The first node N1 may be a point at which the second terminal of the second transistor T2 and the gate electrode of the first transistor T1 are electrically connected to each other. The second transistor T2 may transmit a data signal to the gate electrode of the first transistor T1.

The third transistor T3 may obtain a sensing signal through the sensing line SENj by connecting the first transistor T1 to the sensing line SENj, and detect, using the sensing signal, characteristics of the pixel PXL such as a threshold voltage of the first transistor T1. Information about the characteristics of the pixel PXL may be used to convert image data such that a deviation in characteristic between pixels PXL can be compensated for. A second terminal of the third transistor T3 may be electrically connected to the second terminal of the first transistor T1. A first terminal of the third transistor T3 may be electrically connected to the sensing line SENj. A gate electrode of the third transistor T3 may be electrically connected to the control line CLi. Furthermore, in one or more embodiments, the first terminal of the third transistor T3 may be electrically connected to an initialization power supply. The third transistor T3 may be an initialization transistor configured to initialize the second node N2, and may be turned on when a sensing control signal is supplied thereto from the control line CLi, so that the voltage of the initialization power supply can be transmitted to the second node N2. Hence, a second storage electrode of the storage capacitor Cst electrically connected to the second node N2 may be initialized.

A first storage electrode of the storage capacitor Cst may be electrically connected to the first node N1. A second storage electrode of the storage capacitor Cst may be electrically connected to the second node N2. The storage capacitor Cst may be charged with a data voltage corresponding to a data signal to be supplied to the first node N1 during one frame period. Hence, the storage capacitor Cst may store a voltage corresponding to a difference between a voltage of the gate electrode of the first transistor T1 and a voltage of the second node N2.

Although FIG. 4 illustrates an embodiment in which all of the light emitting elements LD that form the emission unit EMU are electrically connected in parallel to each other, the present disclosure is not limited thereto. In one or more embodiments, the emission unit EMU may include at least one serial set (or stage) including a plurality of light emitting elements LD electrically connected in parallel to each other. In other words, the emission unit EMU may be formed of a serial/parallel combination structure. An embodiment in which the emission unit EMU is formed of a serial/parallel combination structure will be described below with reference to FIG. 14.

Figure 5:
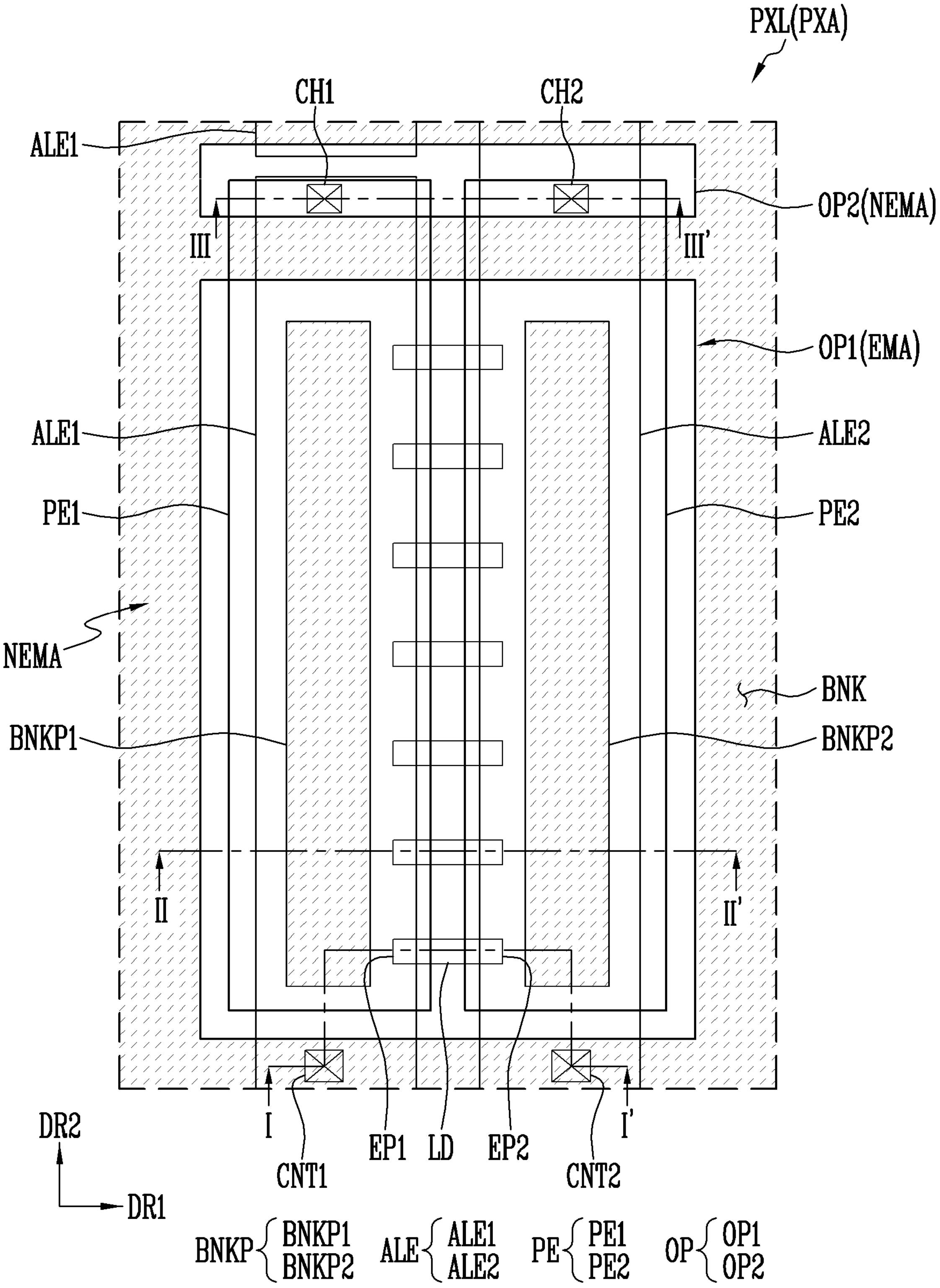
FIG. 5 is a plan view schematically illustrating each pixel illustrated in FIG. 3.

FIG. 5 is a plan view schematically illustrating each pixel PXL illustrated in FIG. 3.

In FIG. 5, for the sake of explanation, illustration of the transistors electrically connected to the light emitting elements LD and the signal lines electrically connected to the transistors T is omitted.

In FIG. 5, for the sake of explanation, a horizontal direction in a plan view is indicated by a first direction DR1, and a vertical direction in a plan view is indicated by a second direction DR2.

Furthermore, in FIG. 5, not only the components included in the pixel PXL illustrated in FIG. 5 but also an area in which the components are provided (or located) may be embraced in the definition of the term "pixel PXL".

Referring to FIGS. 1 to 5, the pixel PXL may be disposed in a pixel area PXA provided (or defined) on the substrate SUB. The pixel area PXA may include an emission area EMA and a non-emission area NEMA.

The pixel PXL may include a bank BNK disposed in the non-emission area NEMA, and light emitting elements LD disposed in the emission area EMA.

The bank BNK may be a structure for defining (or partitioning) the respective pixel areas PXA (or the respective emission areas EMA) of the pixel PXL and pixels PXL adjacent thereto and, for example, be a pixel defining layer.

In one or more embodiments, the bank BNK may be a pixel defining layer or a dam structure for defining each emission area EMA to which the light emitting elements LD are to be supplied, during a process of supplying (or inputting) the light emitting elements LD to the pixel PXL. For example, because the emission area EMA of the pixel PXL is defined by the bank BNK, a mixed solution (e.g., ink) including a target amount and/or type of light emitting elements LD may be supplied (or input) to the emission area EMA. Furthermore, during a process of supplying a color conversion layer, the bank BNK may be a pixel defining layer that ultimately defines each emission area EMA to which the color conversion layer is to be supplied.

In one or more embodiments, the bank BNK may include at least one light block material and/or reflective material (or scattering material), thus preventing a light leakage defect in which light (or rays) leaks between the pixel PXL and the pixels PXL adjacent thereto. In one or more embodiments, the bank BNK may include transparent material (or substance). The transparent material may include, for example, polyamides resin, polyimides resin, etc., but the present disclosure is not limited thereto. In one or more embodiments, in order to enhance the efficiency of light emitted from the pixel PXL, a separate reflective material layer may be provided and/or formed on the bank BNK.

The bank BNK may be surface-treated so that at least one surface thereof has hydrophobicity. For example, the bank BNK may be surface-treated to have hydrophobicity by plasma before the light emitting elements LD are aligned, but the present disclosure is not limited thereto.

The bank BNK may include, in the pixel area PXA, at least one opening OP that exposes components disposed thereunder. For example, the bank BNK may include a first opening OP1 and a second opening OP2 that expose the components disposed under the bank BNK in the pixel area PXA. In one or more embodiments, the emission area EMA of the pixel PXL and the first opening OP1 of the bank BNK may correspond to each other.

In the pixel area PXA, the second opening OP2 may be disposed at a position spaced from the first opening OP1, and disposed adjacent to one side of the pixel area PXA, e.g., an upper side of the pixel area PXA. In one or more embodiments, the second opening OP2 may be an electrode separation area where at least one alignment electrode ALE is separated from at least one alignment electrode ALE provided in pixels PXL adjacent thereto in the second direction DR2.

The pixel PXL may include pixel electrodes PE provided in at least the emission area EMA, light emitting elements LD electrically connected to the pixel electrodes PE, and bank patterns BNKP and alignment electrodes ALE that are provided at positions corresponding to the pixel electrodes PE. For example, the pixel PXL may include first and second pixel electrodes PE1 and PE2, light emitting elements LD, first and second bank patterns BNKP1 and BNKP2, and first and second alignment electrodes ALE1 and ALE2, which are provided in at least the emission area EMA. The pixel electrodes PE and/or the alignment electrodes ALE each may be changed in number, shape, size, arrangement structure, etc. in various ways depending on the structure of the pixel PXL (particularly, the emission unit EMU).

In one or more embodiments, based on one surface of the substrate SUB on which the pixel PXL is provided, the alignment electrodes ALE, the bank patterns BNKP, the light emitting elements LD, and the pixel electrodes PE may be provided in the order listed, but the present disclosure is not limited thereto. In one or more embodiments, the positions and formation sequence of electrode patterns that form the pixel PXL (or the emission unit EMU or the emitter) may be changed in various ways. Description of a stacked structure of the pixel PXL will be described below with reference to FIGS. 6 to 12.

The alignment electrodes ALE may include the first alignment electrode ALE1 and the second alignment electrode ALE2 that are spaced from each other in the first direction DR1.

At least one of the first and second alignment electrodes ALE1 and ALE2 may be separated from other electrodes (e.g., an alignment electrode ALE provided in a pixel PXL adjacent thereto in the second direction DR2) in the second opening OP2 (or the electrode separation area) after the light emitting elements LD are supplied and aligned in the pixel area PXA during a process of fabricating the display device. For example, one end of the first alignment electrode ALE1 may be separated, in the second opening OP2, from the first alignment electrode ALE1 of the pixel PXL that is disposed on an upper side of the corresponding pixel PXL in the second direction DR2.

The first alignment electrode ALE1 may be electrically connected with the first transistor T1 described with reference to FIG. 4 through a first contactor CNT1. The second alignment electrode ALE2 may be electrically connected with the second power line PL2 (or the second driving power supply VSS) described with reference to FIG. 4 through a second contactor CNT2.

The first contactor CNT1 may be formed by removing a portion of at least one insulating layer disposed between the first alignment electrode ALE1 and the first transistor T1. The second contactor CNT2 may be formed by removing a portion of at least one insulating layer disposed between the second alignment electrode ALE2 and the second power line PL2. In one or more embodiments, the first contactor CNT1 and the second contactor CNT2 may be disposed in the non-emission area NEMA and overlap the bank BNK in a thickness direction of the substrate SUB (e.g., the third direction DR3), but the present disclosure is not limited thereto. In one or more embodiments, the first contactor CNT1 and the second contactor CNT2 may be disposed in the second opening OP2 of the bank BNK that is the electrode separation area, or may be disposed in the emission area EMA.

Each of the first alignment electrode ALE1 and the second alignment electrode ALE2 may be supplied with a suitable signal (e.g., a set or predetermined signal or a predetermined alignment signal) from an alignment pad disposed in the non-display area NDA at the step of aligning the light emitting elements LD. For example, the first alignment electrode ALE1 may be supplied with a first alignment signal (or a first alignment voltage) from a first alignment pad. The second alignment electrode ALE2 may be supplied with a second alignment signal (or a second alignment voltage) from a second alignment pad. The above-mentioned first and second alignment signals may be signals having a voltage difference and/or a phase difference enabling the light emitting elements LD to be aligned between the first and second alignment electrodes ALE1 and ALE2. At least one of the first and second alignment signals may be an AC signal, but the present disclosure is not limited thereto.

Each alignment electrode ALE may have a bar-like shape having a uniform width with respect to the second direction DR2, but the present disclosure is not limited thereto. In one or more embodiments, each alignment electrode ALE may or may not have a bent portion in the non-emission area NEMA and/or the second opening OP2 that is the electrode separation area, and the shape and/or size thereof in areas other than the emission area EMA may be changed in various ways rather than being particularly limited.

The bank patterns BNKP may be provided in at least the emission area EMA, and may be spaced from each other with respect to the first direction DR1 in the emission area EMA, and each may extend in the second direction DR2.

Each bank pattern BNKP (referred also to as "wall pattern", "protrusion pattern", or "support pattern") may have a uniform width in the emission area EMA. For example, each of the first and second bank patterns BNKP1 and BNKP2 may have a bar-like shape having a uniform width with respect to an extension direction thereof in the emission area EMA, in a plan view, but the present disclosure is not limited thereto.

The bank pattern BNKP may include a first bank pattern BNKP1 and a second bank pattern BNKP2 that are arranged at positions spaced from each other in the first direction DR1.

The first bank pattern BNKP1 may be disposed on the first alignment electrode ALE1 and overlap the first alignment electrode ALE1 in the third direction DR3. The second bank pattern BNKP2 may be disposed on the second alignment electrode ALE2 and overlap the second alignment electrode ALE2 in the third direction DR3. The light emitting elements LD may be aligned (or disposed) between the first bank pattern BNKP1 and the second bank pattern BNKP2. In one or more embodiments, the bank pattern BNKP may be a structure for accurately defining (or providing) an alignment position of the light emitting elements LD in the emission area EMA of the pixel PXL.

The bank patterns BNKP may have the same width or different widths. For example, the first and second bank patterns BNKP1 and BNKP2 may have the same width or different widths with respect to the first direction DR1 in at least the emission area EMA.

Although at least two to several tens of light emitting elements LD may be aligned and/or provided in the emission area EMA (or the pixel area PXA), the number of light emitting elements LD is not limited thereto. In one or more embodiments, the number of light emitting elements LD aligned and/or provided in the emission area EMA (or the pixel area PXA) may be changed in various ways.

The light emitting elements LD may be disposed between the first alignment electrode ALE1 and the second electrode ALE2. Each of the light emitting elements LD may be the light emitting element LD described with reference to FIGS. 1 and 2. Each of the light emitting elements LD may include a first end EP1 (or one end) and a second end EP2 (or a remaining end) that are disposed on opposite ends thereof with respect to the longitudinal direction. In one or more embodiments, the second semiconductor layer 13 including a p-type semiconductor layer may be disposed on the first end EP1, and the first semiconductor layer 11 including an n-type semiconductor layer may be disposed on the second end EP2. The light emitting elements LD may be electrically connected in parallel between the first alignment electrode ALE1 and the second electrode ALE2.

The light emitting elements LD may be disposed at positions spaced from each other and aligned in parallel to each other. A distance by which the light emitting elements LD are spaced from each other is not particularly limited. In one or more embodiments, a plurality of light emitting elements LD may be disposed adjacent to each other to form a group, and another plurality of light emitting elements LD may be spaced from each other at regular intervals to form a group. The light emitting elements LD may be aligned in one direction with an uneven density.

Each of the light emitting elements LD may emit any one light of color light and/or white light. Each of the light emitting elements LD may be aligned between the first alignment electrode ALE1 and the second alignment electrode ALE2 such that the longitudinal direction is parallel to the first direction DR1. In one or more embodiments, the light emitting elements LD may be aligned between the first alignment electrode ALE1 and the second alignment electrode ALE2 such that at least some of the light emitting elements LD are not completely parallel to the first direction DR1. The light emitting elements LD may be provided in a sprayed (or diffused) form in a solution (e.g., ink) and then input (or supplied) to the pixel area PXA (or the emission area EMA).

The light emitting elements LD may be input (or supplied) to the pixel area PXA (or the emission area EMA) by an inkjet printing scheme, a slit coating scheme, or other various schemes. For example, the light emitting elements LD may be mixed with a volatile solvent and then input (or supplied) to the pixel area PXA by an inkjet printing scheme or a slit coating scheme. Here, if the first alignment electrode ALE1 and the second alignment electrode ALE2 are respectively supplied with corresponding alignment signals, an electric field may be formed between the first alignment electrode ALE1 and the second alignment electrode ALE2. Consequently, the light emitting elements LD may be aligned between the first alignment electrode ALE1 and the second alignment electrode ALE2. After the light emitting elements LD are aligned, the solvent may be removed by a volatilization scheme or other schemes. In this way, the light emitting elements LD may be reliably aligned between the first alignment electrode ALE1 and the second alignment electrode ALE2.

Each of the light emitting elements LD may be a light emitting diode that is made of material having an inorganic crystal structure and has a subminiature size, e.g., ranging from the nanoscale (or the nanometer scale) to the microscale (or the micrometer scale). For example, each of the light emitting elements LD may be the light emitting element LD described with reference to FIGS. 1 and 2.

The pixel electrodes (or the electrodes) PE may be provided in at least the emission area EMA, and each may be provided at a position corresponding to at least one alignment electrode ALE and the light emitting elements LD. For example, each pixel electrode PE may be formed on the corresponding alignment electrode ALE and the corresponding light emitting elements LD to overlap the corresponding alignment electrode ALE and the corresponding light emitting elements LD, and thus electrically connected to at least the light emitting elements LD.

The first pixel electrode ("first electrode" or "anode") PE1 may be formed on the first alignment electrode ALE1 and the respective first ends EP1 of the light emitting elements LD, and thus electrically connected to the respective first ends EP1 of the light emitting elements LD. Furthermore, the first pixel electrode PE1 may directly contact the first alignment electrode ALE1 through a first contact hole CH1 in one area of at least the non-emission area NEMA, for example, in the second opening OP2 (or the electrode separation area) of the bank BNK, and may be physically and/or electrically connected with the first alignment electrode ALE1. The first contact hole CH1 may be formed by removing a portion of at least one insulating layer disposed between the first alignment electrode ALE1 and the first pixel electrode PE1. Although in the foregoing embodiment the first contact hole CH1 corresponding to a connection point (or a contact portion) between the first pixel electrode PE1 and the first alignment electrode ALE1 has been described as being located in the non-emission area NEMA corresponding to the second opening OP2 of the bank BNK that is the electrode separation area, the present disclosure is not limited thereto. In one or more embodiments, the first contact hole CH1 may be located in the emission area EMA.

The first pixel electrode PE1 may have a bar-like shape extending in the second direction DR2, but the present disclosure is not limited thereto. In one or more embodiments, the shape of the first pixel electrode PE1 may be changed in various ways so long as the first pixel electrode PE1 can be electrically and/or physically reliably connected with the first ends EP1 of the light emitting elements LD. Furthermore, the shape of the first pixel electrode PE1 may be changed in various ways, taking into account the connection relationship with the first alignment electrode ALE1.

The second pixel electrode PE2 (referred also to as "second electrode" or "cathode") may be formed on the second alignment electrode ALE2 and the respective second ends EP2 of the light emitting elements LD, and thus electrically connected to the respective second ends EP2 of the light emitting elements LD. Furthermore, the second pixel electrode PE2 may directly contact the second alignment electrode ALE2 through a second contact hole CH2 in one area of at least the non-emission area NEMA, for example, in the second opening OP2 (or the electrode separation area) of the bank BNK, and may be physically and/or electrically connected with the second alignment electrode ALE2. The second contact hole CH2 may be formed by removing a portion of at least one insulating layer disposed between the second alignment electrode ALE2 and the second pixel electrode PE2. Although in the foregoing embodiment the second contact hole CH2 corresponding to a connection point (or a contact portion) between the second pixel electrode PE2 and the second alignment electrode ALE2 has been described as being located in the non-emission area NEMA corresponding to the second opening OP2 of the bank BNK that is the electrode separation area, the present disclosure is not limited thereto. In one or more embodiments, the second contact hole CH2 may be located in the emission area EMA.

The second pixel electrode PE2 may have a bar-like shape extending in the second direction DR2, but the present disclosure is not limited thereto. In one or more embodiments, the shape of the second pixel electrode PE2 may be changed in various ways so long as the second pixel electrode PE2 can be electrically and/or physically reliably connected with the second ends EP2 of the light emitting elements LD. Furthermore, the shape of the second pixel electrode PE2 may be changed in various ways, taking into account the connection relationship with the second alignment electrode ALE2 disposed thereunder.

Hereinafter, the stacked structure of the pixel PXL in accordance with the foregoing embodiment will be mainly described with reference to FIGS. 6 to 12.

Figure 6:
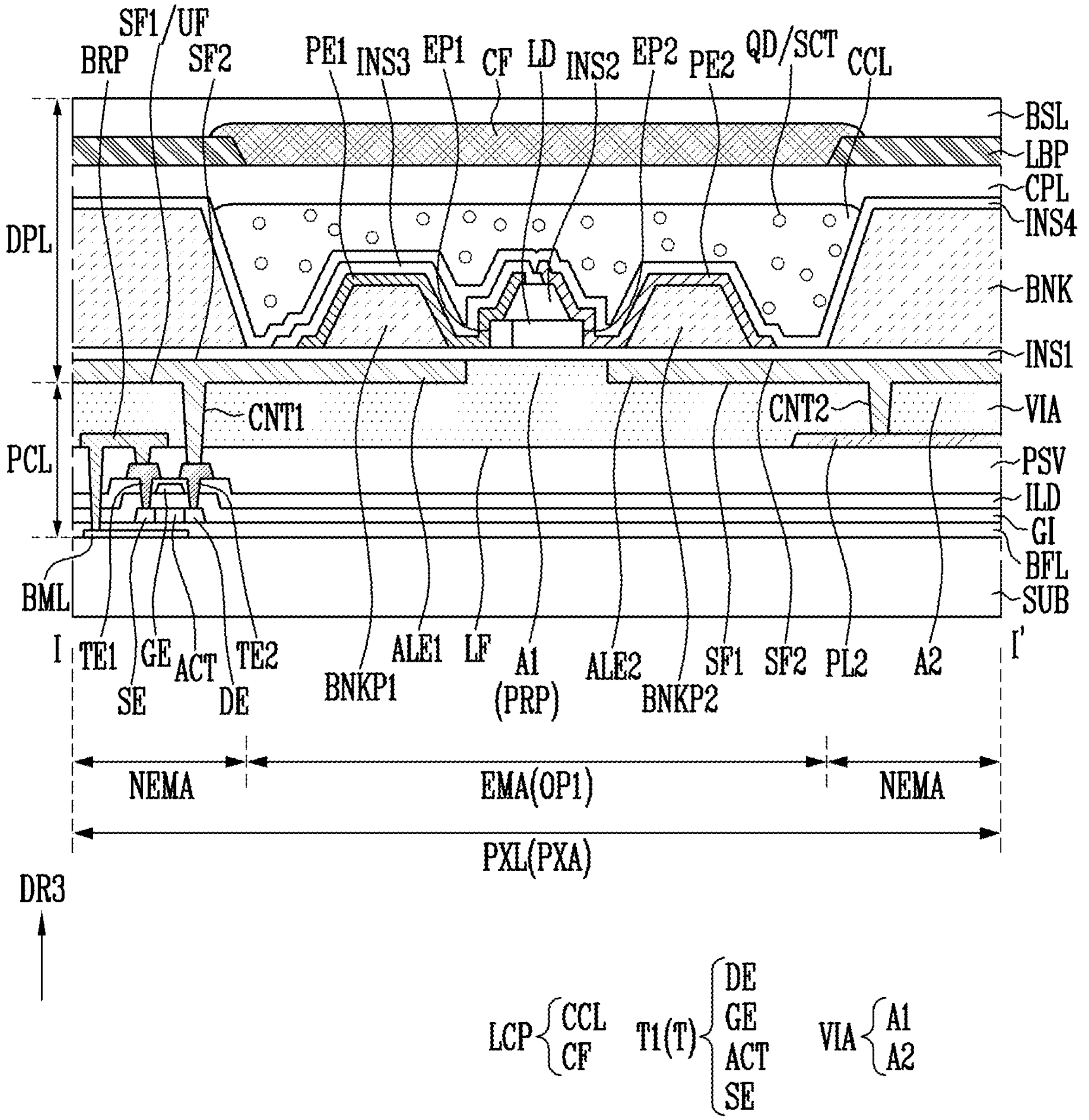
FIGS. 6 and 7 are schematic cross-sectional views taken along the line I-I' of FIG. 5.
Figure 7:
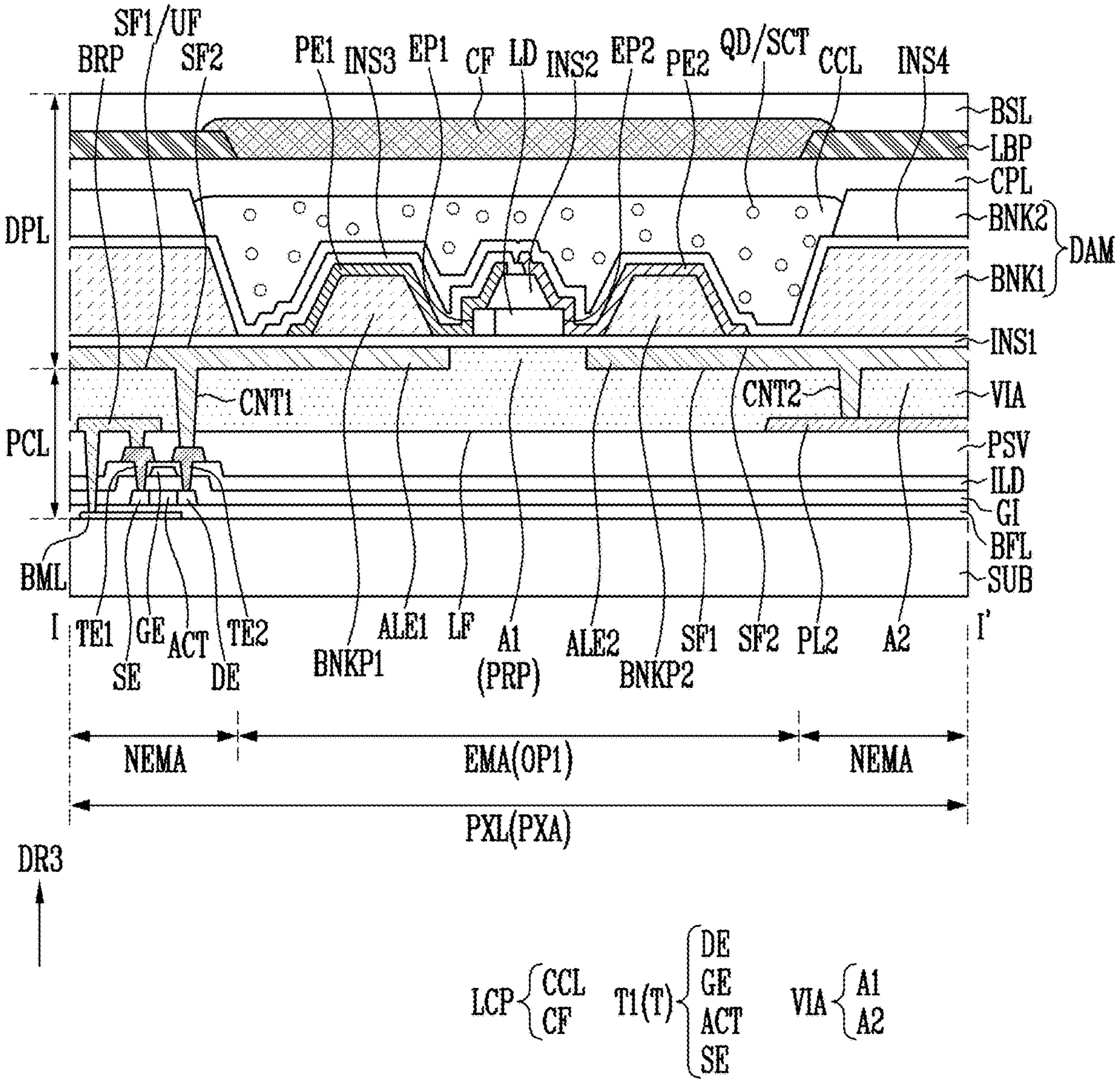

FIGS. 6 and 7 are schematic cross-sectional views taken along the line I-I' of FIG. 5. FIGS. 8 to 11 are schematic cross-sectional views taken along the line II-II' of FIG. 5. FIG. 12 is a schematic cross-sectional diagram taken along the line III-III' of FIG. 5.

In the description of embodiments, "components are provided and/or formed on (or at) the same layer" may mean that the components are formed through the same process, and "components are provided and/or formed on different layers may mean that the components are formed through different processes.

FIG. 7 illustrates a modification of the embodiment of FIG. 6 with regard to a dam structure DAM, etc.

Figure 8:
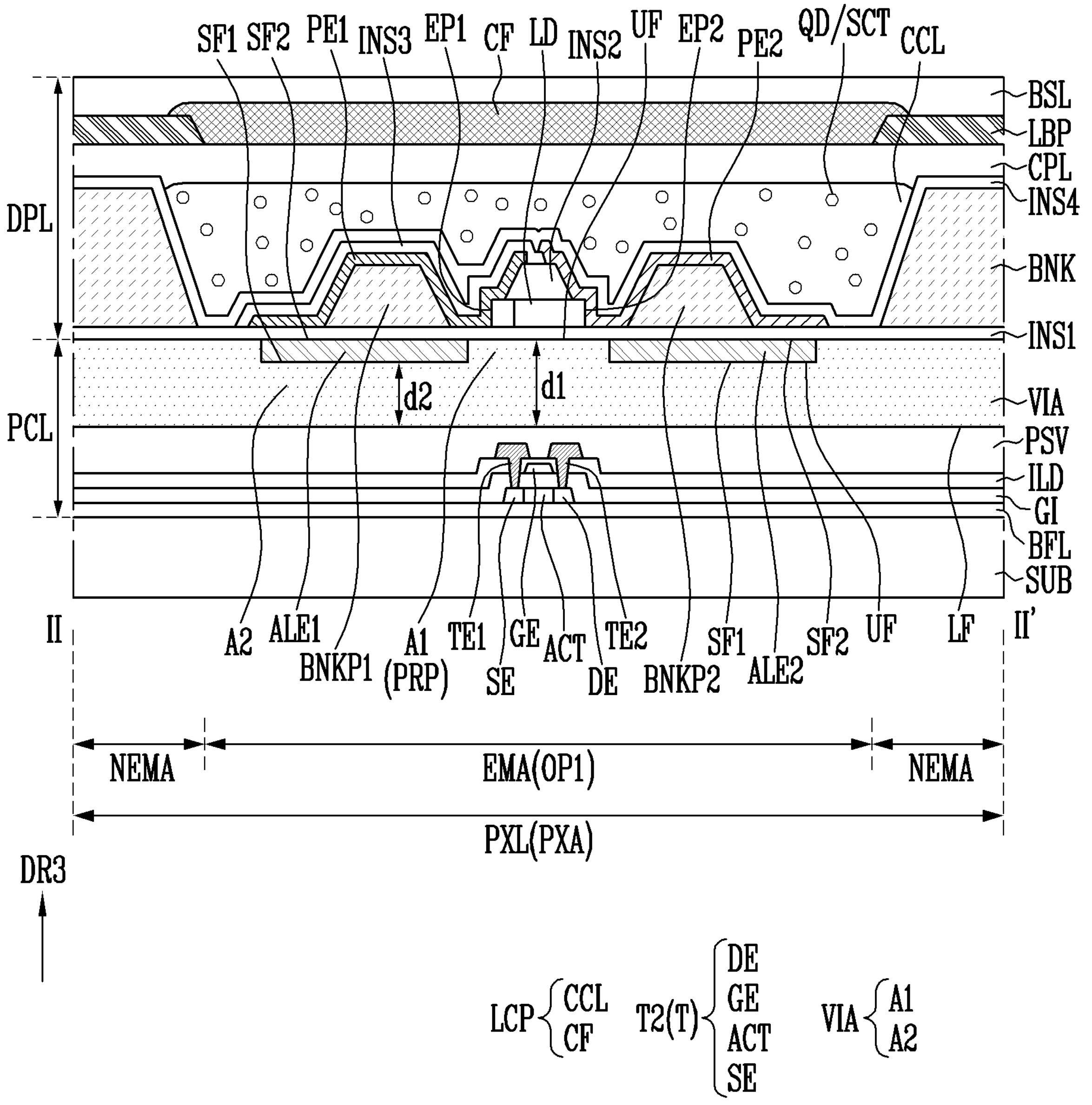
FIGS. 8 to 11 are schematic cross-sectional views taken along the line II-II' of FIG. 5.
Figure 9:
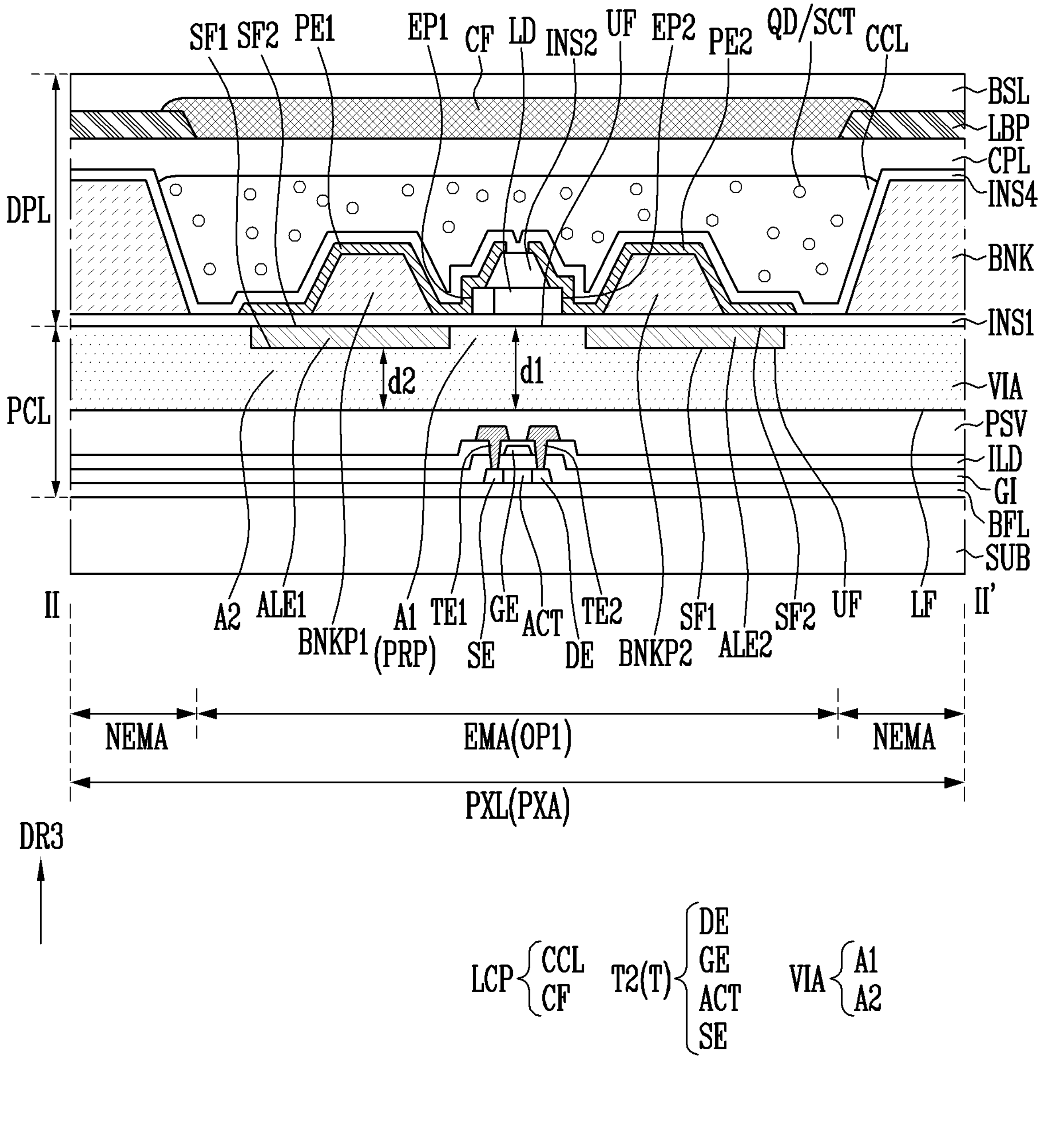

FIG. 9 illustrates a modification of the embodiment of FIG. 8 with regard to a pixel electrode PE, etc.

Figure 10:
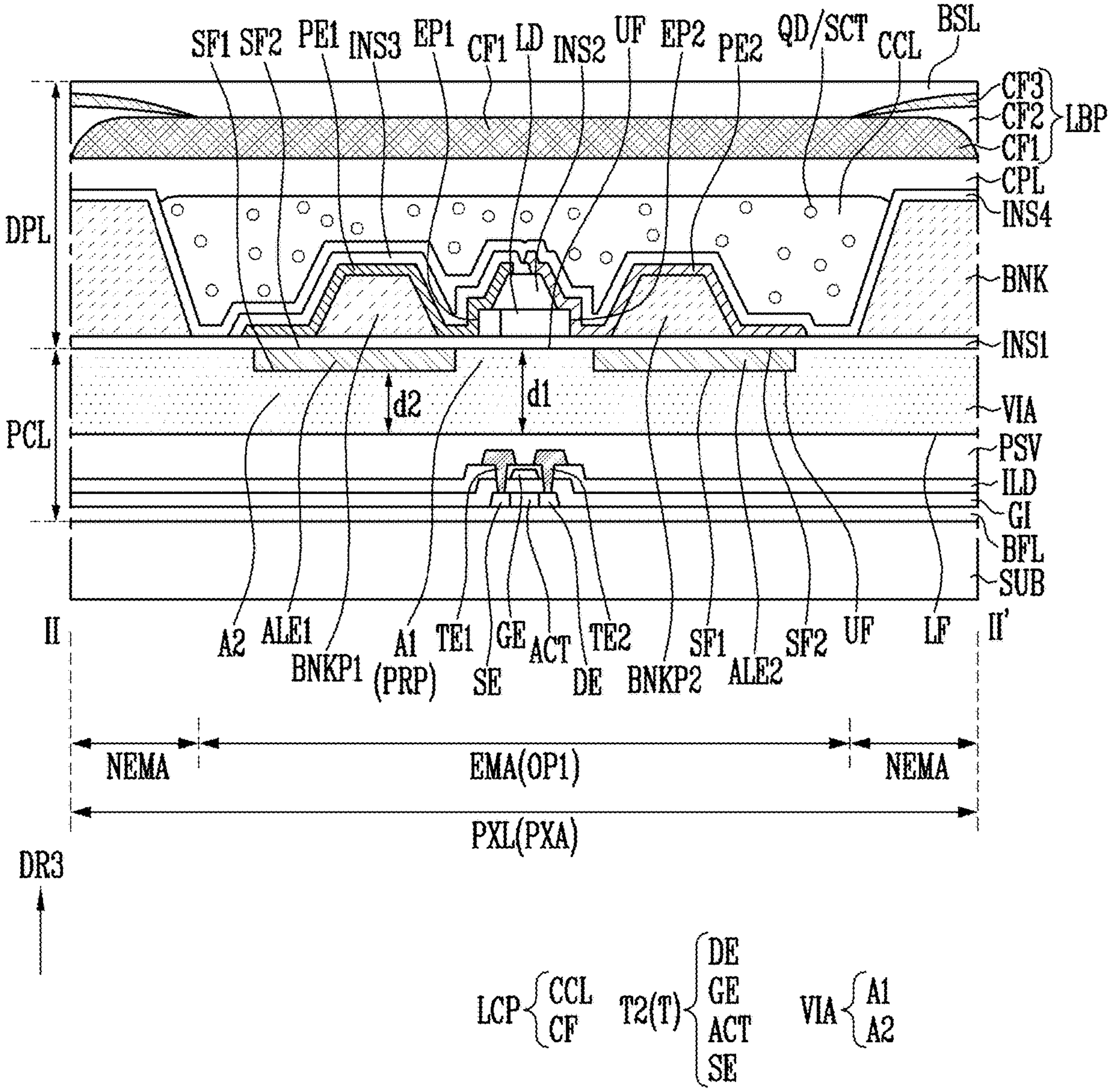

FIG. 10 illustrates a modification of the embodiment of FIG. 8 with regard to a color filter CF, etc.

Figure 11:
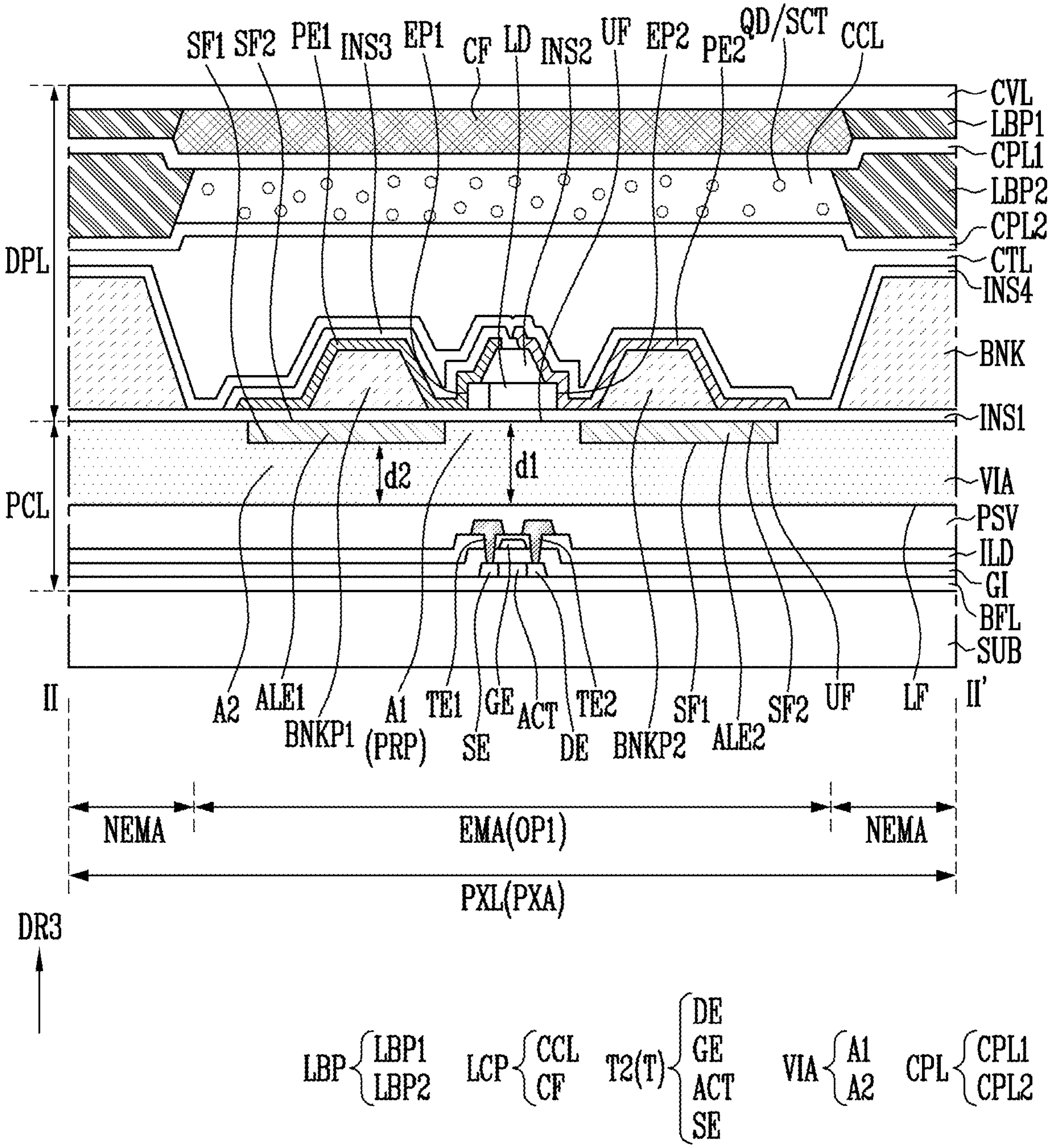
Figure 12:
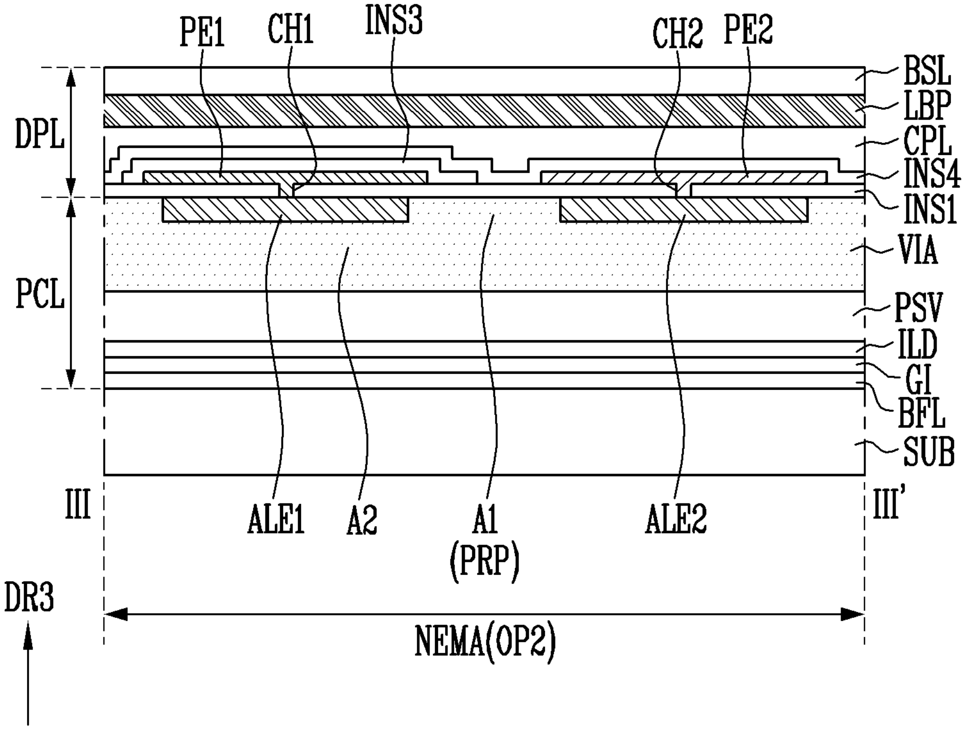
FIG. 12 is a schematic cross-sectional diagram taken along the line III-III' of FIG. 5.

FIG. 11 illustrates a modification of the embodiment of FIG. 8 with regard to a light conversion pattern LCP, etc. For example, FIG. 11 illustrates an embodiment where a color conversion layer CCL and the color filter CF are directly formed on a capping layer CPL. FIG. 11 illustrates an embodiment where an upper substrate including the light conversion pattern LCP is disposed on the pixel electrode PE through an adhesion process using an intermediate layer CTL.

Although FIGS. 6 to 12 simply illustrate a pixel PXL, e.g., illustrating that each electrode is formed of an electrode having a single-layer (or single-film) structure and each insulating layer is formed of an insulating layer having a single-layer (or single-film) structure, the present disclosure is not limited thereto.

Furthermore, in FIGS. 6 to 10, a vertical direction (or a thickness direction of the substrate SUB) in a cross-sectional view is represented by the third direction DR3.

Referring to FIGS. 1 to 12, the pixel PXL may include a substrate SUB, a pixel circuit layer PCL, and a display element layer DPL.

The pixel circuit layer PCL and the display element layer DPL may be disposed on one surface of the substrate SUB and overlap each other. For example, the display area DA of the substrate SUB may include the pixel circuit layer PCL disposed on the one surface of the substrate SUB, and the display element layer DPL disposed on the pixel circuit layer PCL. However, relative positions of the pixel circuit layer PCL and the display element layer DPL on the substrate SUB may be changed depending on embodiments. In case that the pixel circuit layer PCL and the display element layer DPL are separated from each other as separate layers and overlap each other, layout space sufficient to form each of the pixel circuit PXC and the emission unit EMU may be secured.

The substrate SUB may include transparent insulating material to allow light transmission. The substrate SUB may be a rigid substrate or a flexible substrate.

For example, the rigid substrate SUB may be one of a glass substrate, a quartz substrate, a glass ceramic substrate, and a crystalline glass substrate.

The flexible substrate SUB may be either a film substrate or a plastic substrate that includes polymer organic material. For example, the flexible substrate SUB may include at least one of the following: polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, and cellulose acetate propionate.

In each pixel area PXA of the pixel circuit layer PCL, circuit elements (e.g., transistors T) for forming the pixel circuit PXC of the corresponding pixel PXL and suitable signal lines (e.g., predetermined signal lines) electrically connected to the circuit elements may be disposed. Furthermore, in each pixel area PXA of the display element layer DPL, the alignment electrodes ALE, the light emitting elements LD, and/or the pixel electrodes PE that form the emission unit EMU of the corresponding pixel PXL may be disposed.

The pixel circuit layer PCL may include at least one insulating layer as well as including the circuit elements and the signal lines. For example, the pixel circuit layer PCL may include a buffer layer BFL, a gate insulating layer GI, an interlayer insulating layer ILD, a passivation layer PSV, and a via layer VIA that are successively stacked on the substrate SUB in the third direction DR3.

The buffer layer BFL may be provided and/or formed on the overall surface of the substrate SUB. The buffer layer BFL may prevent impurities from diffusing into a transistor T included in the pixel circuit PXC. The buffer layer BFL may be an inorganic insulating layer formed of inorganic material. The buffer layer BFL may include at least one of silicon nitride ($SiN_x$), silicon oxide ($SiO_x$), silicon oxynitride ($SiO_xN_y$), and metal oxide such as aluminum oxide ($AlO_x$). The buffer layer BFL may be provided in a single-layer structure or a multi-layer structure having at least two or more layers. In case that the buffer layer BFL has a multi-layer structure, the respective layers may be formed of the same material or different materials. The buffer layer BFL may be omitted depending on the material of the substrate SUB or processing conditions.

The pixel circuit PXC may include a first transistor T1 (or a driving transistor) configured to control driving current of the light emitting elements LD, and a second transistor T2 (or a switching transistor) electrically connected to the first transistor T1. However, the present disclosure is not limited thereto. The pixel circuit PXC may further include circuit elements configured to perform other functions, as well as including the first transistor T1 and the second transistor T2. In the following embodiments, the first transistor T1 and the second transistor T2 may be embraced in the term "transistor T" or "transistors T".

The transistors T may include a semiconductor pattern and a gate electrode GE that overlaps a portion of the semiconductor pattern. The semiconductor pattern may be provided on the buffer layer BFL. Here, the semiconductor pattern may include an active pattern ACT, a first contact area SE, and a second contact area DE. The first contact area SE may be one of a source area and a drain area, and the second contact area DE may be the other one of the source area and the drain area.

The gate electrode GE may have a single-layer structure formed of one or combination selected from the group consisting of molybdenum (Mo), tungsten (W), aluminum neodymium (AlNd), titanium (Ti), aluminum (Al), silver (Ag), and an alloy thereof, or may have a double-layer or multi-layer structure formed of molybdenum (Mo), titanium (Ti), copper (Cu), aluminum (Al), or silver (Ag) which is low resistance material to reduce line resistance.

A gate insulating layer GI may be provided and/or formed on the overall surfaces of the semiconductor pattern and the buffer layer BFL. The gate insulating layer GI may be an inorganic insulating layer including inorganic material. For example, the gate insulating layer GI may include at least one of metal oxides such as silicon nitride ($SiN_x$), silicon oxide ($SiO_x$), silicon oxynitride ($SiO_xN_y$), and aluminum oxide ($AlO_x$). However, the material of the gate insulating layer GI is not limited to that of the foregoing embodiments. In one or more embodiments, the gate insulating layer GI may be formed of an organic insulating layer including organic material. Although the gate insulating layer GI may be provided in a single-layer structure, the gate insulating layer GI may be provided in a multi-layer structure having at least two or more layers.

The active pattern ACT, the first contact area SE, and the second contact area DE each may be a semiconductor pattern formed of poly silicon, amorphous silicon, an oxide semiconductor, etc. The active pattern ACT, the first contact area SE, and the second contact area DE each may be formed of an undoped semiconductor layer or a semiconductor layer doped with an impurity. For example, each of the first contact area SE and the second contact area DE may be formed of a semiconductor layer doped with an impurity. The active pattern ACT may be formed of an undoped semiconductor layer. For example, an n-type impurity may be used as the impurity, but the present disclosure is not limited thereto.

The active pattern ACT may be an area that overlaps the gate electrode GE of the corresponding transistor T in the third direction DR3, and may be a channel area. For example, the active pattern ACT of the first transistor T1 may overlap the gate electrode GE of the first transistor T1 and thus form a channel area of the first transistor T1. The active pattern ACT of the second transistor T2 may overlap the gate electrode GE of the second transistor T2 and thus form a channel area of the second transistor T2.

The first contact area SE of the first transistor T1 may be electrically connected to (or brought into contact with) one end of the active pattern ACT of the corresponding transistor T. Furthermore, the first contact area SE of the first transistor T1 may be electrically connected to the bridge pattern BRP through a first connector TE1.

The first connector TE1 may be provided and/or formed on the interlayer insulating layer ILD. One end of the first connector TE1 may be electrically and/or physically connected to the first contact area SE of the first transistor T1 through a contact hole successively passing through the interlayer insulating layer ILD and the gate insulating layer GI. Furthermore, a remaining end of the first connector TE1 may be electrically and/or physically connected to the bridge pattern BRP through a contact hole passing through the passivation layer PSV disposed on the interlayer insulating layer ILD. The first connector TE1 may include the same material as that of the gate electrode GE, or include one or more materials selected from among materials exemplified as the material for forming the gate electrode GE.

The interlayer insulating layer ILD may be provided and/or formed on the overall surfaces of the gate electrode GE and the gate insulating layer GI. The interlayer insulating layer ILD may include the same material as that of the gate insulating layer GI, or may include one or more materials selected from among materials exemplified as the material for forming the gate insulating layer GI.

The bridge pattern BRP may be provided and/or formed on the passivation layer PSV. One end of the bridge pattern BRP may be electrically connected to the first contact area SE of the first transistor T1 by the first connector TE1. Furthermore, a remaining end of the bridge pattern BRP may be electrically and/or physically connected with a bottom metal layer BML through a contact hole that successively passes through the passivation layer PSV, the interlayer insulating layer ILD, the gate insulating layer GI, and the buffer layer BFL. The bottom metal layer BML and the first contact area SE of the first transistor T1 may be electrically connected to each other by the bridge pattern BRP and the first connector TE1.

The bottom metal layer BML may be a first conductive layer of the conductive layers disposed on the substrate SUB. For example, the bottom metal layer BML may be a conductive layer disposed between the substrate SUB and the buffer layer BFL. The bottom metal layer BML may be electrically connected to the first transistor T1 and thus increase a driving range of a suitable voltage (e.g., a set or predetermined voltage) to be supplied to the gate electrode GE of the first transistor T1. For example, the bottom metal layer BML may be electrically connected to the first contact area SE of the first transistor T1 and stabilize the channel area of the first transistor T1. Furthermore, the bottom metal layer BML may be electrically connected to the first contact area SE of the first transistor T1, thus preventing the bottom metal layer BML from floating.

The second contact area DE of the first transistor T1 may be electrically connected to (or brought into contact with) a remaining end of the active pattern ACT of the corresponding transistor T. Furthermore, the second contact area DE of the first transistor T1 may be electrically connected to (or brought into contact with) a second connector TE2.

The second connector TE2 may be provided and/or formed on the interlayer insulating layer ILD. One end of the second connector TE2 may be electrically and/or physically connected to the second contact area DE of the first transistor T1 through a contact hole passing through the interlayer insulating layer ILD and the gate insulating layer GI. A remaining end of the second connector TE2 may be electrically and/or physically connected with the first alignment electrode ALE1 of the display element layer DPL through the first contactor CNT1 that successively passes through the via layer VIA and the passivation layer PSV. In one or more embodiments, the second connector TE2 may be a medium for connecting the first transistor T1 of the pixel circuit layer PCL with the first alignment electrode ALE1 of the display element layer DPL.

The first contact area SE of the second transistor T2 may be electrically connected to (or brought into contact with) one end of the active pattern ACT of the corresponding transistor T. Furthermore, in one or more embodiments, the first contact area SE of the second transistor T2 may be electrically connected with the gate electrode GE of the first transistor T1. For example, the first contact area SE of the second transistor T2 may be electrically connected with the gate electrode GE of the first transistor T1 by an additional first connector TE1. The additional first connector TE1 may be provided and/or formed on the interlayer insulating layer ILD.

The second contact area DE of the second transistor T2 may be electrically connected to (or brought into contact with) a remaining end of the active pattern ACT of the corresponding transistor T. Furthermore, in one or more embodiments, the second contact area DE of the second transistor T2 may be electrically connected with the data line Dj. For example, the second contact area DE of the second transistor T2 may be electrically connected with the data line Dj through an additional second connector TE2. The additional second connector TE2 may be provided and/or formed on the interlayer insulating layer ILD.

The interlayer insulating layer ILD may be provided and/or formed on the first transistor T1 and the second transistor T2.

Although in the foregoing embodiment there has been illustrated the case where each of the transistors T is a thin-film transistor having a top gate structure, the present disclosure is not limited thereto. The structure of the transistors T may be changed in various ways.

The passivation layer PSV may be provided and/or formed on the transistor T and the first and second connectors TE1 and TE2.

The passivation layer (or referred to as "protective layer") PSV may be provided and/or formed on the overall surfaces of the first and second connectors TE1 and TE2 and the interlayer insulating layer ILD. The passivation layer PSV may be formed of an inorganic layer (or an inorganic insulating layer) including inorganic material, or an organic layer (or an organic insulating layer) including organic material. The inorganic layer may include, for example, at least one of silicon oxide ($SiO_x$), silicon nitride ($SiN_x$), silicon oxynitride ($SiO_xN_y$), and metal oxide such as aluminum oxide ($AlO_x$). The organic layer may include, for example, at least one of polyacrylates resin, epoxy resin, phenolic resin, polyamides resin, polyimides rein, unsaturated polyesters resin, poly-phenylen ethers resin, polyphenylene sulfides resin, and benzocyclobutene resin.

The passivation layer PSV may be partially open to include the first contactor CNT1 that exposes one area of the second connector TE2. Furthermore, the passivation layer PSV may be partially open to expose one area of the first connector TE1 and one area of the bottom metal layer BML.

In one or more embodiments, the passivation layer PSV may have material identical with that of the interlayer insulating layer ILD, but the present disclosure is not limited thereto. The passivation layer PSV may be provided in a single-layer structure or a multi-layer structure having at least two or more layers.

The pixel circuit layer PCL may include a power line provided and/or formed on the passivation layer PSV. For example, the power line may include the second power line PL2. The second power line PL2 may be provided on (or at) the same layer as that of the bridge pattern BRP. A voltage of the second driving power supply VSS may be applied to the second power line PL2. In one or more embodiments, the pixel circuit layer PCL may further include the first power line PL1 described with reference to FIG. 4. The first power line PL1 may be provided on (or at) the same layer as that of the second power line PL2 or may be provided on (or at) a layer different from that of the second power line PL2. Although in the foregoing embodiment the second power line PL2 has been described as being provided and/or formed on (or at) the passivation layer PSV, the present disclosure is not limited thereto. In one or more embodiments, the second power line PL2 may be provided on an insulating layer on which any one conductive layer of the conductive layers provided on the pixel circuit layer PCL is disposed. In other words, the location of the second power line PL2 in the pixel circuit layer PCL may be changed in various ways.

The second power line PL2 may include conductive material (or substance). For example, the second power line PL2 may have a single-layer (or single-film) structure formed of one or combination selected from the group consisting of copper (Cu), molybdenum (Mo), tungsten (W), aluminum neodymium (AlNd), titanium (Ti), aluminum (Al), silver (Ag), and an alloy thereof, or may have a double-layer (or double-film) or multi-layer (or multi-film) structure formed of molybdenum (Mo), titanium (Ti), copper (Cu), aluminum (Al), or silver (Ag) which is low resistance material to reduce line resistance. For instance, the second power line PL2 may be formed of a double-layer (or double-film) structure formed by stacking layers in a sequence of titanium (T1) and copper (Cu).

The via layer VIA may be provided and/or formed on the bridge pattern BRP and the second power line PL2.

The via layer VIA may be provided and/or formed on the overall surfaces of the bridge pattern BRP, the second power line PL2, and the passivation layer PSV. The via layer VIA may be formed of a single layer including an organic layer, or multiple layers having double or more layers. In one or more embodiments, the via layer VIA may be provided in a shape including an inorganic layer and an organic layer disposed on the inorganic layer. In case that the via layer VIA has a multi-layer structure, the organic layer included in the via layer VIA may be located on the uppermost layer of the via layer VIA. The via layer VIA may include at least one of polyacrylates resin, epoxy resin, phenolic resin, polyamides resin, polyimides rein, unsaturated polyesters resin, poly-phenylen ethers resin, poly-phenylene sulfides resin, and benzocyclobutene resin.

The via layer VIA may include a first contactor CNT1 that corresponds to the first contactor CNT1 of the passivation layer PSV that exposes the second connector TE2 electrically connected with the transistor T, and a second contactor CNT2 that exposes the second power line PL2. In one or more embodiments, the via layer VIA formed of an organic layer may be used as a planarization layer that mitigates a step difference caused by the components (e.g., the transistors T, the power lines, the bridge pattern BRP, etc.) disposed under the via layer VIA in the pixel circuit layer PCL.

In one or more embodiments, the via layer VIA may include a first part A1 and a second part A2. The first part A1 of the via layer VIA may be one area of the via layer VIA that is disposed under the first insulating layer INS1 between the first bank pattern BNKP1 and the second bank pattern BNKP2 in at least the emission area EMA. The second part A2 of the via layer VIA may be another area of the via layer VIA that is disposed under the first alignment electrode ALE1 and the second alignment electrode ALE2 in at least the emission area EMA. In one or more embodiments, the first part A1 of the via layer VIA may not correspond to (or may not overlap) the first and second alignment electrodes ALE1 and ALE2. The second part A2 of the via layer VIA may correspond to (or overlap) the first and second alignment electrodes ALE1 and ALE2.

The via layer VIA may include a lower surface LF and an upper surface UF that are opposite to each other in the third direction DR3. In one or more embodiments, the lower surface LF may be one surface of the via layer VIA that contacts the passivation layer PSV, the first and second connectors TE1 and TE2, and the second power line PL2. The upper surface UF may be another surface (or an outer surface) of the via layer VIA that contacts the display element layer DPL. Because the via layer VIA is formed of an organic layer (or an organic insulating layer), the first part A1 and the second part A2 each may have a planar surface (or a planar upper surface UF).

The lower surface LF of the first part A1 of the via layer VIA and the lower surface LF of the second part A2 of the via layer VIA may be disposed on (or at) the same level (or the same surface) in a direction (e.g., a horizontal direction) intersecting the third direction DR3.

In a sectional view, the upper surface UF of the first part A1 of the via layer VIA may meet (or physically contact) the first insulating layer INS1, and the upper surface UF of the second part A2 of the via layer VIA may meet (or physically contact) the alignment electrode ALE. Hence, the upper surface UF of the first part A1 of the via layer VIA and the upper surface UF of the second part A2 of the via layer VIA may be disposed at different levels in the vertical direction rather than being disposed on the same level (or the same surface). The upper surface UF of the first part A1 of the via layer VIA may protrude in the third direction compared to the upper surface UF of the second part A2 of the via layer VIA. For example, the first part A1 of the via layer VIA may form a protrusion PRP of the via layer VIA that protrudes upward in the third direction DR3 in a sectional view.

A distance d1 between the lower surface LF and the upper surface UF in the third direction DR3 in the first part A1 of the via layer VIA (or a thickness of the first part A1 of the via layer VIA) may differ from a distance d2 between the lower surface LF and the upper surface UF in the third direction DR3 in the second part A2 of the via layer VIA (or a thickness of the second part A2 of the via layer VIA). For example, the distance d1 between the lower surface LF and the upper surface UF in the first part A1 of the via layer VIA may be greater than the distance d2 between the lower surface LF and the upper surface UF in the second part A2 of the via layer VIA. Because, in a sectional view, the first part A1 of the via layer VIA protrudes toward the display element layer DPL in the third direction DR3 compared to the second part A2 of the via layer VIA, the thickness d1 of the first part A1 may be greater than the thickness d2 of the second part A2.

The display element layer DPL may be provided and/or formed on the via layer VIA.

The display element layer DPL may include the alignment electrodes ALE, the bank patterns BNKP, the bank BNK, the light emitting elements LD, and the pixel electrodes PE. Furthermore, the display element layer DPL may include at least one or more insulating layers disposed between the foregoing components. For example, the display element layer DPL may include first, second, third, and fourth insulating layer INS1, INS2, INS3, and INS4.

The alignment electrodes ALE may be provided and/or formed on the upper surface UF of the second part A2 of the via layer VIA. The alignment electrodes ALE may be disposed on (or at) the same plane and have the same thickness with respect to the third direction DR3. The alignment electrodes ALE may be concurrently (e.g., simultaneously) formed through the same process.

The alignment electrodes ALE may be formed of material having a reflectivity (e.g., predetermined reflectivity) to allow light emitted from the light emitting elements LD to travel in an image display direction (e.g., a frontal direction) of the display device. For example, the alignment electrodes ALE may be formed of conductive material (or substance). The conductive material may include opaque metal that is suitable for reflecting, in the image display direction of the display device, light emitted from the light emitting elements LD. For example, the opaque metal may include metal such as silver (Ag), magnesium (Mg), aluminum (Al), platinum (Pt), palladium (Pd), gold (Au), nickel (Ni), neodymium (Nd), iridium (Ir), chrome (Cr), titanium (T1), and an alloy thereof. However, the material of the alignment electrodes ALE is not limited to the foregoing embodiment. In one or more embodiments, the alignment electrodes ALE may include transparent conductive material (or substance). The transparent conductive material (or substance) may include transparent conductive oxides such as indium tin oxide (ITO), indium zinc oxide (IZO), zinc oxide (ZnO), indium gallium zinc oxide (IGZO), and indium tin zinc oxide (ITZO), and a conductive polymer such as PEDOT (poly(3,4-ethylenedioxythiophene)). In case that the alignment electrodes ALE include transparent conductive material (or substance), a separate conductive layer formed of opaque metal for reflecting light emitted from the light emitting elements LD in the image display direction of the display device may be added. However, the material of the alignment electrodes ALE is not limited to the foregoing materials.

Each of the alignment electrodes ALE may be provided and/or formed to have a single-layer structure, but the present disclosure is not limited thereto. In one or more embodiments, each of the alignment electrodes ALE may be provided and/or formed in a multi-layer structure formed by stacking at least two materials from among metals, alloys, conductive oxides, and conductive polymers. Each of the alignment electrodes ALE may be formed of multiple layers including at least two layers to reduce or minimize distortion resulting from a signal delay when signals (or voltages) are transmitted to the opposite ends EP1 and EP2 of the respective light emitting elements LD. For example, each of the alignment electrodes ALE may have a multi-layer structure that selectively further includes at least one from among at least one reflective electrode layer, at least one transparent electrode layer disposed over and/or under the reflective electrode layer, and/or at least one conductive capping layer configured to cover an upper portion of the transparent electrode layer.

As described above, in case that the alignment electrodes ALE are formed of conductive material having a constant reflectivity, light emitted from the opposite ends of each of the light emitting elements LD, i.e., the first and second ends EP1 and EP2, may more reliably travel in the image display direction of the display device.

The first alignment electrode ALE1 may be electrically connected with the first transistor T1 of the pixel circuit layer PCL through the first contactor CNT1. The second alignment electrode ALE2 may be electrically connected with the second power line PL2 of the pixel circuit layer PCL through the second contactor CNT2.

In one or more embodiments, the first alignment electrode ALE1 and the second alignment electrode ALE2 may be provided and/or formed on only the upper surface UF of the second part A2 of the via layer VIA and overlap the second part A2. The first alignment electrode ALE1 and the second alignment electrode ALE2 may not be provided on the upper surface UF of the first part A1 of the via layer VIA and may not overlap the first part A1.

Each of the first and second alignment electrodes ALE1 and ALE2 may include a first surface SF1 and a second surface SF2 that are opposite to each other in the third direction DR3. The first surface SF1 may be a lower surface of the corresponding alignment electrode ALE that contacts the upper surface UF of the second part A2 of the via layer VIA. The second surface SF2 may be an upper surface of the corresponding alignment electrode ALE that contacts the first insulating layer INS1.

The first alignment electrode ALE1 and the second alignment electrode ALE2 each may be designed such that the second surface SF2 thereof is disposed on (or at) the same level as that of the upper surface UF of the first part A1 of the via layer VIA through a planarization process in a fabrication operation. Hence, the second surface SF2 of each of the first and second alignment electrodes ALE1 and ALE2 may be disposed on (or at) the same level as that of the upper surface UF of the first part A1 of the via layer VIA. For example, the second surface SF2 of each of the first and second alignment electrodes ALE1 and ALE2 may be disposed on (or at) the same level (or the same surface) as that of the upper surface UF of the first part A1 of the via layer VIA in a direction (e.g., a horizontal direction) intersecting the third direction DR3. Here, the planarization process may include a chemical mechanical planarization process.

In a sectional view, the first alignment electrode ALE1 and the second alignment electrode ALE2 may be spaced from each other with the first part A1 of the via layer VIA interposed therebetween. In a sectional view, a sidewall of the first alignment electrode ALE1 may contact (or meet) one sidewall of the first part A1 of the via layer VIA, and a sidewall of the second alignment electrode ALE2 may contact (or meet) another sidewall of the first part A1 of the via layer VIA.

Because the first alignment electrode ALE1 and the second alignment electrode ALE2 are formed through the foregoing planarization process, each of the first and second alignment electrodes ALE1 and ALE2 may be disposed on (or at) the same level as that of the upper surface UF of the first part A1 of the via layer VIA and have a planar surface (or the planar second surface SF2).

In one or more embodiments, the first part A1 of the via layer VIA may be disposed in an area between the first alignment electrode ALE1 and the second alignment electrode ALE2 and may be in close contact with the first and second alignment electrodes ALE1 and ALE2 without space therebetween, so that a step difference may not be formed in the area between the first alignment electrode ALE1 and the second alignment electrode ALE2.

The first insulating layer INS1 may be provided and/or formed on the alignment electrodes ALE and the via layer VIA.

The first insulating layer INS1 may be provided and/or formed on the overall surfaces of the alignment electrodes ALE and the via layer VIA. The first insulating layer INS1 may be partially open in at least the non-emission area NEMA so that components disposed thereunder can be exposed. For example, as illustrated in FIG. 12, the first insulating layer INS1 may be partially open to include a first contact hole CH1 that is formed by removing one area of the first insulating layer INS1 in at least the non-emission area NEMA and exposes a portion of the first alignment electrode ALE1, and a second contact hole CH2 that is formed by removing another area of the first insulating layer INS1 in at least the non-emission area NEMA and exposes a portion of the second alignment electrode ALE2. Here, the at least non-emission area NEMA may be the second opening OP2 of the bank BNK that is an electrode separation area, but the present disclosure is not limited thereto.

The first insulating layer INS1 may be formed of an inorganic insulating layer including inorganic material. For example, the first insulating layer INS1 may be formed of an inorganic insulating layer suitable for protecting the light emitting elements LD from the pixel circuit layer PCL. For instance, the first insulating layer INS1 may include at least one of metal oxides such as silicon nitride ($SiN_x$), silicon oxide ($SiO_x$), silicon oxynitride ($SiO_xN_y$), and aluminum oxide ($AlO_x$).

In one or more embodiments, the first insulating layer INS1 may be provided to have a single-layer or multi-layer structure. In case that the first insulating layer INS1 has a multi-layer structure, the first insulating layer INS1 may have a distributed bragg reflector (DBR) structure formed by alternately stacking first layers and second layers that are formed of inorganic layers and have different refractive indexes.

The first insulating layer INS1 formed of an inorganic insulating layer may have a profile (or a surface) corresponding to profiles of the components disposed thereunder. The first insulating layer INS1 may have, in at least the emission area EMA, a planar profile (or a planar surface) due to the components disposed thereunder, e.g., the first and second alignment electrodes ALE1 and ALE2 and the first part A1 of the via layer VIA.

The bank BNK and the bank pattern BNKP may be provided and/or formed on the first insulating layer INS1.

The bank BNK may be provided and/or formed on the first insulating layer INS1 in at least the non-emission area NEMA. The bank BNK may enclose the emission area EMA of the pixel PXL and may be formed between adjacent pixels PXL so that a pixel defining layer for defining the emission area EMA of each pixel PXL may be formed. At the step of supplying (or inputting) the light emitting elements LD to the pixel area PXA, the bank BNK may be a dam structure configured to prevent a solution (or ink) mixed with the light emitting elements LD from being drawn into the emission area EMA of an adjacent pixel PXL or control the amount of solution such that an appropriate amount of solution is supplied to each emission area EMA.

The bank pattern BNKP may be provided and/or formed on the first insulating layer INS1 on the corresponding alignment electrode ALE in at least the emission area EMA. The bank patterns BNKP may include a first bank pattern BNKP1 and a second bank pattern BNKP2. The first bank pattern BNKP1 may be provided and/or formed on the first insulating layer INS1 and correspond to the first alignment electrode ALE1. The second bank pattern BNKP2 may be provided and/or formed on the first insulating layer INS1 and correspond to the second alignment electrode ALE2.

The bank patterns BNKP may protrude in the third direction DR3 on one surface (e.g., an upper surface) of the first insulating layer INS1. The bank patterns BNKP each may be an inorganic insulating layer including inorganic material or an organic insulating layer including organic material. The bank patterns BNKP each may include an organic layer having a single-layer structure and/or an inorganic layer having a single-layer structure, but the present disclosure is not limited thereto. In one or more embodiments, the bank patterns BNKP may be provided in a multi-layer structure formed by stacking at least one organic insulating layer and at least one inorganic insulating layer. However, the material of the bank patterns BNKP is not limited to the foregoing embodiment. In one or more embodiments, the bank patterns BNKP may include conductive material (or conductive substance).

The bank patterns BNKP may have a trapezoidal cross-section that is reduced in width from one surface of the first insulating layer INS1 upward in the third direction DR3, but the present disclosure is not limited thereto. In one or more embodiments, the bank pattern BNKP may include a curved surface having a cross-sectional shape such as a semi-elliptical shape or a semi-circular shape that is reduced in width from one surface of the first insulating layer INS1 upward in the third direction DR3. In a sectional view, the shape of the bank patterns BNKP is not limited to the foregoing examples, and may be changed in various ways within a range in which the efficiency of light emitted from each of the light emitting elements LD can be enhanced. Furthermore, in one or more embodiments, at least one of the bank patterns BNKP may be omitted, or the position thereof may be changed.

The bank BNK and the bank patterns BNKP may be provided on (or at) the same layer through the same process, but the present disclosure is not limited thereto. In one or more embodiments, the bank pattern BNKP may be provided on (or at) the same layer as that of the bank BNK and formed through a process different from that of the bank BNK.

The light emitting elements LD may be supplied to and aligned in the emission area EMA of the pixel PXL in which the first insulating layer INS1, the bank BNK, and the bank patterns BNKP are formed. For example, the light emitting elements LD may be supplied (or input) to the emission area EMA through an inkjet printing scheme or the like. The light emitting elements LD may be aligned between the alignment electrodes ALE by an electric field formed by a suitable signal (e.g., a set or predetermined signal, such as, an alignment signal) applied to each of the alignment electrodes ALE. For example, the light emitting elements LD may be aligned on the planar surface of the first insulating layer INS1 between the first bank pattern BNKP1 on the first alignment electrode ALE1 and the second bank pattern BNKP2 on the second alignment electrode ALE2.

In the emission area EMA, the second insulating layer (or insulating pattern) INS2 or may be provided and/or formed on the light emitting elements LD. The second insulating layer INS2 may be provided and/or formed on the light emitting elements LD to partially cover the outer surface (e.g., the outer peripheral or circumferential surface or the surface) of each of the light emitting elements LD such that the first end EP1 and the second end EP2 of each of the light emitting element LD are exposed to the outside.

The second insulating layer INS2 may include an inorganic insulating layer including inorganic material, or an organic insulating layer. For example, the second insulating layer INS2 may include an inorganic insulating layer suitable for protecting the active layer 12 of each of the light emitting elements LD from external oxygen, water, etc. However, the present disclosure is not limited thereto. The second insulating layer INS2 may be formed of an organic insulating layer including organic material, depending on design conditions, etc. of the display device to which the light emitting elements LD are applied. The second insulating layer INS2 may be formed of a single layer or multiple layers.

Because the second insulating layer INS2 is formed on the light emitting elements LD that have been completely aligned in the pixel area PXA (or the emission area EMA) of the pixel PXL, the light emitting elements LD may be prevented from being removed from the aligned positions.

The pixel electrodes PE may be disposed, in at least the emission area EMA, on the light emitting elements LD, the second insulating layer INS2 provided on the light emitting elements LD, the bank patterns BNKP, and the first insulating layer INS1.

In at least the emission area EMA, the first pixel electrode PE1 may be disposed on the first end EP1 of the light emitting element LD, the second insulating layer INS2 provided on the light emitting element LD, the first bank pattern BNKP1, and the first insulating layer INS1. The first pixel electrode PE1 may be brought into direct contact with and electrically connected to the first alignment electrode ALE1 through the first contact hole CH1.

In at least the emission area EMA, the second pixel electrode PE2 may be disposed on the second end EP2 of the light emitting element LD, the second insulating layer INS2 provided on the light emitting element LD, the second bank pattern BNKP2, and the first insulating layer INS1. The second pixel electrode PE2 may be brought into direct contact with and electrically connected to the second alignment electrode ALE2 through the second contact hole CH2.

The first pixel electrode PE1 and the second pixel electrode PE2 may be disposed on the second insulating layer INS2 on the light emitting elements LD and spaced from each other.

The first pixel electrode PE1 and the second pixel electrode PE2 may be formed of various transparent conductive materials to allow light emitted from each of the light emitting elements LD to travel in the image display direction (e.g., in the third direction DR3) of the display device without optical loss. For example, the first pixel electrode PE1 and the second pixel electrode PE2 may include at least one of various transparent conductive materials including indium tin oxide (ITO), indium zinc oxide (IZO), zinc oxide ($ZnO_x$), indium gallium zinc oxide (IGZO), and indium tin zinc oxide (ITZO), and may be substantially transparent or translucent to satisfy a suitable transmittancy or transmittance (e.g., a predetermined transmittancy or transmittance). The materials of the first pixel electrode PE1 and the second pixel electrode PE2 are not limited to those of the foregoing embodiments. In one or more embodiments, the first pixel electrode PE1 and the second pixel electrode PE2 may also be formed of various opaque conductive materials (e.g., substances). The first pixel electrode PE1 and the second pixel electrode PE2 each may be formed of a single layer or multiple layers.

In one or more embodiments, the first pixel electrode PE1 and the second pixel electrode PE2 may be formed through different processes and may be provided on different layers. In this case, the third insulating layer INS3 may be provided and/or formed between the first pixel electrode PE1 and the second pixel electrode PE2. The third insulating layer INS3 may be provided on the first pixel electrode PE1 and cover the first pixel electrode PE1 (or prevent the first pixel electrode PE1 from being exposed to the outside), thus preventing corrosion or the like of the first pixel electrode PE1 from being caused. The third insulating layer INS3 may be formed of an inorganic insulating layer including inorganic material, or an organic insulating layer including organic material. For example, the third insulating layer INS3 may include at least one of silicon nitride ($SiN_x$), silicon oxide ($SiO_x$), silicon oxynitride ($SiO_xN_y$), and metal oxide such as aluminum oxide ($AlO_x$), but the present disclosure is not limited thereto. The third insulating layer INS3 may have a single layer or multiple layers.

The third insulating layer INS3 may be selectively provided. For example, as illustrated in FIG. 9, in case that the first pixel electrode PE1 and the second pixel electrode PE2 are formed through the same process and provided on (or at) the same layer, the third insulating layer INS3 may be omitted. In other words, in case that the first pixel electrode PE1 and the second pixel electrode PE2 are formed through the same process and disposed on the second insulating layer INS2 at positions spaced from each other, the third insulating layer INS3 configured to cover the first pixel electrode PE1 may be omitted, and the fourth insulating layer INS4 may be disposed on the first and second pixel electrodes PE1 and PE2 to cover the first and second pixel electrodes PE1 and PE2.

The fourth insulating layer INS4 may be provided and/or formed on the first pixel electrode PE1 and the second pixel electrode PE2. The fourth insulating layer INS4 may be an inorganic layer (an inorganic insulating layer) including inorganic material or an organic layer (an organic insulating layer) including organic material.

For example, the fourth insulating layer INS4 may have a structure formed by alternately stacking at least one inorganic layer and at least one organic layer. The fourth insulating layer INS4 may cover the entirety of the display element layer DPL and prevent water or moisture from being drawn into the display element layer DPL including the light emitting elements LD from the outside.

In one or more embodiments, the display element layer DPL may further include the color conversion layer CCL, the capping layer CPL, the color filter CF, a light block pattern LBP, a base layer BSL.

The color conversion layer CCL may be provided and/or formed on the fourth insulating layer INS4 in at least the emission area EMA.

The color conversion layer CCL may be disposed on the fourth insulating layer INS4 in the emission area EMA of the pixel PXL that is enclosed by the bank BNK.

The color conversion layer CCL may include color conversion particles QD corresponding to a specific color. For example, the color conversion layer CCL may include color conversion particles QD that convert a first color of light emitted from the light emitting elements LD to a second color (or a specific or desired color) of light. In case that the pixel PXL is a red pixel (or a red sub-pixel), the color conversion layer CCL of the corresponding pixel PXL may include color conversion particles QD formed of red quantum dots that convert a first color of light emitted from the light emitting elements LD to a second color of light, e.g., red light. In case that the pixel PXL is a green pixel (or a green sub-pixel), the color conversion layer CCL of the corresponding pixel PXL may include color conversion particles QD formed of green quantum dots that convert a first color of light emitted from the light emitting elements LD to a second color of light, e.g., green light. In case that the pixel PXL is a blue pixel (or a blue sub-pixel), the color conversion layer CCL of the corresponding pixel PXL may include color conversion particles QD formed of blue quantum dots that convert a first color of light emitted from the light emitting elements LD to a second color of light, e.g., blue light. In one or more embodiments, in case that the pixel PXL is a blue pixel (or a blue sub-pixel), there may be provided a light scattering layer having light scattering particles SCT, in place of the color conversion layer CCL having the color conversion particles QD. For example, in case that the light emitting elements LD emit blue-based light, the pixel PXL may include a light scattering layer including light scattering particles SCT. The light scattering layer may be omitted depending on embodiments. In one or more embodiments, in case that the pixel PXL is a blue pixel (or a blue sub-pixel), there may be provided a transparent polymer, in place of the color conversion layer CCL.

Although, in the foregoing embodiment, the bank BNK disposed on the first insulating layer INS1 has been described as being a structure that defines a position at which the color conversion layer CCL is to be supplied, and ultimately defines the emission area EMA in each pixel PXL, the present disclosure is not limited thereto. In one or more embodiments, as illustrated in FIG. 7, the second bank BNK2 may be a structure that ultimately defines the emission area EMA to which the color conversion layer CCL is to be supplied.

The second bank BNK2 may be provided and/or formed on the fourth insulating layer INS4 on the first bank BNK1 in at least the non-emission area NEMA. Here, the first bank BNK1 may be a component corresponding to the bank BNK illustrated in FIG. 6. The second bank BNK2 along with the first bank BNK1 may embody a dam structure DAM (or a dam component). The dam structure DAM may be a structure that ultimately defines, in the pixel PXL, the emission area EMA from which light is to be emitted. In one or more embodiments, the dam structure DAM may be a structure that defines a supply (or insert) position of the color conversion layer CCL during a process of supplying the color conversion layer CCL to the pixel area PXA, thus ultimately setting, in the pixel area PXA, the emission area EMA from which light is emitted.

The second bank BNK2 may include light block material. For example, the second bank BNK2 may be a black matrix. In one or more embodiments, the second bank BNK2 may include at least one light block material and/or reflective material, and allow light emitted from the light emitting elements LD to more reliably travel in the image display direction (or the third direction DR3) of the display device, thus enhancing the light output efficiency of the light emitting elements LD.

The capping layer CPL may be provided and/or formed on the color conversion layer CCL and the fourth insulating layer INS4. In one or more embodiments in which the second bank BNK2 is provided, the capping layer CPL may be provided and/or formed on the color conversion layer CCL and the second bank BNK2.

The capping layer CPL may be provided on the overall surface (or the entirety) of the pixel area PXA and may be directly disposed on the fourth insulating layer INS4 (or the second bank BNK2) and the color conversion layer CCL. The capping layer CPL may be an inorganic layer (or an inorganic insulating layer) including inorganic material. The capping layer CPL may include at least one of silicon nitride ($SiN_x$), silicon oxide ($SiO_x$), silicon oxynitride ($SiO_xN_y$), and metal oxide such as aluminum oxide ($AlO_x$). The capping layer CPL may be disposed on the color conversion layer CCL in at least the emission area EMA and cover the color conversion layer CCL, thus protecting the color conversion layer CCL.

The capping layer CPL may mitigate a step difference formed by components disposed thereunder and have a planar surface. For example, the capping layer CPL may include an organic layer including organic material. The capping layer CPL may be a common layer provided in common in the display area DA including the pixel areas PXA, but the present disclosure is not limited thereto.

The color filter CF and the light block pattern LBP may be provided and/or formed on the capping layer CPL.

The color filter CF may allow light having specific color (e.g., light having a desired color) to selectively pass therethrough. The color filter CF along with the color conversion layer CCL may form the light conversion pattern LCP, and include color filter material that allows a specific color of light converted by the color conversion layer CCL to selectively pass therethrough. The color filter CF may include a red color filter, a green color filter, and a blue color filter. The color filter CF may be provided on one surface of the capping layer CPL and correspond to the color conversion layer CCL.

The light conversion pattern LCP including the color conversion layer CCL and the color filter CF may correspond to the emission area EMA of the pixel PXL.

The light block pattern LBP may be disposed on one surface of the capping layer CPL at a position adjacent to the color filter CF. For example, the light block pattern LBP may be disposed on one surface of the capping layer CPL and correspond to the non-emission area NEMA. The light block pattern LBP may correspond to the dam structure DAM. The light block pattern LBP may include light block material for preventing light leakage failure in which light (or rays) leaks between the pixel PXL and pixels PXL adjacent thereto. For example, the light block pattern LBP may include a black matrix. The light block pattern LBP may prevent different colors of light emitted from respective adjacent pixels PXL from being mixed.

The light block pattern LBP may have a multi-layer structure in which two or more color filters allowing different colors of light to selectively pass therethrough overlap each other. For example, as illustrated in FIG. 10, the light block pattern LBP may include a first color filter CF1 disposed on the capping layer CPL of the non-emission area NEMA, a second color filter CF2 disposed on the first color filter CF1 and overlapping the first color filter CF1 in the third direction DR3 in the non-emission area NEMA, and a third color filter CF3 disposed on the second color filter CF2 and overlapping the second color filter CF2. In this case, the first color filter CF1 may be provided and/or formed on the capping layer CPL of the emission area EMA. The first color filter CF1 may have the same configuration as that of the color filter CF of FIGS. 6 to 9.

The first, second, and third color filters CF1, CF2, and CF3 that overlap each other on the capping layer CPL of the non-emission area NEMA allow different colors of light to selectively pass therethrough. For example, the first color filter CF1 may be a red color filter configured to allow red light to selectively pass therethrough. The second color filter CF2 may be a green color filter configured to allow green light to selectively pass therethrough. The third color filter CF3 may be a blue color filter configured to allow blue light to selectively pass therethrough. In other words, in one or more embodiments, the light block pattern LBP may be provided in the form of a structure formed by successively stacking the red color filter, the green color filter, and the blue color filter. In this case, in the non-emission area NEMA of the pixel area PXA, the first color filter CF1, the second color filter CF2, and the third color filter CF3 may be used as the light block pattern LBP for blocking transmission of light.

The base layer BSL may be provided and/or formed on the light block pattern LBP and the color filter CF.

The base layer BSL may be formed of an inorganic layer (or an inorganic insulating layer) including inorganic material, or an organic layer (or an organic insulating layer)

including organic material. The base layer BSL may cover the entirety of components disposed thereunder and prevent water, moisture, or the like from being drawn into the light emitting elements LD and the light conversion pattern LCP from the outside.

In the display device (or the pixel PXL) in accordance with the foregoing embodiment, the light conversion pattern LCP may be disposed on the light emitting element LD so that light having excellent color reproducibility can be emitted through the light conversion pattern LCP, whereby the light output efficiency of the display device can be enhanced.

Although in the foregoing embodiment the color conversion layer CCL has been described as being directly formed on the fourth insulating layer INS4, the present disclosure is not limited thereto. In one or more embodiments, as illustrated in FIG. 11, the color conversion layer CCL may be formed on one surface of the upper substrate including a cover layer CVL and electrically connected to the fourth insulating layer INS4 by the intermediate layer CTL.

The intermediate layer CTL may be a transparent adhesive layer (or a transparent bonding layer), e.g., an optically clear adhesive layer, for enhancing the adhesive force between the fourth insulating layer INS4 and the upper substrate, but the present disclosure is not limited thereto. In one or more embodiments, the intermediate layer CTL may be a refractive index conversion layer configured to change the refractive index of light emitted from the light emitting elements LD toward the upper substrate and enhance emission luminance of each pixel PXL.

The upper substrate may form a window component and/or an encapsulation substrate of the display device. The upper substrate may include the cover layer CVL (or referred to as a base substrate), the light conversion pattern LCP, the light block pattern LBP, and first and second capping layers CPL1 and CPL2.

The cover layer CVL may be a rigid or flexible substrate, and the material or properties thereof are not particularly limited. The cover layer CVL may be formed of the same material as that of the substrate SUB, or may be formed of material different from that of the substrate SUB.

Referring to FIG. 11, the light conversion pattern LCP may be disposed on one surface of the cover layer CVL and face (or oppose) the light emitting elements LD and the pixel electrodes PE. The light conversion pattern LCP may include a color conversion layer CCL and a color filter CF. The color filter CF may be provided on one surface of the cover layer CVL and correspond to the color conversion layer CCL.

The first capping layer CPL1 may be provided and/or formed between the color filter CF and the color conversion layer CCL.

The first capping layer CPL1 may be disposed on the color filter CF and cover the color filter CF, thus protecting the color filter CF. The first capping layer CPL1 may be an inorganic layer including inorganic material or an organic layer including organic material.

The light block pattern LBP may be disposed adjacent to the light conversion pattern LCP. The light block pattern LBP may be disposed on one surface of the cover layer CVL and correspond to the non-emission area NEMA of the pixel PXL. The light block pattern LBP may include a first light block pattern LBP1 and a second light block pattern LBP2.

The first light block pattern LBP1 may be disposed on one surface of the cover layer CVL and disposed adjacent to the color filter CF. The first light block pattern LBP1 may have the same configuration as that of the light block pattern LBP described with reference to FIG. 8.

The first capping layer CPL1 may be provided and/or formed on the first light block pattern LBP1.

The second light block pattern LBP2 may be provided and/or formed on one surface of the first capping layer CPL1 and correspond to the first light block pattern LBP1. The second block pattern LBP2 may be a black matrix. The first light block pattern LBP1 and the second light block pattern LBP2 may include the same material. In one or more embodiments, the second light block pattern LBP2 may be a structure for ultimately defining the emission area EMA of the pixel PXL. At the step of supplying the color conversion layer CCL, the second light block pattern LBP2 may be a dam structure that ultimately defines the emission area EMA to which the color conversion layer CCL is to be supplied.

The second capping layer CPL2 may be provided and/or formed on overall surfaces of the color conversion layer CCL and the second light block pattern LBP2.

The second capping layer CPL2 may include at least one of silicon nitride ($SiN_x$), silicon oxide ($SiO_x$), silicon oxynitride ($SiO_xN_y$), and metal oxide such as aluminum oxide ($AlO_x$), but the present disclosure is not limited thereto. In one or more embodiments, the second capping layer CPL2 may be formed of an organic layer (or an organic insulating layer) including organic material. The second capping layer CPL2 may be disposed on the color conversion layer CCL and protect the color conversion layer CCL from external water or moisture so that the reliability of the color conversion layer CCL can be enhanced.

The upper substrate may be disposed on the intermediate layer CTL and electrically connected with the fourth insulating layer INS4.

According to the foregoing embodiment, the first alignment electrode ALE1 and the second alignment electrode ALE2 may be respectively disposed on one side and the other side of the first part A1 of the via VIA that is formed of the protrusion PRP. Furthermore, the upper surface UF of the first part A1, the second surface SF2 of the first alignment electrode ALE1, and the second surface SF2 of the second alignment electrode ALE2 may be disposed on (or at) the same level. Thus, the first insulating layer INS1 that is disposed on the via layer VIA and the alignment electrodes ALE may have a planar surface. Hence, in at least the emission area EMA, a void may be prevented from being formed by a step difference between the alignment electrodes ALE, so that a contact failure between the pixel electrodes PE and the light emitting elements LD can be mitigated or prevented from occurring. Therefore, there can be provided a pixel PXL having improved reliability and a display device including the pixel PXL.

In addition, according to the foregoing embodiment, because the light emitting elements LD are aligned on the first insulating layer INS1 having a planar surface, the light emitting elements may be aligned in only a target area (e.g., an area between the first bank pattern BNKP1 on the first alignment electrode ALE1 and the second bank pattern BNKP2 on the second alignment electrode ALE2), so that an abnormal misalignment in which light emitting elements LD are aligned in a undesired area (e.g., a void formed by a step difference between the alignment electrodes ALE) may be prevented from being caused.

Furthermore, because the second surface SF2 of the first alignment electrode ALE1, the upper surface UF of the first part A1 of the via layer VIA, and the second surface SF2 of the second alignment electrode ALE2 form a planar surface, the first insulating layer INS1 disposed thereon may also have a planar surface. Accordingly, a crack may be prevented from being caused by a stepped portion of the first insulating layer INS1.

Figure 13A:
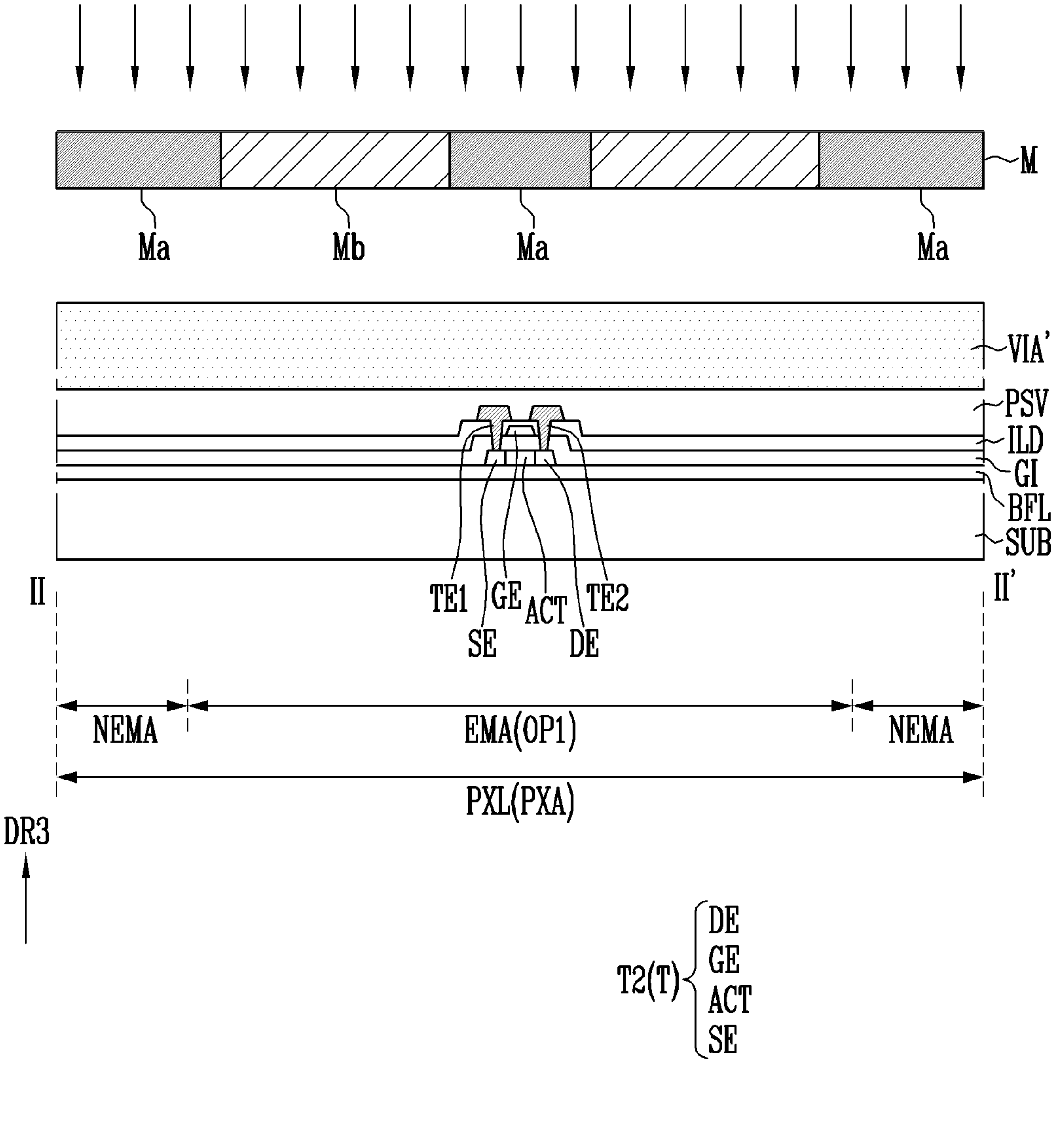
FIGS. 13A to 13N are cross-sectional views schematically illustrating a method of fabricating the pixel PXL illustrated in FIG. 8.
Figure 13B:
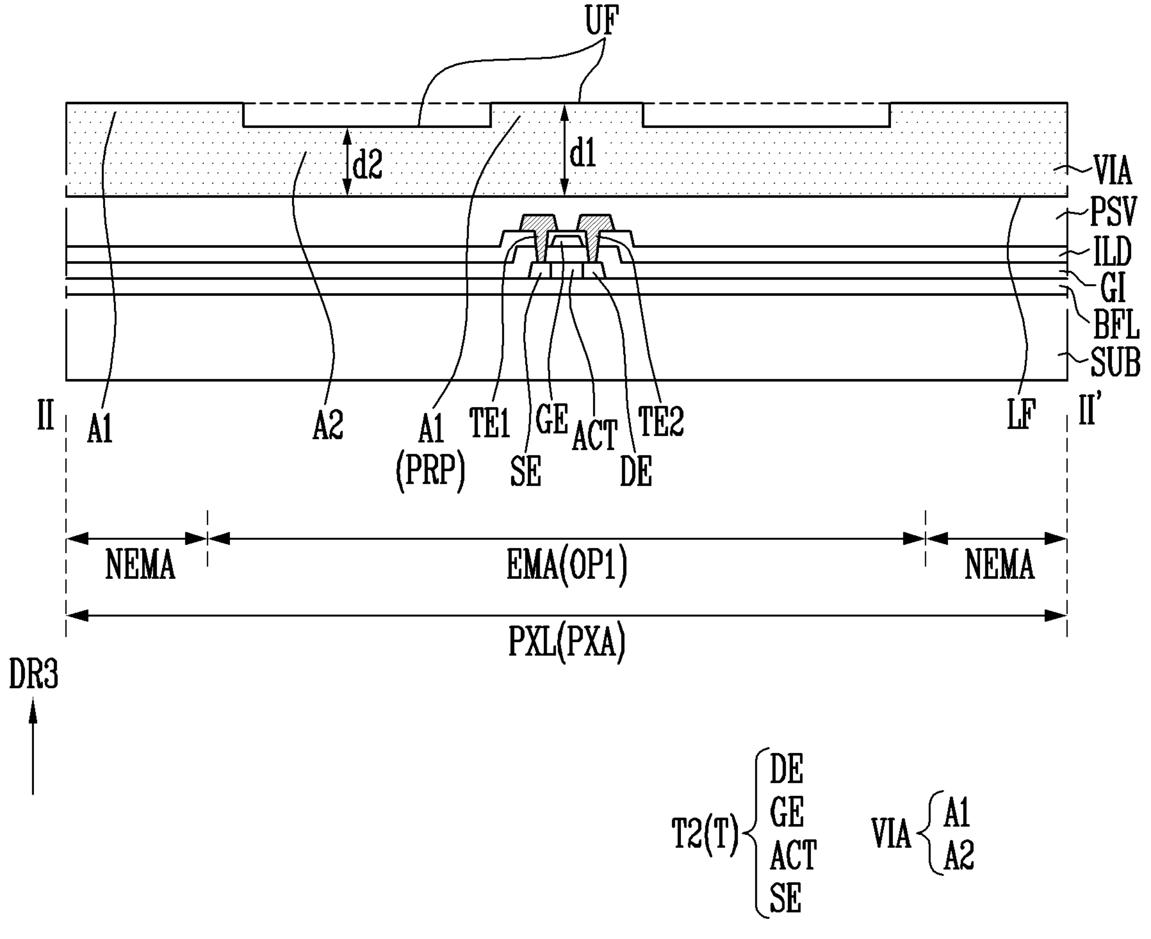
Figure 13C:
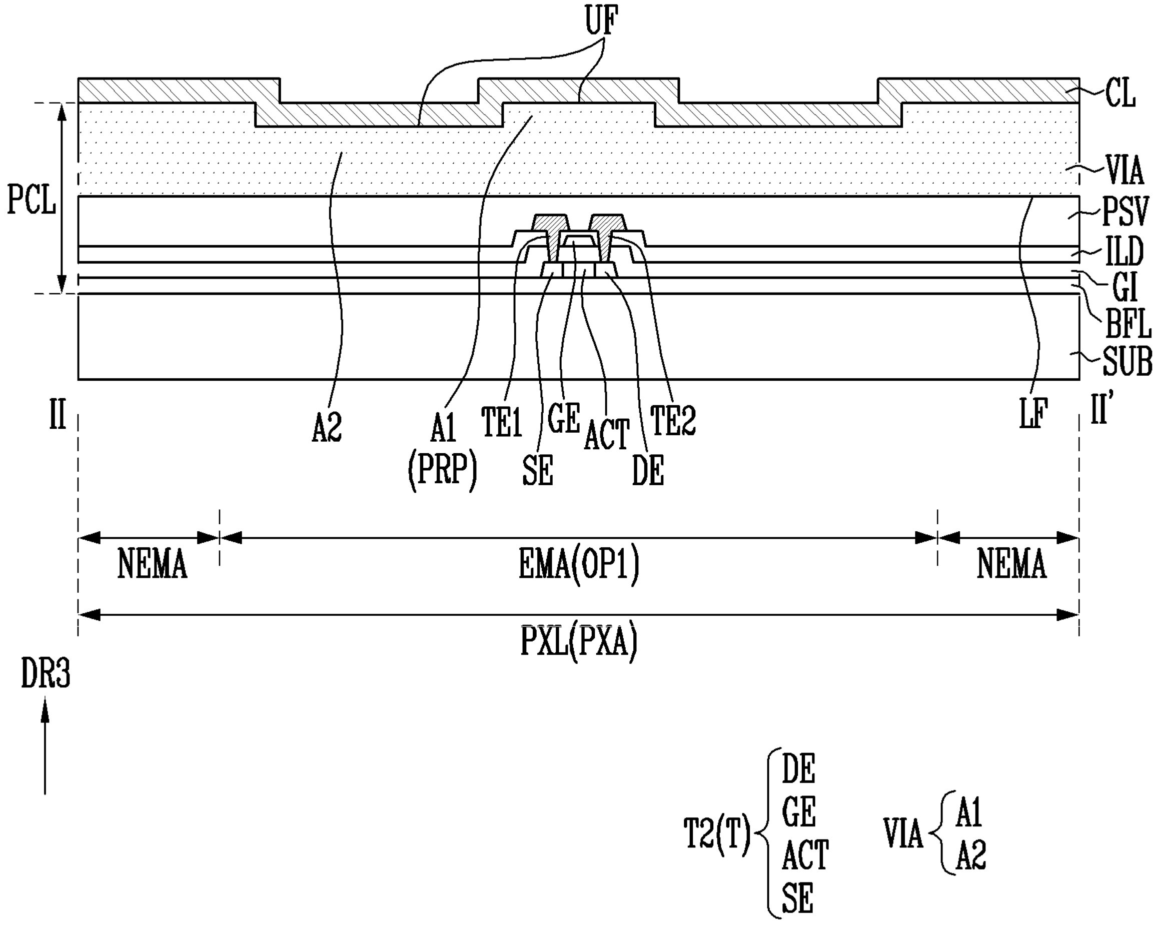
Figure 13D:
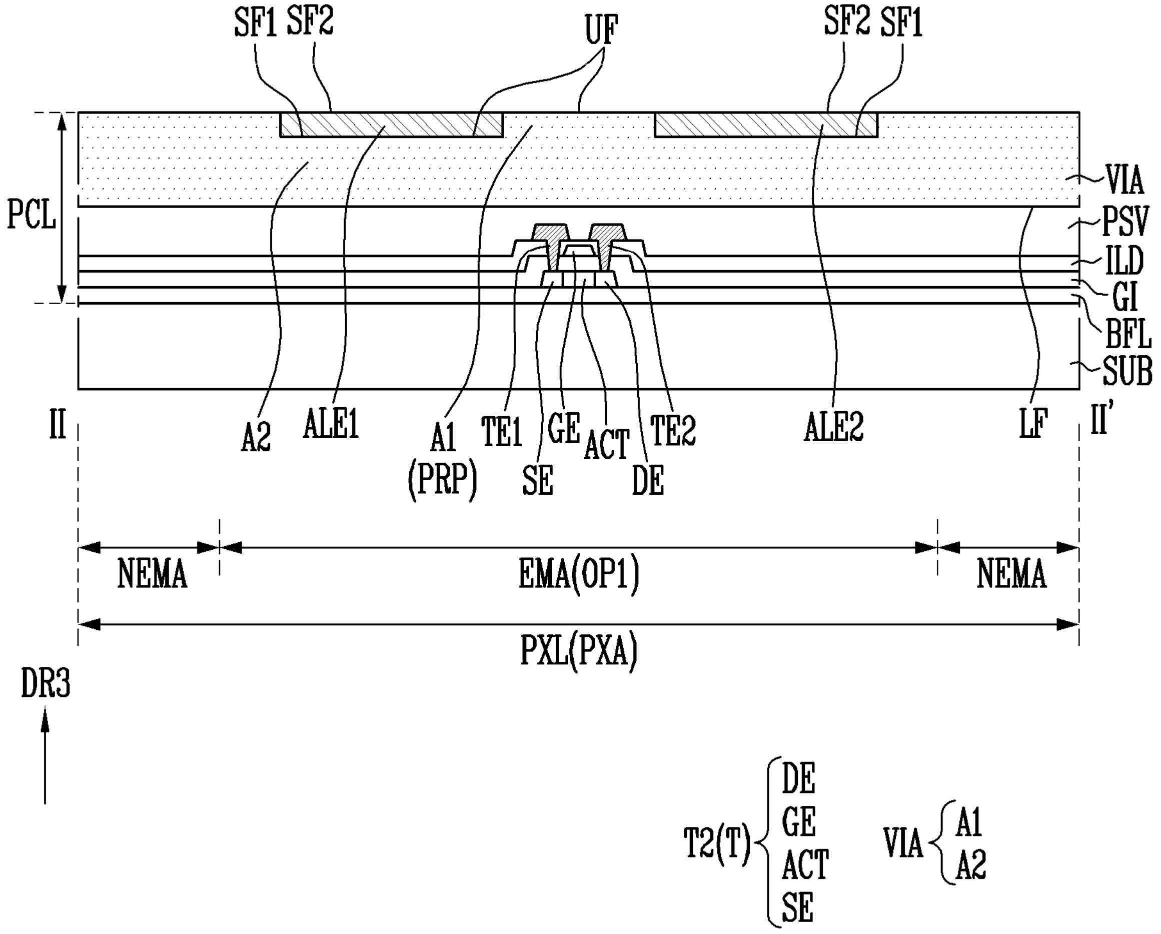
Figure 13E:
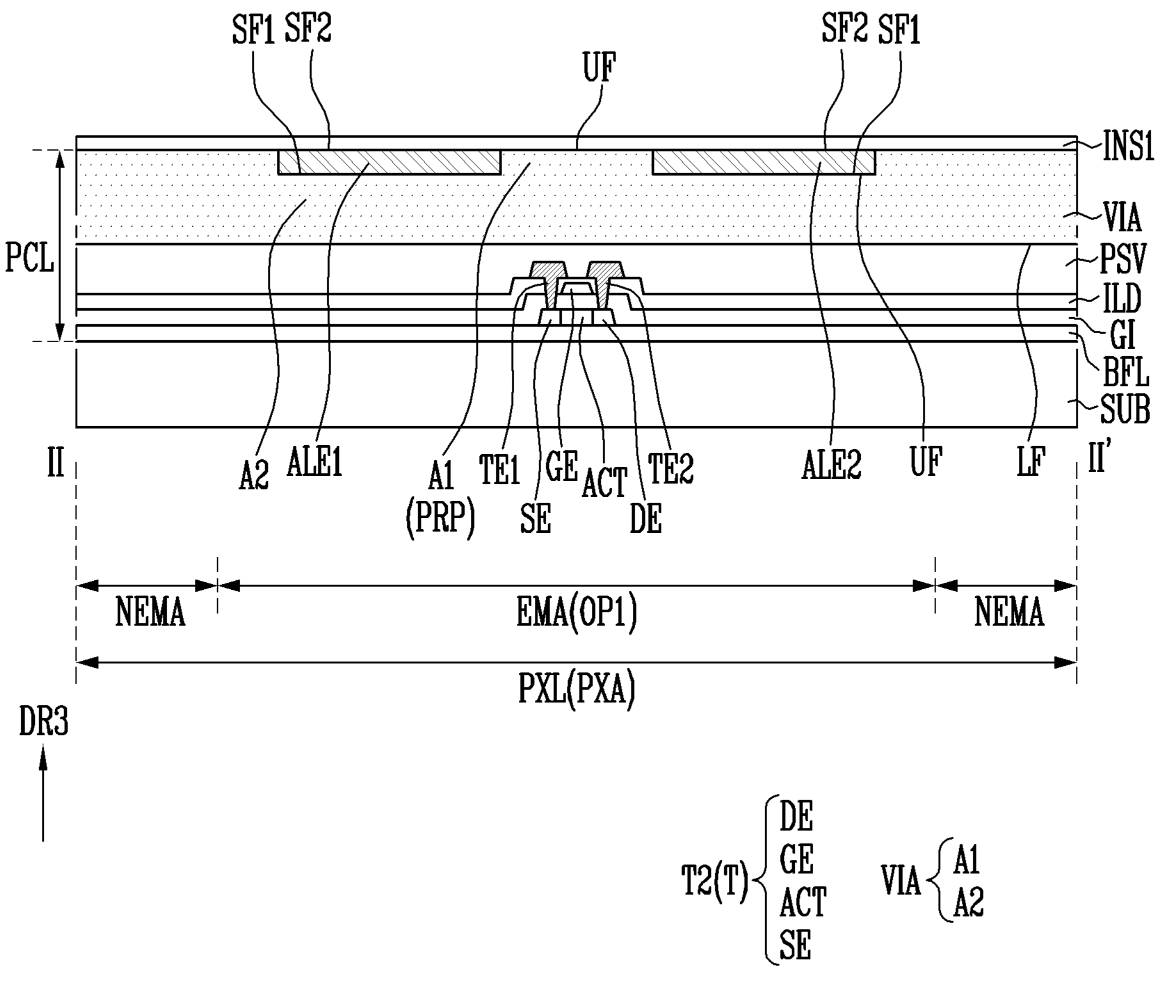
Figure 13F:
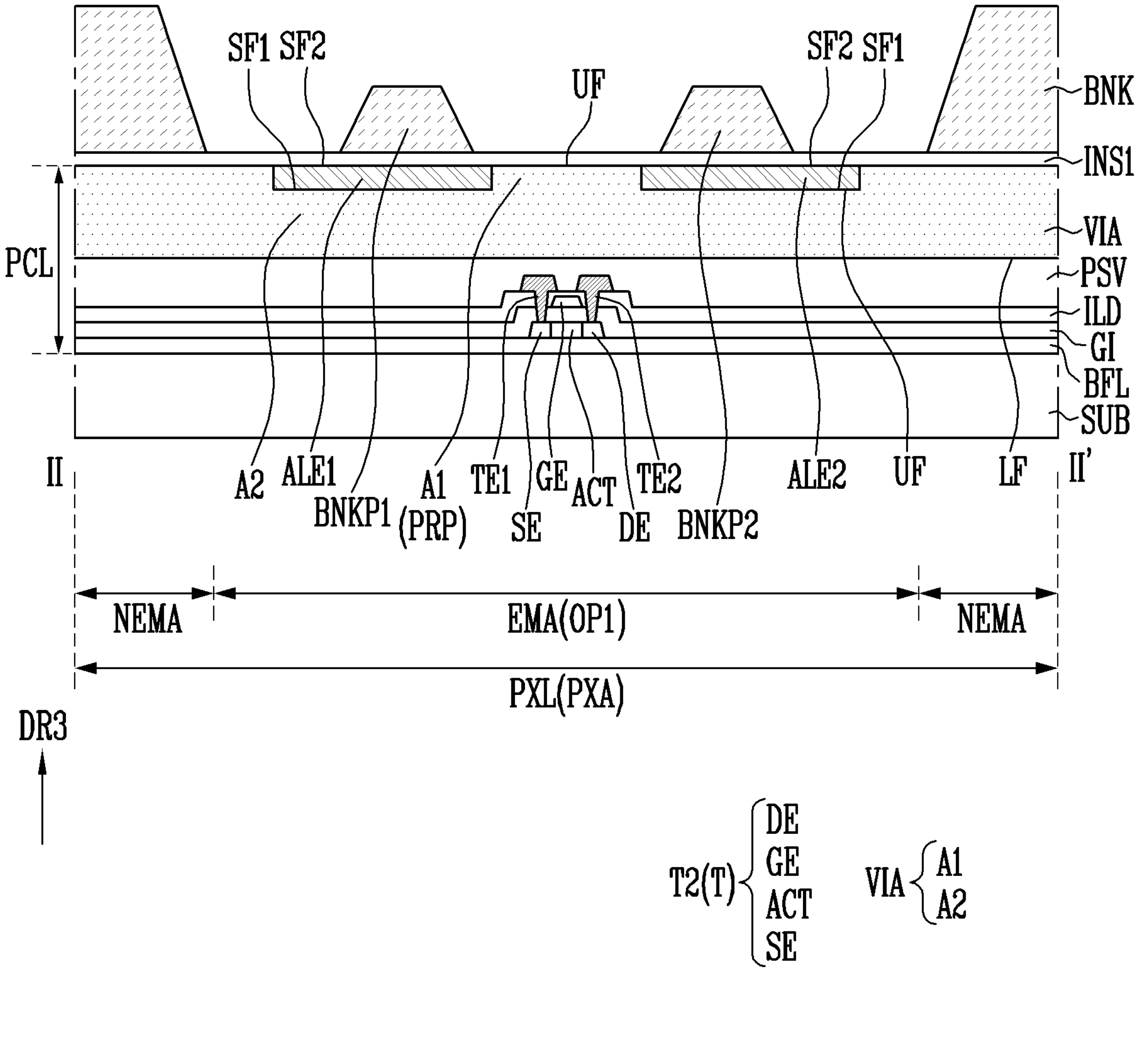
Figure 13G:
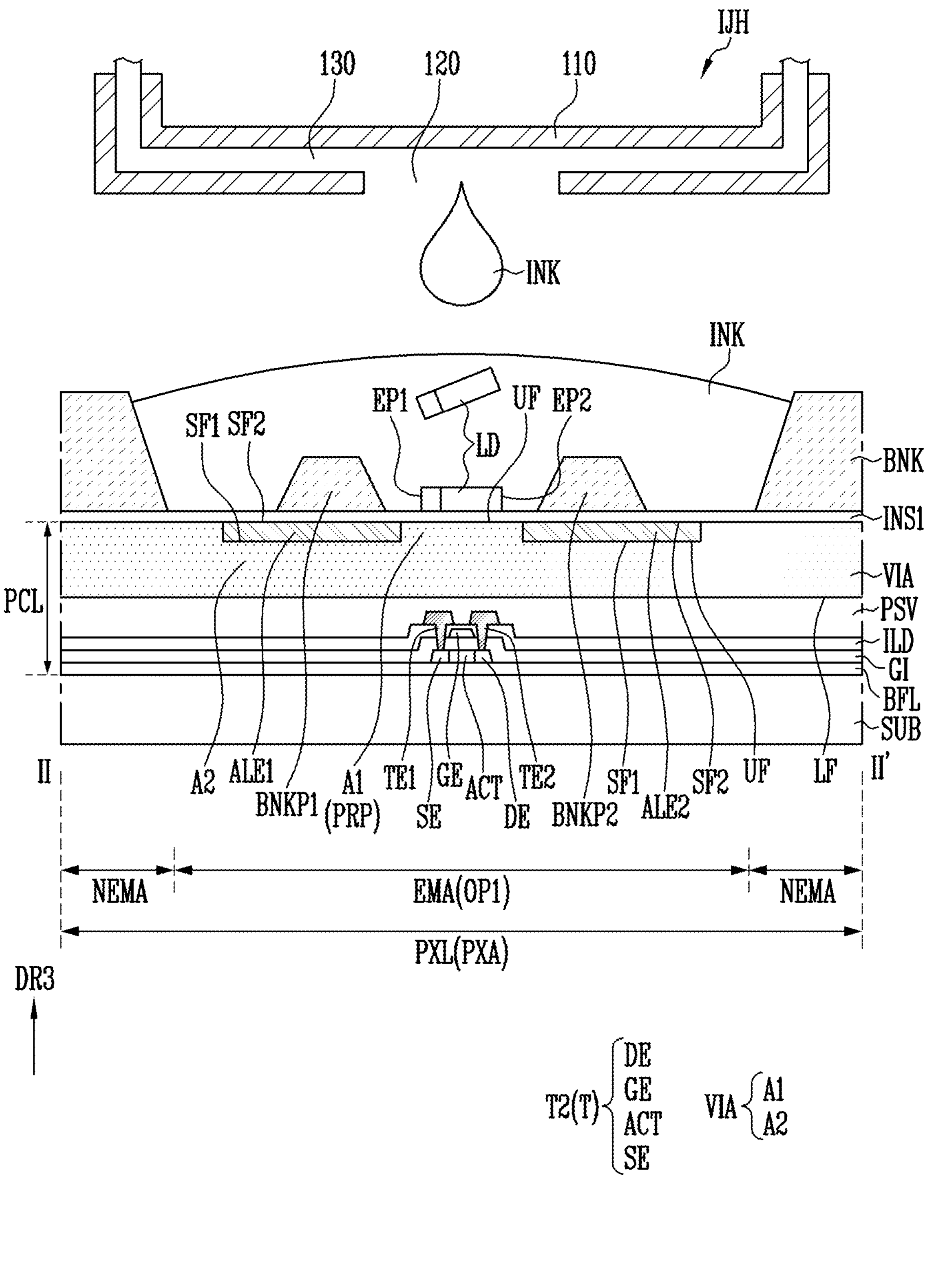
Figure 13H:
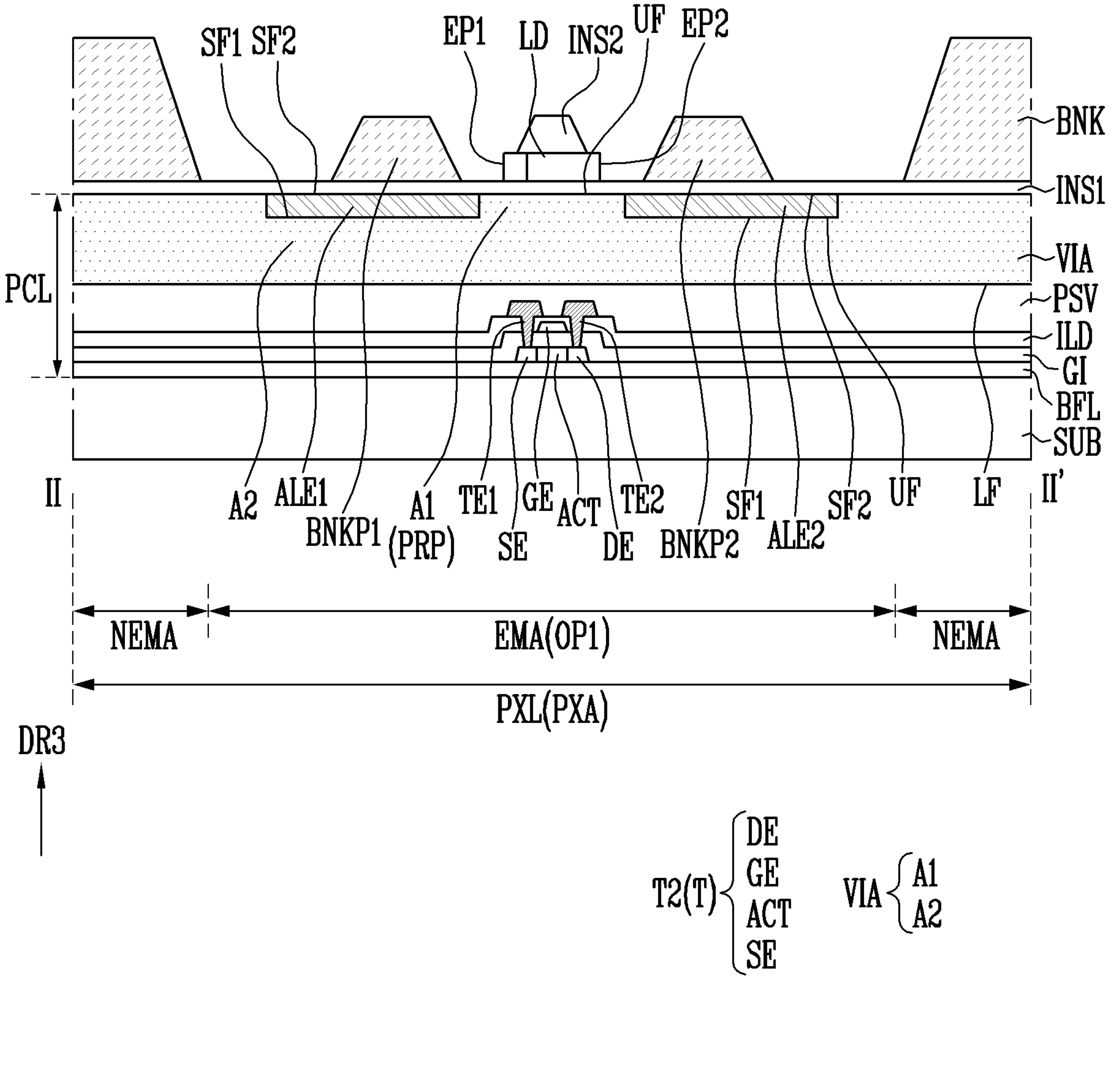
Figure 13I:
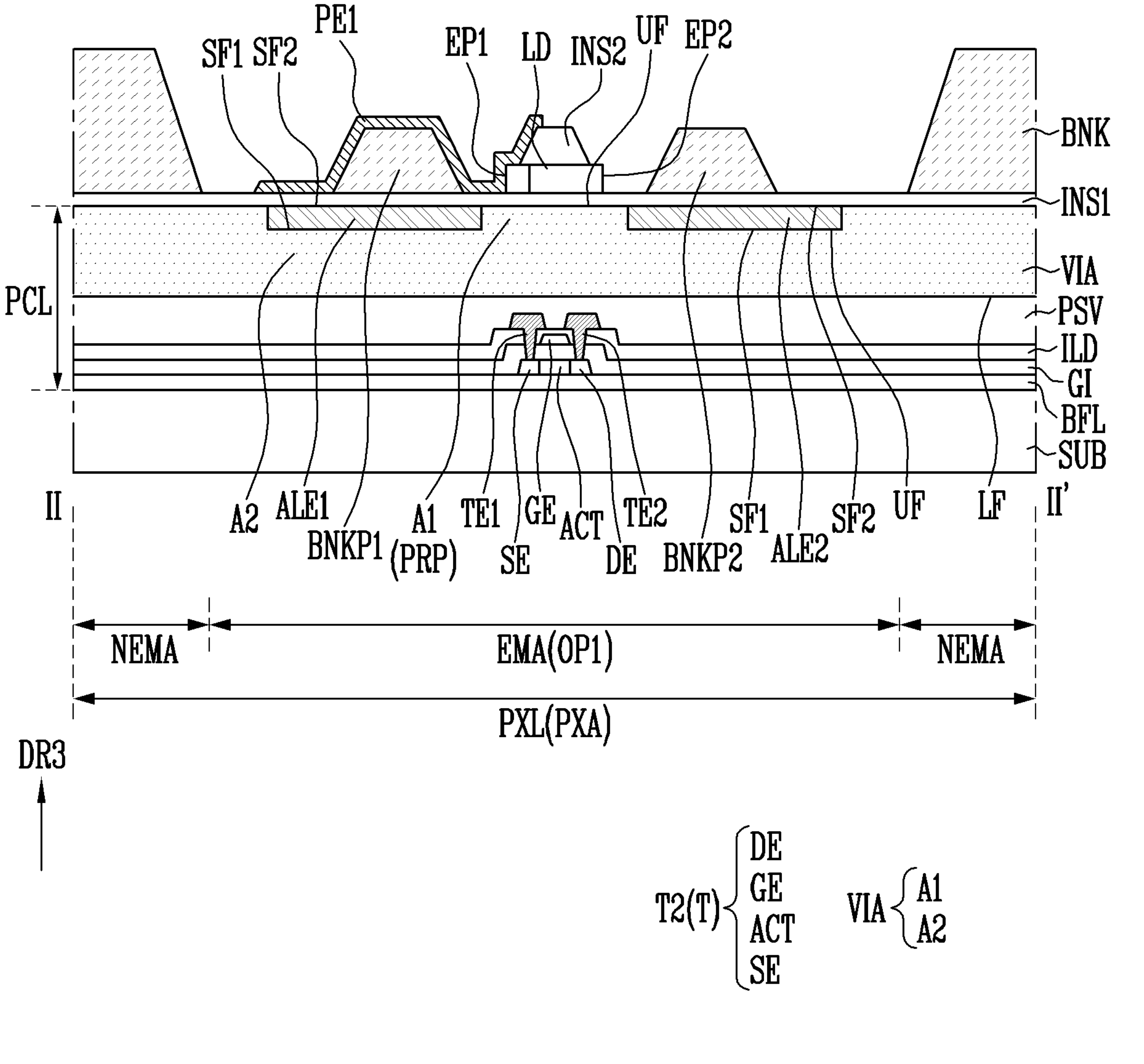
Figure 13J:
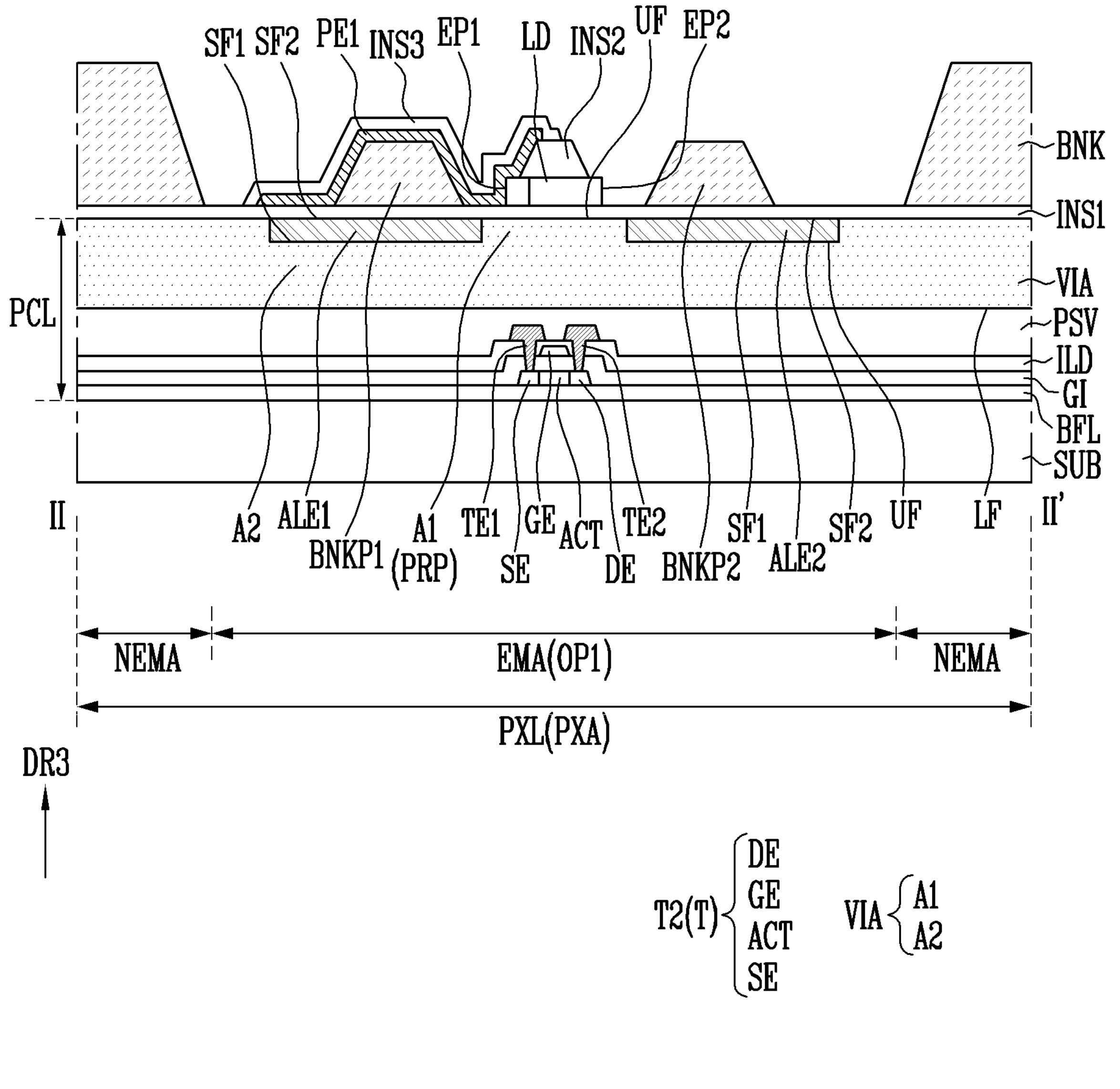
Figure 13K:
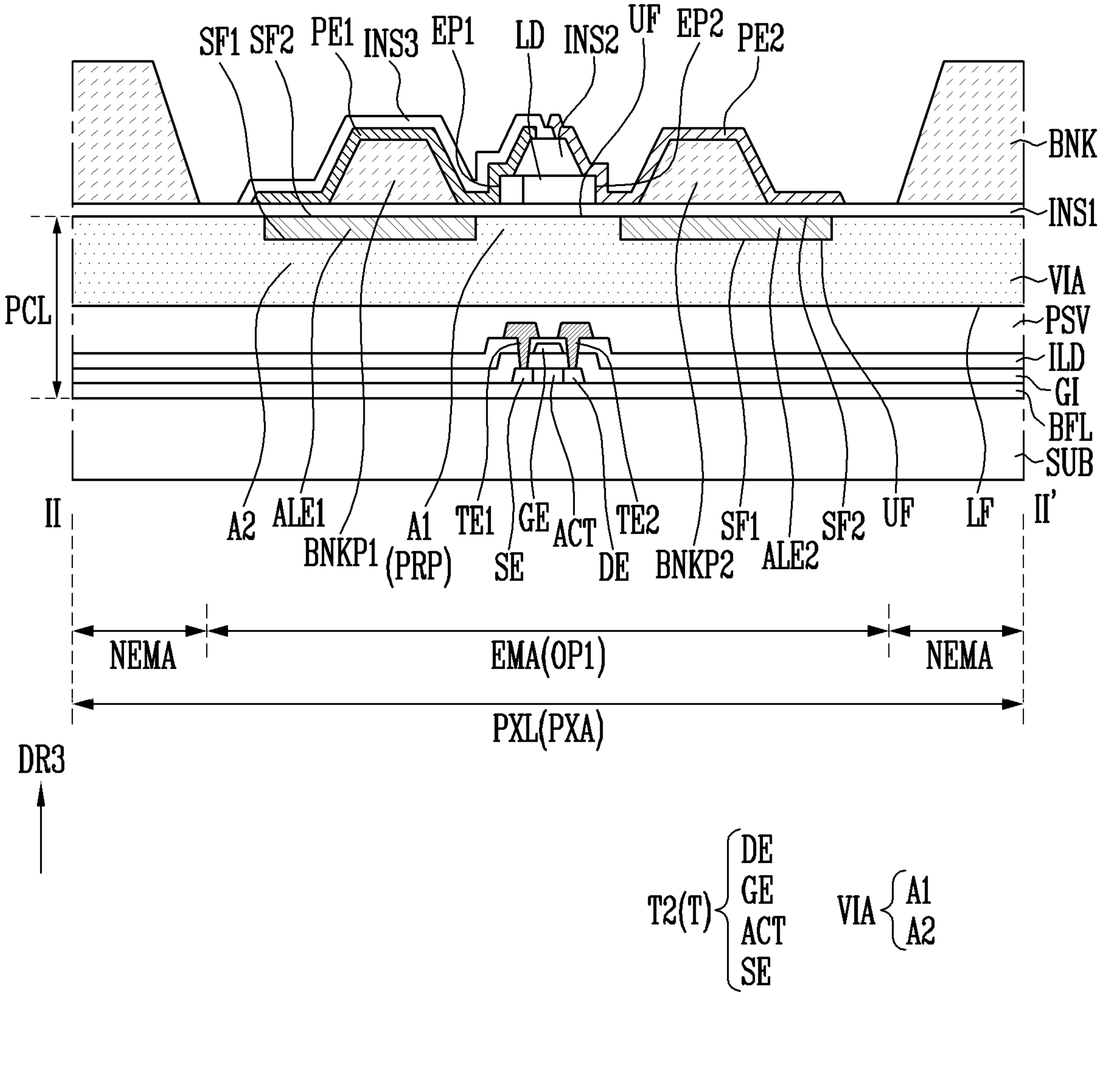
Figure 13L:
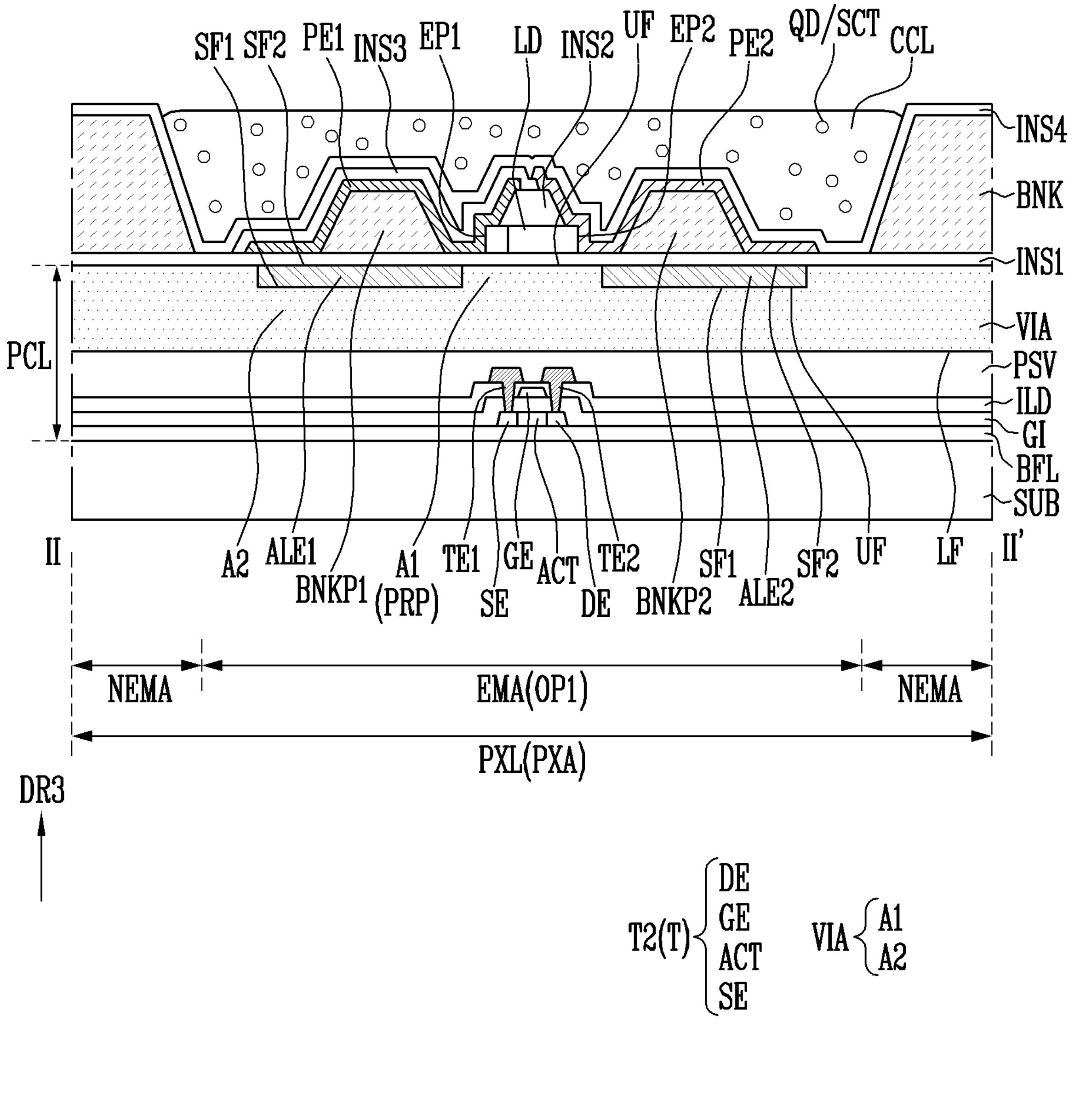
Figure 13M:
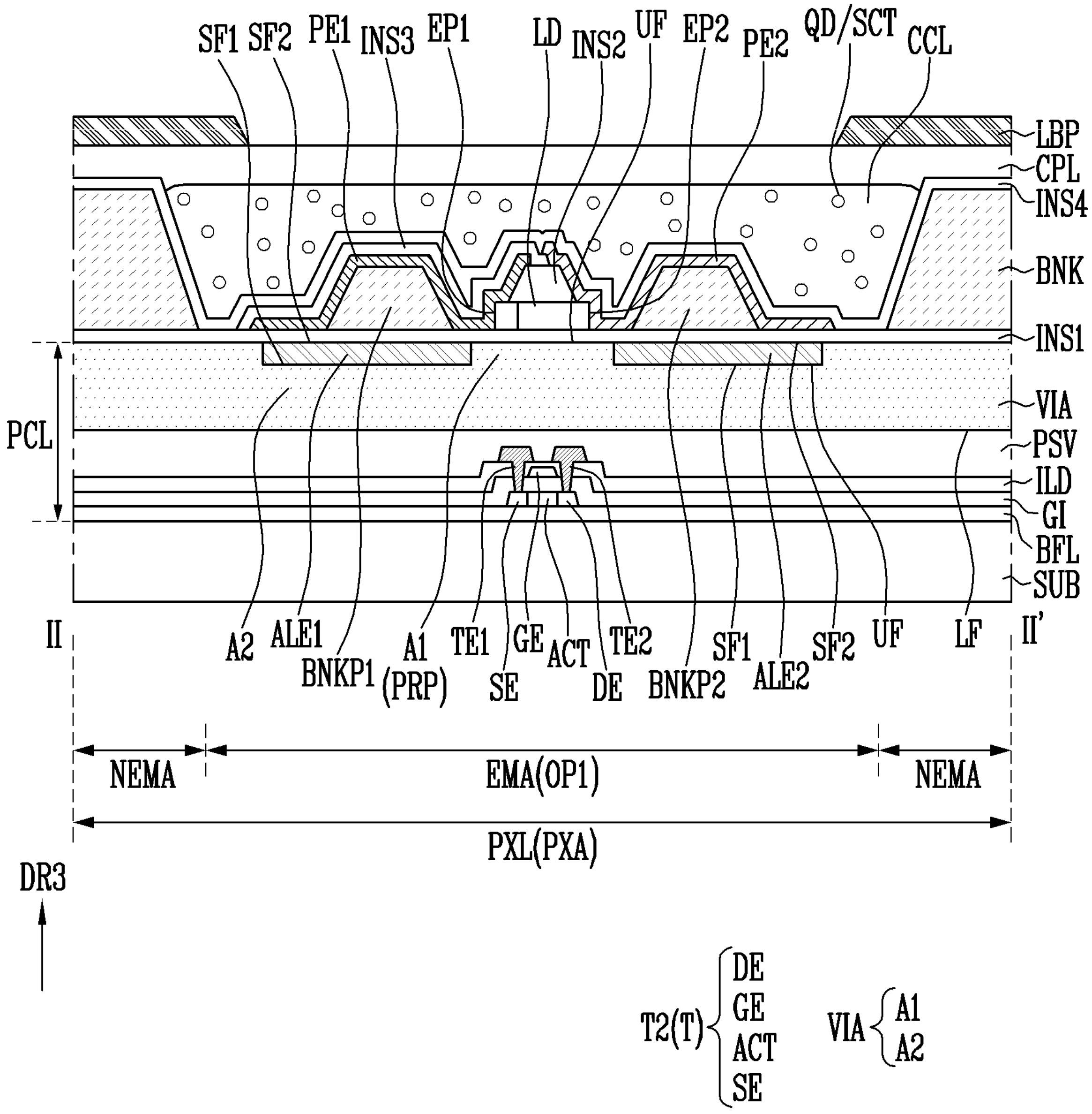
Figure 13N:
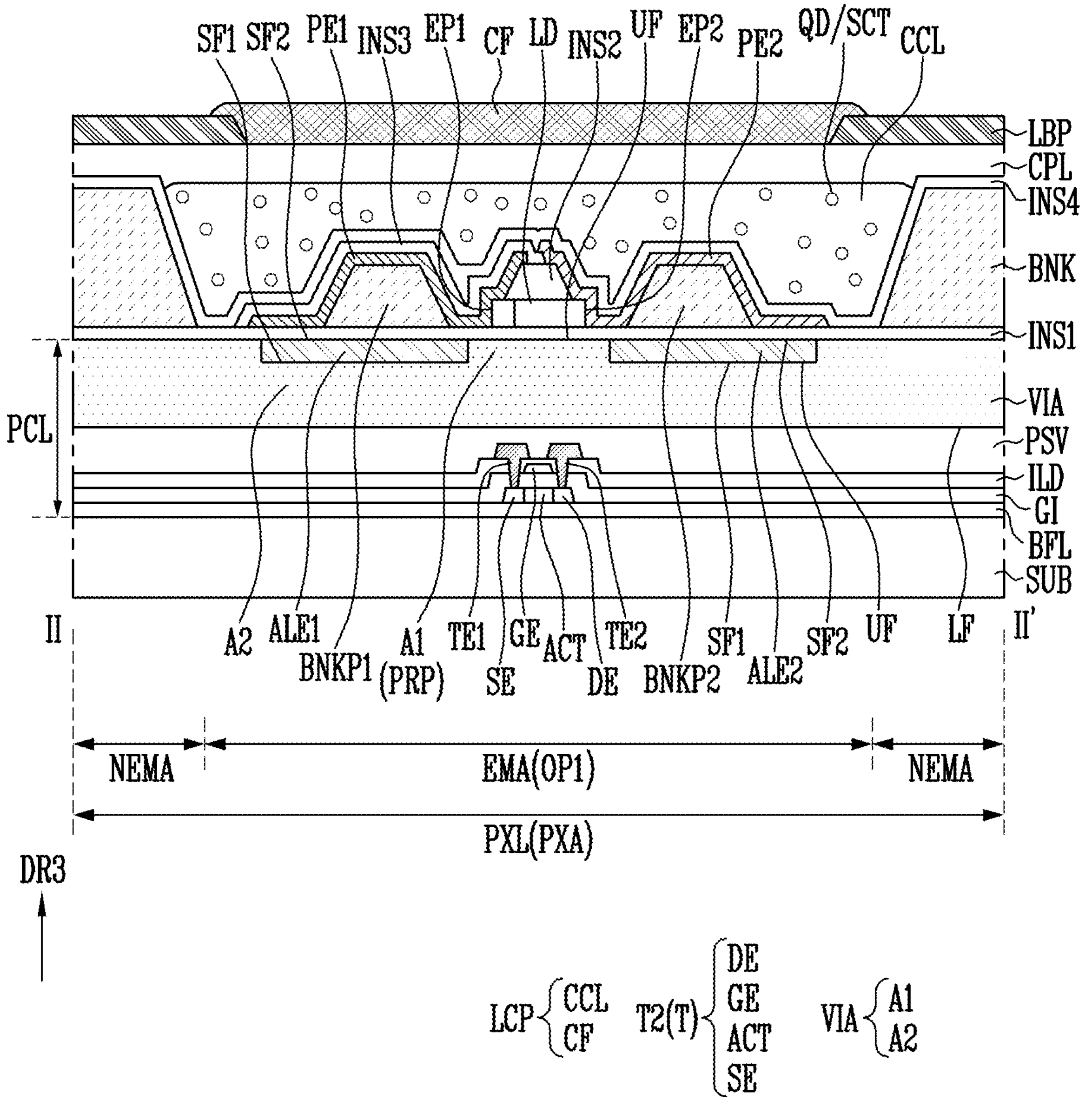

FIGS. 13A to 13N are cross-sectional views schematically illustrating a method of fabricating the pixel PXL illustrated in FIG. 8.

Hereinafter, the method of fabricating the pixel PXL in accordance with one or more embodiments shown in FIG. 8 will be sequentially described with reference to FIGS. 13A to 13N.

In the present embodiment, there is illustrated the case where the steps of fabricating the pixel PXL are sequentially performed according to the sectional views, but without changing the scope of the present disclosure, some steps illustrated as being successively performed may be concurrently (e.g., simultaneously) performed, the sequence of the steps may be changed, some steps may be skipped, or another step may be further included between the steps.

The description with reference to FIGS. 13A to 13N will be focused on differences from the above-mentioned embodiments so as to avoid redundant description.

Referring to FIGS. 5, 6, 8, 12, and 13A, the passivation layer PSV is formed on the transistor T formed on the substrate SUB. The passivation layer PSV may be partially open through a photolithograyphy process using a mask to include the first contactor CNT1 that exposes the second connector TE2 of the first transistor T1.

A via material layer VIA' is formed on an overall surface of the passivation layer PSV that is formed through the foregoing process. The via material layer VIA' may be an organic layer including organic material. For example, the via material layer VIA' may include positive photosensitive material.

A mask M is disposed over the via material layer VIA'. The mask M may include a halftone mask.

The mask M may include a first area Ma and a second area Mb. The first area Ma may be a light block area, and the second area Mb may be a translucent area. The first area Ma may block light that is irradiated thereto. The second area Mb may block only some of light that is irradiated thereto.

The first area Ma of the mask M may be disposed over the via material layer VIA' such that the first area Ma corresponds to an area in which the light emitting elements LD is to be aligned in the emission area EMA. The second area Mb of the mask M may be disposed over the via material layer VIA' such that the second area Mb corresponds to an area in which the alignment electrodes ALE are to be formed in the emission area EMA and the non-emission area NEMA.

In one or more embodiments, the mask M may include a light transmission area (or a third area) that allows irradiated light to pass therethrough. The light transmission area of the mask M may be disposed over the via material layer VIA' such that the light transmission area corresponds to a portion of the transistor T and a portion of the second power line PL2 in the non-emission area NEMA so as to form the first contactor CNT1 and the second contactor CNT2.

After the foregoing mask M is disposed over the via material layer VIA', light is irradiated thereto.

Referring to FIGS. 5, 6, 8, 12, 13A, and 13B, the via layer VIA including the first part A1, the second part A2, and the first and second contactors CNT1 and CNT2 are formed through a development process (e.g., see FIG. 6).

The first part A1 of the via layer VIA may be an area corresponding to the first area Ma of the mask M. The second part A2 of the via layer VIA may be an area corresponding to the second area Mb of the mask M. The first and second contactors CNT1 and CNT2 of the via layer VIA may be formed by removing portions of the via material layer VIA' that correspond to the light transmission area of the mask M.

In a sectional view, the distance between the lower surface LF and the upper surface UF of the first part A1 of the via layer VIA in the third direction DR3 (or the thickness d1 of the first part A1 of the via layer VIA) may be greater than the distance between the lower surface LF and the upper surface UF of the second part A2 of the via layer VIA in the third direction DR3 (or the thickness d2 of the second part A2 of the via layer VIA). The upper surface UF of the first part A1 of the via layer VIA may protrude in the third direction compared to the upper surface UF of the second part A2 of the via layer VIA. Hence, the upper surface UF of the first part A1 of the via layer VIA and the upper surface UF of the second part A2 of the via layer VIA may be disposed at different levels. The upper surface UF of the second part A2 of the via layer VIA may be disposed closer to the lower surface LF than the upper surface UF of the first part A1 of the via layer VIA in the third direction. In a sectional view, the second part A2 of the via layer VIA may be formed in a shape that is recessed downward (or in the third direction DR3) based on the upper surface UF of the first part A1 of the via layer VIA. For example, the second part A2 of the via layer VIA may be a stepped area in the via layer VIA.

Referring to FIGS. 5, 6, 8, 12, and 13A to 13C, a conductive layer CL is formed on an overall surface of the via layer VIA. The conductive layer CL may be formed of various conductive materials each having a suitable reflectivity (e.g., a predetermined reflectivity).

Subsequently, referring to FIGS. 5, 6, 8, and 13A to 13D, the conductive layer CL that is disposed on the first part A1 of the via layer may be removed through a planarization process so that the first alignment electrode ALE1 and the second alignment electrode ALE2 spaced from each other with the first part A1 of the via layer VIA interposed therebetween may be formed. The first alignment electrode ALE1 and the second alignment electrode ALE2 may be disposed at positions spaced from each other in at least the emission area EMA. The planarization process may include a chemical mechanical planarization process.

The first alignment electrode ALE1 and the second alignment electrode ALE2 that are formed through the foregoing planarization process may be formed on the upper surface UF of the second part A2 of the via layer VIA. Each of the first alignment electrode ALE1 and the second alignment electrode ALE2 may include a first surface SF1 and a second surface SF2 that are opposite each other in the third direction DR3. The second surface SF2 of each of the first and second alignment electrodes ALE1 and ALE2 may be disposed on (or at) the same level as that of the upper surface UF of the first part A1 of the via layer VIA.

The second surface SF2 of the first alignment electrode ALE1, the upper surface UF of the first part A1 of the via layer VIA, and the second surface SF2 of the second alignment electrode ALE2 may have a planar surface.

Referring to FIGS. 5, 6, 8, 12, and 13A to 13E, an insulating material layer and a photosensitive material layer are sequentially applied onto the first and second alignment electrodes ALE1 and ALE2 and the first part A1 of the via layer VIA, and then the first insulating layer INS1 including the first contact hole CH1 and the second contact hole CH2 are formed by performing a photolithography process using a mask.

The first contact hole CH1 may be disposed in the non-emission area NEMA of the pixel PXL, and expose a portion of the first alignment electrode ALE1. The second contact hole CH2 may be disposed in the non-emission area NEMA of the pixel PXL, and expose a portion of the second alignment electrode ALE2 (e.g., see FIG. 12).

The first insulating layer INS1 may be formed along the profiles of the components disposed thereunder. The second surface SF2 of the first alignment electrode ALE1, the upper surface UF of the first part A1 of the via layer VIA, and the second surface of the second alignment electrode ALE2 each may have a planar surface in at least the emission area EMA through the foregoing planarization process, so that the first insulating layer INS1 may also have a planar surface.

Referring to FIGS. 5, 6, 8, 12, and 13A to 13F, the bank BNK, the first bank pattern BNKP1, and the second bank pattern BNKP2 are formed on the first insulating layer INS1.

The bank BNK may be formed on the first insulating layer INS1 in the non-emission area NEMA. The first and second bank patterns BNKP1 and BNKP2 may be formed on the first insulating layer INS1 in the emission area EMA. The first bank pattern BNKP1 is formed on the first insulating layer INS1 on the first alignment electrode ALE1. The second bank pattern BNKP2 is formed on the first insulating layer INS1 on the second alignment electrode ALE2. The first bank pattern BNKP1 and the second bank pattern BNKP2 may be disposed at positions spaced from each other on the first insulating layer INS1.

The bank BNK, the first bank pattern BNKP1, and the second bank pattern BNKP2 may be formed through the same process and provided on (or at) the same layer.

Referring to FIGS. 5, 6, 8, 12, and 13A to 13G, an electric field is formed between the first alignment electrode ALE1 and the second alignment electrode ALE2 by respectively applying corresponding alignment signals to the first and second alignment electrodes ALE1 and ALE2.

The light emitting elements LD may be aligned between the first alignment electrode ALE1 and the second electrode ALE2. The light emitting elements LD are supplied (or input) to the pixel area PXA by an inkjet printing scheme. For example, an inkjet head unit IJH may be disposed such that a nozzle 120 is appropriately disposed over the first insulating layer INS1 between the first bank pattern BNKP1 and the second bank pattern BNKP2.

The inkjet head unit IJH may include a print head 110, and at least one nozzle 120 located on a lower surface of the print head 110. The print head 110 may have a shape extending in one direction, but the present disclosure is not limited thereto. The print head 110 may include an internal tube 130 formed in the direction in which the print head 110 extends. The nozzle 120 may be coupled to the internal tube 130 of the print head 110. Ink INK1 including a solvent and a plurality of light emitting elements LD included (or dispersed) in the solvent may be supplied to the internal tube 130. The ink INK may flow along the internal tube 130 and may be sprayed (or discharged) at a preset position from the nozzle 120. The ink INK discharged from the nozzle 120 may be supplied to the first insulating layer INS1 of the pixel PXL. The amount of ink INK sprayed from the nozzle 120 may be adjusted in response to a signal applied to the nozzle 120. The scheme of supplying the light emitting elements LD to the pixel area PXA is not limited to that of the foregoing embodiment. The scheme of supplying the light emitting elements LD may be changed in various ways.

In case that the light emitting elements LD are input to the pixel area PXA, self-alignment of the light emitting elements LD on the first insulating layer INS1 having a planar surface between the first bank pattern BNKP1 and the second bank pattern BNKP2 may be induced.

After the light emitting elements LD are self-aligned, a solvent included in the ink may be removed by a volatilization scheme or other schemes.

Referring to FIGS. 5, 6, 8, 12, and 13A to 13H, after the light emitting elements LD are aligned in the pixel area PXA (or the emission area EMA), the second insulating layer INS2 may be formed on the light emitting elements LD. The second insulating layer INS2 may cover at least a portion of one surface (e.g., an upper surface in the third direction DR3) of each of the light emitting elements LD and allow the opposite ends EP1 and EP2 of each of the light emitting elements LD other than the active layer (refer to "12" of FIG. 1) from being exposed to the outside. The second insulating layer INS2 may fix the light emitting elements LD and prevent the light emitting elements LD from being removed from the aligned positions.

During the process of forming the second insulating layer INS2 such that each pixel PXL can be driven independently or individually from pixels PXL adjacent thereto, a portion of the first alignment electrode ALE1 may be removed from the second opening OP2 of the bank BNK that is an electrode separation area. Hence, each first alignment electrode ALE1 may be electrically and/or physically separated from the first alignment electrodes ALE1 provided in the adjacent pixels PXL disposed on the same pixel column. In one or more embodiments, during the above-mentioned process, a portion of the second alignment electrode ALE2 may also be removed from the second opening OP2 of the bank BNK and electrically and/or physically separated from the second alignment electrodes ALE2 provided in the adjacent pixels PXL.

Referring to FIGS. 5, 6, 8, 12, and 13A to 13I, the first pixel electrode PE1 is formed on the second insulating layer INS2, the respective first ends EP1 of the light emitting elements LD, the first bank pattern BNKP1, and the first insulating layer INS1.

The first pixel electrode PE1 may be electrically and/or physically connected with the first alignment electrode ALE1 through the first contact hole CH1 of the first insulating layer INS1 in the non-emission area NEMA (e.g., see FIG. 12).

Referring to FIGS. 5, 6, 8, 12, and 13A to 13J, the third insulating layer INS3 is formed on the first pixel electrode PE1. In one or more embodiments, the third insulating layer INS3 may be formed of an inorganic insulating layer including inorganic material. The third insulating layer INS3 may cover the first pixel electrode PE1 and allow the respective second ends EP2 of the light emitting elements LD, the second bank pattern BNKP2, and a portion of the first insulating layer INS1 to be exposed.

Referring to FIGS. 5, 6, 8, 12, and 13A to 13K, the second pixel electrode PE2 is formed on the second insulating layer INS2, the respective second ends EP2 of the light emitting elements LD, the second bank pattern BNKP2, and the first insulating layer INS1.

The second pixel electrode PE2 may be electrically and/or physically connected with the second alignment electrode ALE2 through the second contact hole CH2 of the first insulating layer INS1 in the non-emission area NEMA (e.g., see FIG. 12).

Referring to FIGS. 5, 6, 8, 12, and 13A to 13L, the fourth insulating layer INS4 is formed on the second pixel electrode PE2. The fourth insulating layer INS4 may entirely cover the second pixel electrode PE2 and components disposed thereunder and protect the second pixel electrode PE2 and the components.

Ink is supplied (or input), by an inkjet printing method, onto the fourth insulating layer INS4 disposed in the emission area EMA of the pixel PXL that is defined by the bank BNK, and then the ink is cured through a curing process, thus forming the color conversion layer CCL including color conversion particles QD (or light scattering particles SCT). The color conversion layer CCL may be disposed on the fourth insulating layer INS4 and correspond to the light emitting elements LD in the emission area EMA. In one or more embodiments, the fourth insulating layer INS4 may be omitted. In this case, the color conversion layer CCL may be directly formed on the second pixel electrode PE2.

Referring to FIGS. 5, 6, 8, 12, and 13A to 13M, the capping layer CPL is formed in the pixel area PXA by a chemical vapor deposition method or the like.

The capping layer CPL may be formed on the color conversion layer CCL and the fourth insulating layer INS4 in the pixel area PXA. The capping layer CPL may be an inorganic layer (or an inorganic insulating layer) including inorganic material. For example, the capping layer CPL may include at least one of silicon nitride ($SiN_x$), silicon oxide ($SiO_x$), silicon oxynitride ($SiO_xN_y$), and metal oxide such as aluminum oxide ($AlO_x$).

The light block pattern LBP is formed on the capping layer CPL disposed in the non-emission area NEMA. For example, the light block pattern LBP may include a black matrix.

Referring to FIGS. 5, 6, 8, 12, and 13A to 13N, the color filter CF may be formed in the emission area EMA of the pixel area PXA. The color filter CF may be formed on one surface of the capping layer CPL in the emission area EMA and partially overlap the light block pattern LBP.

The color filter CF may correspond to the color conversion layer CCL, and form the light conversion pattern LCP, along with the color conversion layer CCL.

The base layer BSL may be formed on the color filter CF and the light block pattern LBP.

In the pixel PXL formed by the above-mentioned fabrication method and the display device including the pixel PXL, the first alignment electrode ALE1 and the second alignment electrode ALE2 are formed through a chemical mechanical planarization process. Hence, the number of masks may be reduced, compared to that of the case where the first alignment electrode ALE1 and the second alignment electrode ALE2 are formed through separate processes. Therefore, in the foregoing embodiment, the process of fabricating the pixel PXL and the display device may be facilitated, and the production cost may be reduced.

Furthermore, because the first alignment electrode ALE1 and the second alignment electrode ALE2 are formed through the foregoing planarization process, each of the first and second alignment electrodes ALE1 and ALE2 may be disposed on (or at) the same level as that of the upper surface UF of the first part A1 of the via layer VIA and have a planar surface (or the planar second surface SF2). Hence, in at least the emission area EMA, a void may be prevented from being formed by a step difference between the alignment electrodes ALE, so that a contact failure between the pixel electrodes PE and the light emitting elements LD can be mitigated or prevented from occurring.

Although, in the foregoing embodiment, there has been described that the first and second alignment electrodes ALE1 and ALE2 are formed by forming the conductive layer CL on the via layer VIA formed using the halftone mask M and then performing a planarization process, and the first insulating layer INS1 is formed on the first and second alignment electrodes ALE1 and ALE2, the present disclosure is not limited thereto. In one or more embodiments, the first and second alignment electrodes ALE1 and ALE2 may be formed on the via layer VIA by performing a photolithography process using a separate mask, and the first insulating layer INS1 may be formed on the first and second alignment electrodes ALE1 and ALE2 before the planarization process is performed.

Figure 14:
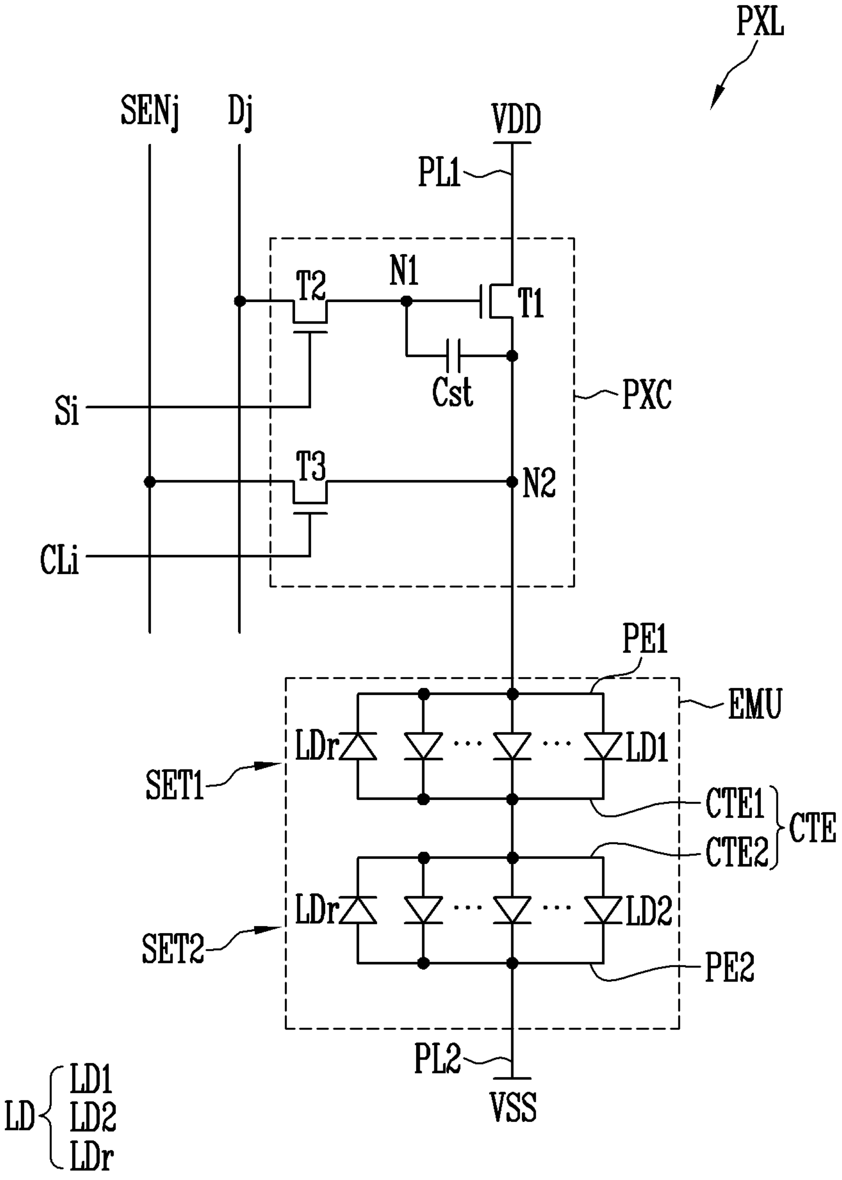
FIG. 14 is a schematic circuit diagram illustrating an embodiment of an electrical connection relationship of components included in each pixel illustrated in FIG. 3.

FIG. 14 is a schematic circuit diagram illustrating an embodiment of electrical connection relationship of components included in each pixel PXL illustrated in FIG. 3.

Referring to FIGS. 3 and 14, the pixel PXL may include an emission unit EMU and a pixel circuit PXC. The pixel circuit PXC is substantially identical with the pixel circuit PXC described with reference to FIG. 4; therefore, repetitive explanation thereof will be omitted.

The emission unit EMU (referred also to as an emission component or an emission layer) may include a plurality of light emitting elements LD electrically connected in parallel between a first power line PL1 that is electrically connected to a first driving power supply VDD and to which a voltage of the first driving power supply VDD is applied, and a second power line PL2 that is electrically connected to a second driving power supply VSS and to which a voltage of the second driving power supply VSS is applied.

The emission unit EMU may include at least one serial set including a plurality of light emitting elements LD electrically connected in parallel to each other. In other words, as illustrated in FIG. 14, the emission unit EMU may have a serial/parallel combination structure.

The emission unit EMU may include first and second serial sets (or stages) SET1 and SET2 that are successively connected between the first and second driving power supplies VDD and VSS. Each of the first and second serial sets SET1 and SET2 may include two electrodes PE1 and CTE1, CTE2 and PE2 that form an electrode pair of the corresponding serial set, and a plurality of light emitting elements LD electrically connected in parallel to each other in the same direction between the two electrodes PE1 and CTE1, CTE2 and PE2.

The first serial set SET1 may include a first pixel electrode PE1, a first intermediate electrode CTE1, and at least one first light emitting element LD1 electrically connected between the first pixel electrode PE1 and the first intermediate electrode CTE1. Furthermore, the first serial set SET1 may include a reverse light emitting element LDr electrically connected between the first pixel electrode PE1 and the first intermediate electrode CTE1 in a direction opposite to that of the first light emitting element LD1.

The second serial set SET2 may include a second intermediate electrode CTE2, a second pixel electrode PE2, and at least one second light emitting element LD2 electrically connected between the second intermediate electrode CTE2 and the second pixel electrode PE2. Furthermore, the second serial set SET2 may include a reverse light emitting element LDr electrically connected between the second intermediate electrode CTE2 and the second pixel electrode PE2 in a direction opposite to that of the second light emitting element LD2.

The first intermediate electrode CTE1 of the first serial set SET1 and the second intermediate electrode CTE2 of the second serial set SET2 may be integrally provided and electrically connected to each other. In other words, the first intermediate electrode CTE1 and the second intermediate electrode CTE2 may form an intermediate electrode CTE that electrically connects the first serial set SET1 and the second serial set SET2 that are successively provided. In the case where the first intermediate electrode CTE1 and the second intermediate electrode CTE2 are integrally provided, the first intermediate electrode CTE1 and the second intermediate electrode CTE2 may be respective different areas of the intermediate electrode CTE.

In the foregoing embodiment, the first pixel electrode PE1 of the first serial set SET1 may be an anode of the emission unit EMU of each pixel PXL. The second pixel electrode PE2 of the second serial set SET2 may be a cathode of the emission unit EMU.

As described above, the emission unit EMU of the pixel PXL including the serial sets SET1 and SET2 (or the light emitting elements LD) electrically connected to each other in the serial/parallel combination structure may easily adjust driving current/voltage conditions in response to specifications of a product to which the emission unit EMU is to be applied.

For example, the emission unit EMU of the pixel PXL including the serial sets SET1 and SET2 (or the light emitting elements LD) electrically connected to each other in the serial/parallel combination structure may reduce driving current, compared to that of the emission unit EMU having a structure such that the light emitting elements LD are electrically connected only in parallel to each other. Furthermore, the emission unit EMU of the pixel PXL including the serial sets SET1 and SET2 electrically connected to each other in the serial/parallel combination structure may reduce driving current to be applied to the opposite ends of the emission unit EMU, compared to that of the emission unit having a structure such that all of the light emitting elements LD, the number of which is the same as that of the emission unit EMU, are electrically connected in series to each other. In addition, the emission unit EMU of the pixel PXL including the serial sets SET1 and SET2 (or the light emitting elements LD) electrically connected to each other in the serial/parallel combination structure may increase the number of light emitting elements LD included between the electrodes PE1, CTE1, CTE2, and PE2, compared to that of the emission unit having a structure such that all of the serial sets (or stages) are electrically connected in series to each other. In this case, the light output efficiency of the light emitting elements LD may be enhanced. Even if a defect is caused in a specific serial set (or stage), the ratio of light emitting elements LD that cannot emit light due to the defect may be reduced, so that a reduction in the light output efficiency of the light emitting elements LD can be mitigated.

Figure 15:
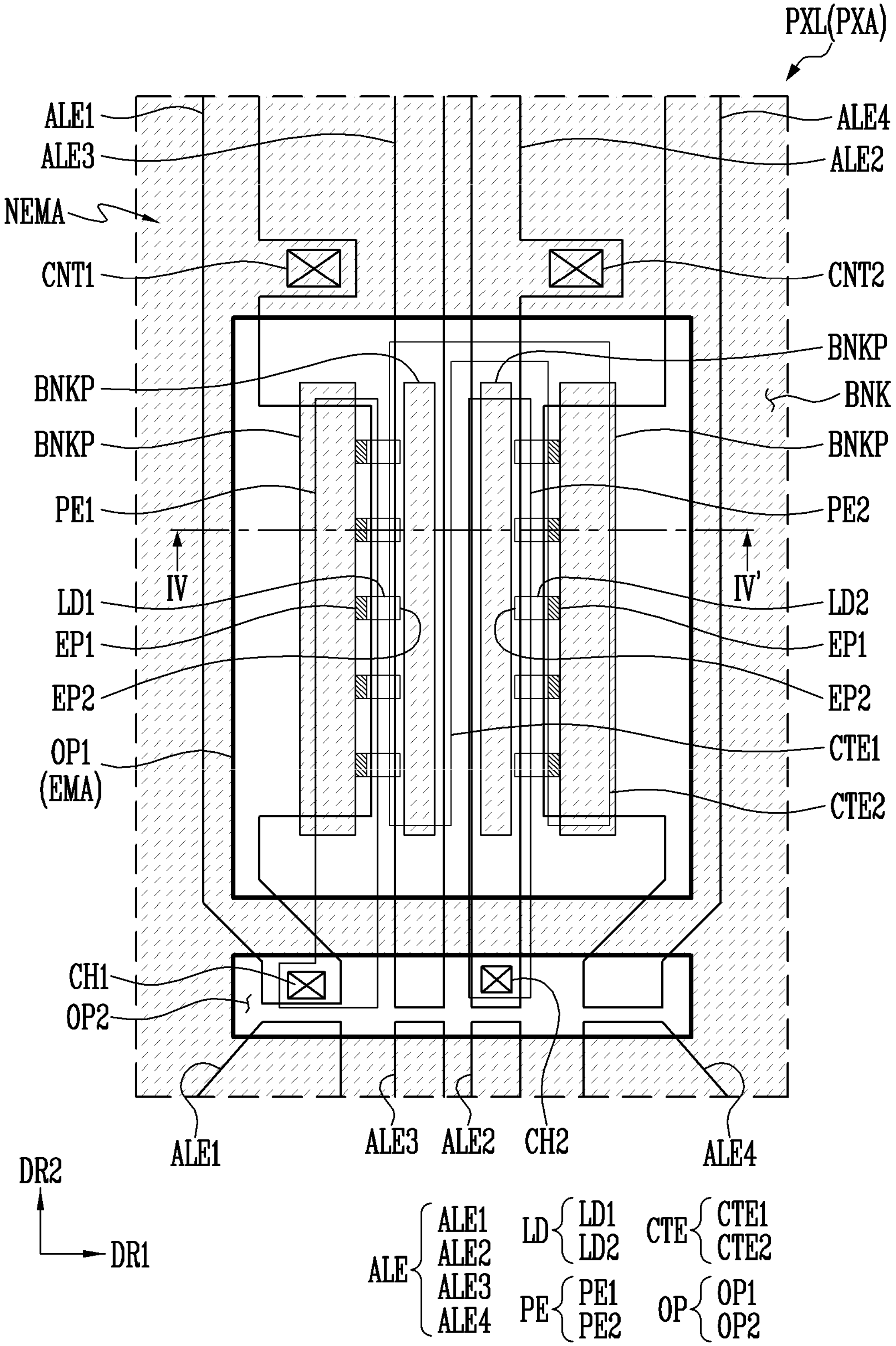
FIG. 15 is a plan view schematically illustrating a pixel illustrated in FIG. 3.
Figure 16:
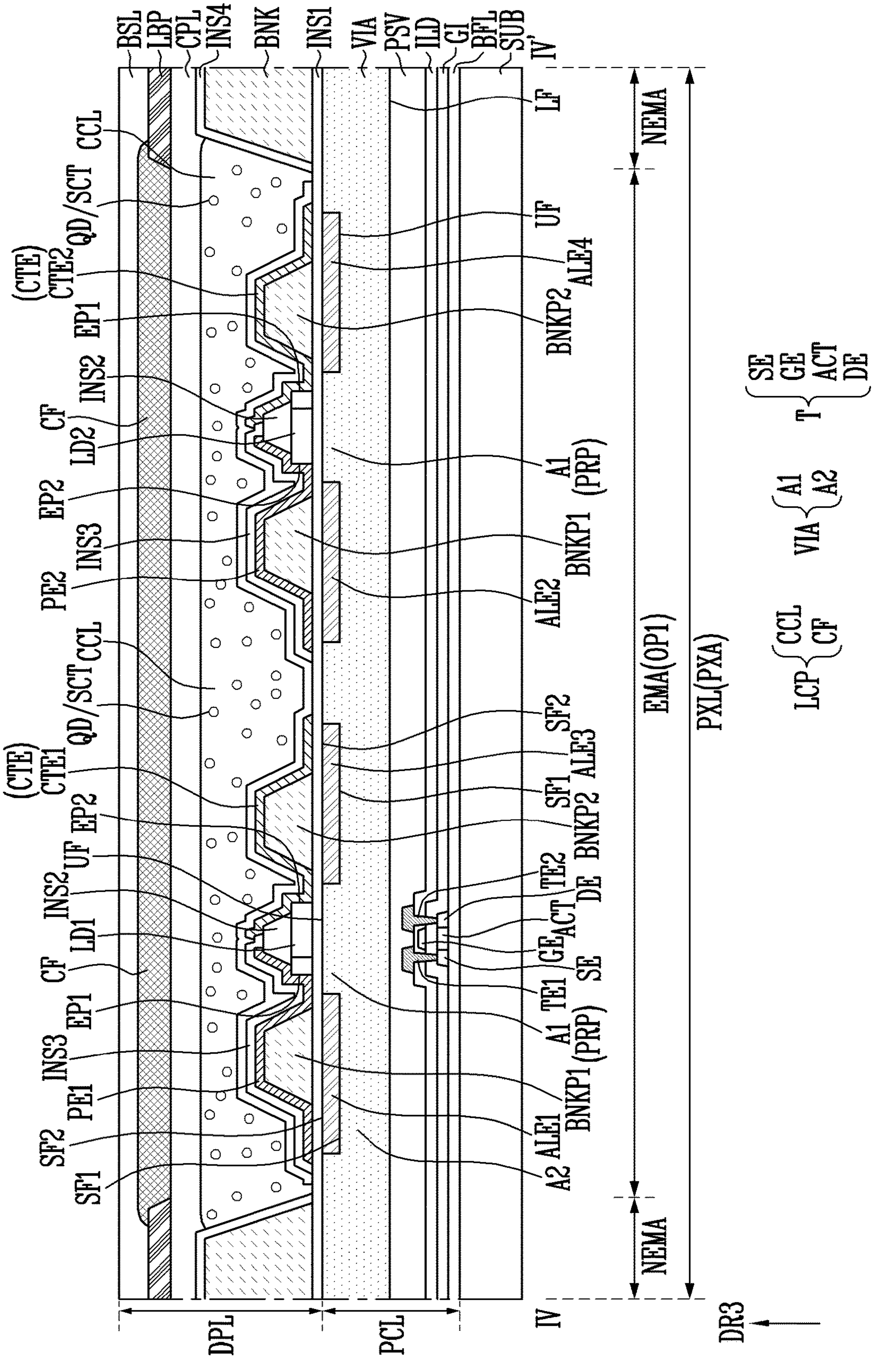
FIG. 16 is a schematic cross-sectional view taken along the line IV-IV' of FIG. 15.

FIG. 15 is a plan view schematically illustrating a pixel PXL illustrated in FIG. 3. FIG. 16 is a schematic cross-sectional view taken along the line IV-IV' of FIG. 15.

In FIG. 15, for the sake of explanation, illustration of transistors electrically connected to the light emitting elements LD and signal lines electrically connected to the transistors is omitted.

For the sake of explanation, in FIG. 15, a horizontal direction in a plan view is indicated by the first direction DR1, and a vertical direction in the plan view is indicated by the second direction DR2. In FIG. 16, a vertical direction (or a thickness direction of the substrate SUB) in a sectional view is indicated by the third direction DR3.

The description with reference to FIGS. 15 and 16 will be focused on differences from the above-mentioned embodiments so as to avoid redundant description.

Referring to FIGS. 14 to 16, the pixel PXL may be provided and/or formed in a pixel area PXA defined on the substrate SUB. The pixel area PXA may include an emission area EMA and a non-emission area NEMA. The pixel PXL may include a substrate SUB, a pixel circuit layer PCL, and a display element layer DPL.

The pixel circuit layer PCL may include a buffer layer BFL, at least one transistor T disposed on the buffer layer BFL, a passivation layer PSV disposed on the transistor T, and a via layer VIA disposed on the passivation layer PSV.

The via layer VIA may include a first part A1 and a second part A2. In one or more embodiments, the first part A1 of the via layer VIA may be one area of the via layer VIA that does not correspond to (or does not overlap) the alignment electrodes ALE. The second part A2 of the via layer VIA may be another area of the via layer VIA that corresponds to (or overlaps) the alignment electrodes ALE. Because the via layer VIA is formed of an organic layer (or an organic insulating layer), the first part A1 and the second part A2 each may have a planar surface (or a planar upper surface UF).

In one or more embodiments, the upper surface UF of the first part A1 may protrude in the third direction DR3 compared to the upper surface UF of the second part A2. For example, the first part A1 may form a protrusion PRP of the via layer VIA that protrudes upward in the third direction DR3 in a sectional view.

The display element layer DPL may be provided and/or formed on the via layer VIA.

The display element layer DPL may include the alignment electrodes ALE, the bank patterns BNKP, the bank BNK, the light emitting elements LD, the pixel electrodes PE, and the intermediate electrode CTE. Furthermore, the display element layer DPL may include at least one or more insulating layers disposed between the foregoing components. In one or more embodiments, the alignment electrodes ALE may be part of pixel circuit layer PCL (e.g., see FIG. 8)

The alignment electrodes ALE may be provided and/or formed on the upper surface UF of the second part A2 of the via layer VIA. The alignment electrodes ALE may be concurrently (e.g., simultaneously) formed through the same process.

The alignment electrodes ALE may include a first alignment electrode ALE1, a third alignment electrode ALE3, a second alignment electrode ALE2, and a fourth alignment electrode ALE4 that are spaced from each other.

The first, third, second, and fourth alignment electrodes ALE1, ALE3, ALE2, and ALE4 may be separated from other electrodes (e.g., first, third, second, and fourth alignment electrodes ALE1, ALE3, ALE2, and ALE4 provided in each of pixels PXL adjacent thereto in the second direction DR2) in the second opening OP2 after the light emitting elements LD are supplied to and aligned in the pixel area PXA of the corresponding pixel PXL during a process of fabricating the display device.

The first alignment electrode ALE1 may include a protrusion that protrudes in the first direction DR1 toward the third alignment electrode ALE3 in the pixel area PXA of each pixel PXL. The protrusion of the first alignment electrode ALE1 may be provided to maintain a constant distance between the first alignment electrode ALE1 and the third alignment electrode ALE3 in the pixel area PXA of the corresponding pixel PXL. Likewise, the fourth alignment electrode ALE4 may include a protrusion that protrudes in the first direction DR1 toward the second alignment electrode ALE2 in the pixel area PXA. The protrusion of the fourth alignment electrode ALE4 may be provided to maintain a constant distance between the second alignment electrode ALE2 and the fourth alignment electrode ALE4 in the pixel area PXA.

However, the shape of each of the first, third, second, and fourth alignment electrodes ALE1, ALE3, ALE2, and ALE4 is not limited thereto. Depending on embodiments, shapes and/or relative disposition relationship of the first, third, second, and fourth alignment electrodes ALE1, ALE3, ALE2, and ALE4 may be changed in various ways. For example, each of the first alignment electrode ALE1 and the fourth alignment electrode ALE4 may have a curved shape without including the protrusion. For instance, the second and third alignment electrodes ALE2 and ALE3 may extend to pixels PXL adjacent thereto in the second direction DR2.

The first alignment electrode ALE1 may be electrically connected with the first transistor T1 described with reference to FIG. 14 through the first contactor CNT1. The second alignment electrode ALE2 may be electrically connected with the second driving power supply VSS (or the second power line PL2) described with reference to FIG. 14 through the second contactor CNT2.

In the pixel area PXA of the pixel PXL, each of the first, third, second, and fourth electrodes ALE1, ALE3, ALE2, and ALE4 may be disposed at a position spaced from an electrode adjacent thereto in the first direction DR1. For example, the first alignment electrode ALE1 may be disposed at a position spaced from the third alignment electrode ALE3. The third alignment electrode ALE3 may be disposed at a position spaced from the second alignment electrode ALE2. The second alignment electrode ALE2 may be disposed at a position spaced from the fourth alignment electrode ALE4. A distance between the first alignment electrode ALE1 and the third alignment electrode ALE3, a distance between the third alignment electrode ALE3 and the second alignment electrode ALE2, and a distance between the second alignment electrode ALE2 and the fourth alignment electrode ALE4 may be the same as each other, but the present disclosure is not limited thereto. In one or more embodiments, the distance between the first alignment electrode ALE1 and the third alignment electrode ALE3, the distance between the third alignment electrode ALE3 and the second alignment electrode ALE2, and the distance between the second alignment electrode ALE2 and the fourth alignment electrode ALE4 may differ from each other.

Each of the first, third, second, and fourth alignment electrodes ALE1, ALE3, ALE2, and ALE4 may function as an alignment electrode (or an alignment line) configured to receive, before the light emitting elements LD are aligned in the emission area EMA of the pixel PXL, an alignment signal (or an alignment voltage) from an alignment pad disposed in the non-display area (refer to "NDA" of FIG. 3) and then align the light emitting elements LD.

Each of the first, third, second, and fourth alignment electrodes ALE1, ALE3, ALE2, and ALE4 may include a first surface SF1 and a second surface SF2 that face each other in the third direction DR3. The first surface SF1 may be a lower surface of the corresponding alignment electrode ALE that contacts the upper surface UF of the second part A2 of the via layer VIA. The second surface SF2 may be an upper surface of the corresponding alignment electrode ALE that contacts the first insulating layer INS1.

The first, third, second, and fourth alignment electrodes ALE1, ALE3, ALE2, and ALE4 each may be designed such that the second surface SF2 thereof is disposed on (or at) the same level as that of the upper surface UF of the first part A1 of the via layer VIA through a planarization process in a fabrication operation. Hence, the second surface SF2 of each of the first, third, second, and fourth alignment electrodes ALE1, ALE3, ALE2, and ALE4 may be disposed on (or at) the same level as that of the upper surface UF of the first part A1 of the via layer VIA.

In a sectional view, the first alignment electrode ALE1 and the third alignment electrode ALE3 may be spaced from each other with the first part A1 of the via layer VIA interposed therebetween. The third alignment electrode ALE3 and the second alignment electrode ALE2 may be spaced from each other with the first part A1 of the via layer VIA interposed therebetween. The second alignment electrode ALE2 and the fourth alignment electrode ALE4 may be spaced from each other with the first part A1 of the via layer VIA interposed therebetween.

Because the first, third, second, and fourth alignment electrodes ALE1, ALE3, ALE2, and ALE4 each are formed through the foregoing planarization process, each of the first, third, second, and fourth alignment electrodes ALE1, ALE3, ALE2, and ALE4 may be disposed on (or at) the same level as that of the upper surface UF of the first part A1 of the via layer VIA and have a planar surface (or the planar second surface SF2).

The first insulating layer INS1 may be provided and/or formed on the alignment electrodes ALE and the via layer VIA. In one or more embodiments, the first insulating layer INS1 may be formed of an inorganic insulating layer including inorganic material. The first insulating layer INS1 may have a profile (or a surface) corresponding to profiles of components disposed thereunder. The first insulating layer INS1 may have, in at least the emission area EMA, a planar profile (or a planar surface) due to components disposed thereunder, e.g., the first, third, second, and fourth alignment electrodes ALE1, ALE3, ALE2, and ALE4 and the first part A1 of the via layer VIA.

The bank BNK and the bank pattern BNKP may be provided and/or formed on the first insulating layer INS1.

The bank BNK may be provided and/or formed on the first insulating layer INS1 in at least the non-emission area NEMA. The bank BNK may enclose the emission area EMA of the pixel PXL and may be formed between adjacent pixels PXL so that a pixel defining layer for defining the emission area EMA of each pixel PXL may be formed.

The bank pattern BNKP may be provided and/or formed on the first insulating layer INS1 on the corresponding alignment electrode ALE in at least the emission area EMA. For example, the bank pattern BNKP may be provided and/or formed on each of the first insulating layer INS1 on the first alignment electrode ALE1, the first insulating layer INS1 on the third alignment electrode ALE3, the first insulating layer INS1 on the second alignment electrode ALE2, and the first insulating layer INS1 on the fourth alignment electrode ALE4.

The bank BNK and the bank patterns BNKP may be provided on (or at) the same layer through the same process, but the present disclosure is not limited thereto.

The light emitting elements LD may be supplied to and aligned in the emission area EMA of the pixel PXL in which the first insulating layer INS1, the bank BNK, and the bank patterns BNKP are formed.

The light emitting elements LD may be disposed between two adjacent alignment electrodes of the first, third, second, and fourth alignment electrodes ALE1, ALE3, ALE2, and ALE4. The light emitting elements LD may include a first light emitting element LD1 and a second light emitting element LD2.

The first light emitting element LD1 may be aligned on the planar surface of the first insulating layer INS1 between the bank pattern BNKP (e.g., BNKP1) on the first alignment electrode ALE1 and the bank pattern BNKP (e.g., BNKP2) on the third alignment electrode ALE3. The second light emitting element LD2 may be aligned on the planar surface of the first insulating layer INS1 between the bank pattern BNKP (e.g., BNKP1) on the second alignment electrode ALE2 and the bank pattern BNKP (e.g., BNKP2) on the fourth alignment electrode ALE4. In one or more embodiments, a plurality of first light emitting elements LD1 and a plurality of second light emitting elements LD2 may be provided. The first end EP1 of each of the first light emitting elements LD1 may be electrically connected to the first pixel electrode PE1. The second end EP2 of each of the first light emitting elements LD1 may be electrically connected to the first intermediate electrode CTE1. The first end EP1 of each of the second light emitting elements LD2 may be electrically connected to the second intermediate electrode CTE2. The second end EP2 of each of the second light emitting elements LD2 may be electrically connected to the second pixel electrode PE2.

In the emission area EMA, the second insulating layer INS2 may be provided and/or formed on the light emitting elements LD. The second insulating layer INS2 may be provided and/or formed on the light emitting elements LD to partially cover the outer surface (e.g., the outer peripheral or circumferential surface, or the surface) of each of the light emitting elements LD such that the first end EP1 and the second end EP2 of each of the light emitting element LD are exposed to the outside.

The third insulating layer INS3 may be disposed to cover the pixel electrodes PE disposed on the first and second ends EP1 and EP2 of the light emitting elements LD. For example, the third insulating layer INS3 may be disposed on each of the first and second pixel electrodes PE1 and PE2 to cover the first and second pixel electrodes PE1 and PE2, as illustrated in FIG. 16. The third insulating layer INS3 may include an inorganic insulating layer formed of inorganic material.

If the second and/or third insulating layers INS2 and/or INS3 are formed over the light emitting elements LD, electrical stability between the first and second ends EP1 and EP2 of the light emitting elements LD may be secured. For example, the pixel electrode PE and the intermediate electrode CTE that are adjacent to each other may be reliably separated from each other by the second and/or third insulating layers INS2 and/or INS3. Hence, a short-circuit defect between the first and second ends EP1 and EP2 of the light emitting elements LD may be prevented from occurring.

The pixel electrode PE may include a first pixel electrode PE1 and a second pixel electrode PE2.

In at least the emission area EMA, the first pixel electrode PE1 may be disposed on the respective first ends EP1 of the first light emitting elements LD1, the second insulating layer INS2 provided on the first light emitting elements LD1, the bank pattern BNKP provided on the first alignment electrode ALE1, and the first insulating layer INS1. The first pixel electrode PE1 may be brought into direct contact with and electrically connected to the first alignment electrode ALE1 through the first contact hole CH1 in the non-emission area NEMA.

In at least the emission area EMA, the second pixel electrode PE2 may be disposed on the respective second ends EP2 of the second light emitting elements LD2, the second insulating layer INS2 provided on the second light emitting elements LD2, the bank pattern BNKP provided on the second alignment electrode ALE2, and the first insulating layer INS1. The second pixel electrode PE2 may be brought into direct contact with and electrically connected to the second alignment electrode ALE2 through the second contact hole CH2 in the non-emission area NEMA.

In one or more embodiments, the first pixel electrode PE1 and the second pixel electrode PE2 may be formed through the same process and may be provided on (or at) the same layer.

The intermediate electrode CTE may include a first intermediate electrode CTE1 and a second intermediate electrode CTE2 that extend in the second direction DR2.

The first intermediate electrode CTE1 may be provided and/or formed on the respective second ends EP2 of the first light emitting elements LD1, the bank pattern BNKP provided on the third alignment electrode ALE3, and the first insulating layer INS1. In a plan view, the first intermediate electrode CTE1 may have a shape extending in the second direction DR2 between the first pixel electrode PE1 and the second pixel electrode PE2.

The second intermediate electrode CTE2 may be provided and/or formed on the respective first ends EP1 of the second light emitting elements LD2, the bank pattern BNKP provided on the fourth alignment electrode ALE4, and the first insulating layer INS1. In a plan view, the second intermediate electrode CTE2 may have a shape extending in the second direction DR2 between the second pixel electrode PE2 and the bank BNK disposed in the non-emission area NEMA.

The first intermediate electrode CTE1 and the second intermediate electrode CTE2 may be integrally provided and electrically connected with each other. The first intermediate electrode CTE1 and the second intermediate electrode CTE2 may be respectively different areas of the intermediate electrode CTE.

The first pixel electrode PE1, the second pixel electrode PE2, and the intermediate electrode CTE may be spaced from each other in a plan view. The first pixel electrode PE1 may face (or oppose) one area of the intermediate electrode CTE, e.g., the first intermediate electrode CTE1. The first pixel electrode PE1 and the first intermediate electrode CTE1 may extend in the same direction, e.g., in the second direction DR2, and may be spaced from each other in the first direction DR1. The second pixel electrode PE2 may face (or oppose) another area of the intermediate electrode CTE, e.g., the second intermediate electrode CTE2. The second pixel electrode PE2 and the second intermediate electrode CTE2 may extend in the second direction DR2, and may be spaced from each other in the first direction DR1.

A plurality of first light emitting elements LD1 may be disposed on a left side of the emission area EMA. A plurality of second light emitting elements LD2 may be disposed on a right side of the emission area EMA. Here, the arrangement and/or connection structure of the light emitting elements LD is not limited to the foregoing embodiment. In one or more embodiments, the arrangement and/or connection structure of the light emitting elements LD may be changed in various ways depending on components included in the emission unit EMU and/or the number of serial sets (or stages).

The plurality of first light emitting elements LD1 may be electrically connected in parallel with each other between the first pixel electrode PE1 and the first intermediate electrode CTE1, and form the first serial set SET1. The plurality of second light emitting elements LD2 may be electrically connected in parallel with each other between the second intermediate electrode CTE2 and the second pixel electrode PE2, and form the second serial set SET2. In one or more embodiments, the plurality of second light emitting elements LD2 may be electrically connected in parallel with each other between the first intermediate electrode CTE1 and the second intermediate electrode CTE2.

The fourth insulating layer INS4 may be provided and/or formed on the first and second pixel electrodes PE1 and PE2 and the intermediate electrode CTE.

The light conversion pattern LCP, the light block pattern LBP, and the color filter CF may be provided and/or formed on the fourth insulating layer INS4.

According to the foregoing embodiment, the alignment electrodes ALE may be respectively disposed on one side and the other side of the first part A1 of the via layer VIA that is formed of the protrusion PRP. The upper surface UF of the first part A1 and the respective second surface SF2 of the alignment electrodes ALE may be disposed on (or at) the same level. Consequently, the first insulating layer INS1 disposed on the via layer VIA and the alignment electrodes ALE may have a planar surface. Hence, in at least the emission area EMA, a void may be prevented from being formed by a step difference between the alignment electrodes ALE, so that a contact failure between the pixel electrodes PE and the light emitting elements LD can be mitigated or prevented from occurring. Therefore, there can be provided a pixel PXL having improved reliability and a display device including the pixel PXL.

In a pixel, a display device including the pixel, and a method of fabricating the display device in accordance with one or more embodiments of the present disclosure, an upper surface of a via layer and a surface of the an alignment electrode are disposed on (or at) the same level in at least the emission area, so that an insulating layer disposed on the via layer and the alignment electrode may have a planar surface, whereby a failure can be prevented from occurring due to a step difference of the alignment electrode when the light emitting elements are aligned.

Consequently, embodiments of the present disclosure may provide a pixel having improved reliability, a display device including the pixel, and a method of fabricating the pixel.

The effects, aspects, and features of the present disclosure are not limited by the foregoing, and other various effects, aspects, and features are contemplated herein.

While various embodiments have been described above, those skilled in the art will appreciate that various modifications, additions, and substitutions are possible, without departing from the scope of the present disclosure.

Therefore, the embodiments disclosed in this specification are only for illustrative purposes rather than limiting the technical scope of the present disclosure. The scope of the present disclosure must be defined by the accompanying claims and their equivalents.

What is claimed is:

1. A pixel comprising:

an emission area and a non-emission area;

a via layer including a lower surface and at least one upper surface that are opposite each other, the via layer comprising a first part having a first thickness and a second part having a second thickness different from the first thickness;

a first alignment electrode and a second alignment electrode on the via layer and spaced from each other;

an insulating layer on the via layer, the first alignment electrode, and the second alignment electrode, the insulating layer having a planar surface;

a first electrode and a second electrode in the emission area and spaced from each other; and light emitting elements on the planar surface of the insulating layer in the emission area, and each of the light emitting elements including a first semiconductor layer, a second semiconductor layer, and active layer between the first semiconductor layer and the second semiconductor layer, the second semiconductor layer being adjacent to a first end of each of the light emitting elements, and the first semiconductor layer being adjacent to a second end of each of the light emitting elements, wherein the first electrode is electrically connected to the first end of the light emitting elements, and the second electrode is electrically connected to the second end of the light emitting elements, wherein the first end and the second end are spaced apart from each other in a same direction as a direction in which the first alignment electrode and the second alignment electrode are spaced apart from each other, wherein the first alignment electrode and the second alignment electrode are on the second part of the via layer and overlap the second part of the via layer, wherein a distance between a surface of the first alignment electrode that touches the insulating layer and the lower surface of the via layer is a same as the first thickness, and wherein an upper surface of the first part of the via layer that touches the insulating layer and an upper surface of the second part of the via layer that touches the first alignment electrode are at different levels in a thickness direction of the via layer.

2. The pixel according to claim 1, wherein, in a sectional view, the upper surface of the first part of the via layer protrudes compared to the upper surface of the second part of the via layer.

3. The pixel according to claim 2, wherein the first thickness is greater than the second thickness.

4. The pixel according to claim 3, wherein each of the first alignment electrode and the second alignment electrode has a surface located at a level that is the same as a level of the upper surface of the first part of the via layer.

5. The pixel according to claim 4, wherein each of the first alignment electrode and the second alignment electrode includes a first surface and a second surface that are opposite each other, wherein the surface of the first alignment electrode that touches the insulating layer is the second surface of the first alignment electrode, wherein the first surface contacts the upper surface of the second part of the via layer, and the second surface contacts the insulating layer, and wherein a surface of each of the first electrode and the second electrode corresponds to the second surface.

6. The pixel according to claim 4, wherein, in a sectional view, the first alignment electrode and the second alignment electrode are spaced from each other with the first part of the via layer interposed therebetween.

7. The pixel according to claim 6, wherein the first alignment electrode and the second alignment electrode do not overlap the first part of the via layer.

8. The pixel according to claim 4, wherein the via layer comprises an organic insulating layer, and the insulating layer comprises an inorganic insulating layer.

9. The pixel according to claim 4, further comprising:

a first bank pattern on the insulating layer between the first alignment electrode and the first electrode; and a second bank pattern on the insulating layer between the second alignment electrode and the second electrode, wherein the light emitting elements are on the insulating layer between the first bank pattern and the second bank pattern.

10. The pixel according to claim 9, further comprising:

a bank on the insulating layer in the non-emission area, and including a first opening corresponding to the emission area, and a second opening spaced from the first opening;

a light conversion pattern on the light emitting elements and the first electrode and the second electrode in the emission area; and a light block pattern on the bank in the non-emission area.

11. The pixel according to claim 10, wherein the first bank pattern, the second bank pattern, and the bank comprise a same material and are at a same layer.

12. The pixel according to claim 10, wherein the light conversion pattern comprises:

a color conversion layer on the first electrode and the second electrode, and configured to convert a first color of light emitted from the light emitting elements to a second color of light; and a color filter on the color conversion layer and configured to allow the second color of light to selectively pass therethrough.

13. The pixel according to claim 9, further comprising:

a substrate;

at least one transistor on the substrate; and a power line on the substrate, the power line being configured to receive a power voltage, wherein the via layer is on the transistor and the power line and includes a first contactor exposing a portion of the transistor, and a second contactor exposing a portion of the power line.

14. The pixel according to claim 5, wherein the insulating layer includes a first contact hole exposing a portion of the first alignment electrode, and a second contact hole exposing a portion of the second alignment electrode, wherein the first electrode is electrically connected to the first alignment electrode through the first contact hole, and wherein the second electrode is electrically connected to the second alignment electrode through the second contact hole.

15. The pixel according to claim 14, wherein the first contact hole and the second contact hole are located in the non-emission area.

16. The pixel according to claim 15, further comprising:

a third alignment electrode on the via layer between the first alignment electrode and the second alignment electrode, and spaced from the first alignment electrode and the second alignment electrode;

a fourth alignment electrode adjacent to the third alignment electrode and located on the via layer, the fourth alignment electrode being spaced from the first to the third alignment electrodes;

a first intermediate electrode spaced from the first electrode and the second electrode, and located on the third alignment electrode; and a second intermediate electrode spaced from the first electrode and the second electrode, and located on the fourth alignment electrode.

17. The pixel according to claim 16, wherein each of the third alignment electrode and the fourth alignment electrode has a surface at a level that is the same as the level of the upper surface of the first part of the via layer, wherein, in a sectional view, the first alignment electrode and the third alignment electrode are spaced from each other with the first part of the via layer interposed therebetween, and wherein, in a sectional view, the second alignment electrode and the fourth alignment electrode are spaced from each other with the first part of the via layer interposed therebetween.

18. A display device comprising:

a substrate including a display area and a non-display area; and a plurality of pixels in the display area, each of the plurality of pixels including an emission area and a non-emission area, wherein each of the plurality of pixels comprises:

a via layer on the substrate, and including a lower surface and at least one upper surface that are opposite each other, and including a first part having a first thickness, and a second part having a second thickness different from the first thickness;

a first alignment electrode and a second alignment electrode on the via layer and spaced from each other;

an insulating layer on the via layer, the first alignment electrode, and the second alignment electrode, and having a planar surface;

a first bank pattern and a second bank pattern in the emission area, the first bank pattern being on the insulating layer on the first alignment electrode, and the second bank pattern being on the insulating layer on the second alignment electrode;

light emitting elements on the insulating layer between the first bank pattern and the second bank pattern in the emission area and each of the light emitting elements including a first semiconductor layer, a second semiconductor layer, and active layer between the first semiconductor layer and the second semiconductor layer, the second semiconductor layer being adjacent to a first end of each of the light emitting elements, and the first semiconductor layer being adjacent to a second end of each of the light emitting elements;

a first electrode in the emission area and electrically connected to the first alignment electrode and respective first ends of the light emitting elements; and a second electrode in the emission area and electrically connected to the second alignment electrode and respective second ends of the light emitting elements, wherein the first electrode is electrically connected to the first end of the light emitting elements, and the second electrode is electrically connected to the second end of the light emitting elements, wherein the first end and the second end are spaced apart from each other in a same direction as a direction in which the first alignment electrode and the second alignment electrode are spaced apart from each other, wherein each of the first alignment electrode and the second alignment electrode has a first surface at a level that is the same as a level of an upper surface of the first part of the via layer, wherein a distance between the first surface of the first alignment electrode that touches the insulating layer and the lower surface of the via layer is a same as the first thickness, and wherein the upper surface of the first part of the via layer that touches the insulating layer and an upper surface of the second part of the via layer that touches the first alignment electrode are at different levels in a thickness direction of the substrate.

19. The display device according to claim 18, wherein, in a sectional view, the upper surface of the first part of the via layer protrudes compared to the upper surface of the second part of the via layer, and wherein the first thickness is greater than the second thickness.

20. An electronic device comprising the display device according to claim 18.

* * * * *